United States Patent
Hsieh et al.

(10) Patent No.: US 12,408,464 B2
(45) Date of Patent: Sep. 2, 2025

(54) SEMICONDUCTOR ARRANGEMENT WITH ISOLATION STRUCTURE

(71) Applicant: TAIWAN SEMICONDUCTOR MANUFACTURING COMPANY LIMITED, Hsin-Chu (TW)

(72) Inventors: Feng-Chien Hsieh, Pingtung (TW); Yun-Wei Cheng, Taipei (TW); Kuo-Cheng Lee, Tainan (TW); Cheng-Ming Wu, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 18/232,085

(22) Filed: Aug. 9, 2023

(65) Prior Publication Data

US 2023/0387168 A1 Nov. 30, 2023

Related U.S. Application Data

(63) Continuation of application No. 17/458,720, filed on Aug. 27, 2021, now Pat. No. 11,837,619.

(51) Int. Cl.
*H10F 39/00* (2025.01)
*H10F 39/18* (2025.01)

(52) U.S. Cl.
CPC ........ *H10F 39/807* (2025.01); *H10F 39/011* (2025.01); *H10F 39/184* (2025.01)

(58) Field of Classification Search
CPC ........... H01L 27/1463; H01L 27/14649; H01L 27/14683
See application file for complete search history.

(56) References Cited

U.S. PATENT DOCUMENTS

| | | | |
|---|---|---|---|
| 8,941,204 B2* | 1/2015 | Lin | H01L 27/1464 |
| | | | 257/E21.573 |
| 9,288,380 B2* | 3/2016 | Nomura | H04N 25/78 |
| 9,431,452 B1* | 8/2016 | Liu | H01L 27/14645 |
| 9,923,009 B1* | 3/2018 | Hsiung | H01L 27/14685 |
| 11,011,583 B2* | 5/2021 | Lee | H10F 39/8053 |
| 2008/0217719 A1* | 9/2008 | Liu | H01L 27/14689 |
| | | | 257/446 |
| 2015/0243694 A1* | 8/2015 | Ihara | H01L 27/14621 |
| | | | 257/443 |

* cited by examiner

*Primary Examiner* — David Vu
(74) *Attorney, Agent, or Firm* — Cooper Legal Group, LLC

(57) ABSTRACT

A semiconductor arrangement includes a photodiode extending to a first depth from a first side in a substrate. An isolation structure laterally surrounds the photodiode and includes a first well that extends into a first side of the substrate. A deep trench isolation extends into a second side of the substrate and at least a portion of the deep trench isolation underlies the first well.

20 Claims, 46 Drawing Sheets

FIG. 1E  FIG. 1F

SEMICONDUCTOR ARRANGEMENT WITH ISOLATION STRUCTURE

RELATED APPLICATION

This application is a continuation of U.S. patent application Ser. No. 17/458,720, titled "SEMICONDUCTOR ARRANGEMENT WITH ISOLATION STRUCTURE" and filed on Aug. 27, 2021, which is incorporated herein by reference.

BACKGROUND

A charge-coupled device (CCD), complementary metal-oxide-semiconductor (CMOS) radiation detecting elements, and other types of radiation detecting elements are used to convert an image focused on a radiation detecting element into an electrical signal. The device or element comprises an array of radiation detecting elements, such as photodiodes, configured to produce an electrical signal corresponding to an intensity of radiation impinging on the radiation detecting element. The electrical signal is used to display a corresponding image on a monitor or provide information about the optical image.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1M illustrate a semiconductor arrangement including an isolation structure arrangement and a photodiode array, according to some embodiments.

DETAILED DESCRIPTION

Figure 1A:
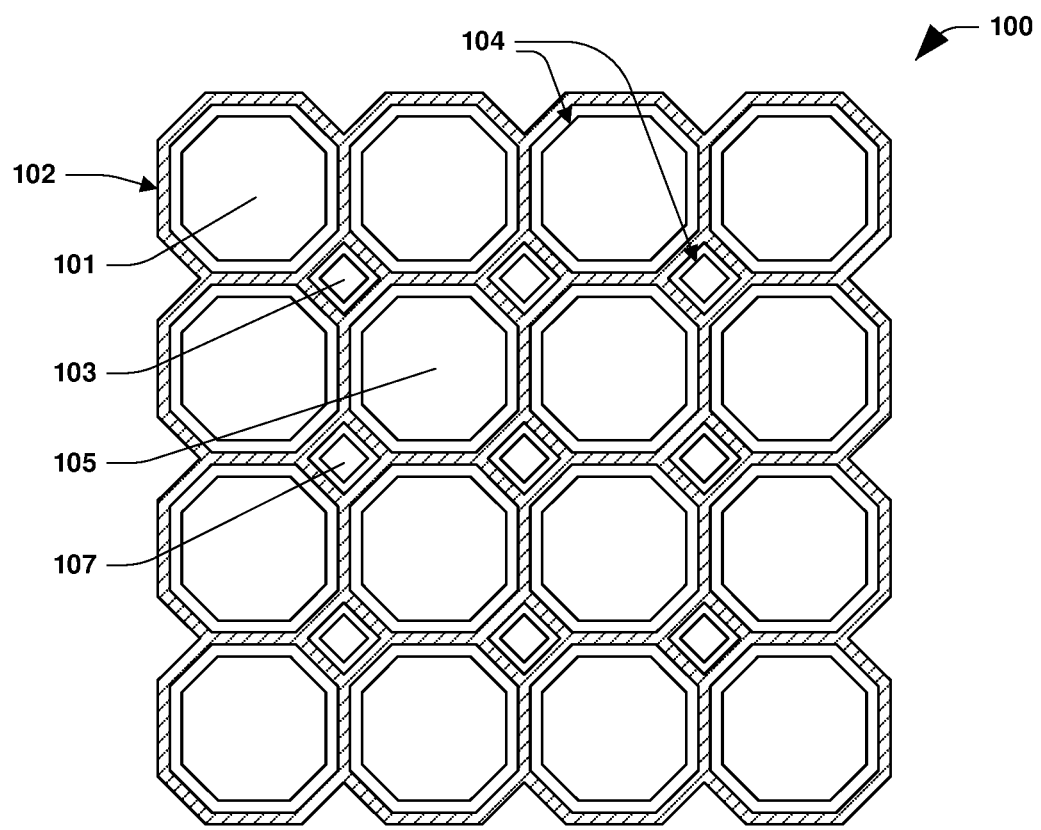

The following disclosure provides several different embodiments, or examples, for implementing different features of the provided subject matter with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

One or more semiconductor arrangements and one or more techniques for forming such semiconductor arrangements are provided. In an example, a semiconductor arrangement comprises a photodiode array formed over a substrate. The photodiode array comprises one or more photodiodes, such as image sensor pixels, configured to accumulate energy generated by optical radiation or near-infrared (NIR) radiation, such as from photons, of an optical image. A voltage of a photodiode can be read as an output for the optical image. In some embodiments, a photodiode is situated under one or more layers or components formed over a substrate. Because radiation travels along a path that comprises such layers or components before reaching the photodiode, signal strength of the radiation can decay before reaching the photodiode or the radiation can travel towards another photodiode. For example, the radiation can be detected by a neighboring or adjacent photodiode, which can result in crosstalk. Crosstalk can degrade performance of the semiconductor arrangement, increase noise, and decrease at least one of quality or intensity of signals produced by the semiconductor arrangement.

According to some embodiments, a semiconductor arrangement may have at least one of photodiodes, pinned layer photodiodes, reset transistors, source follower transistors, floating diffusions (also known as floating diodes), or transfer transistors. A CMOS semiconductor arrangement may be a CMOS active pixel image sensor (APS) with an intra-pixel charge transfer to a floating diffusion (FD). A pinned photodiode (PPD), also known as a pinned layer photodiode, is an example photodiode structure used in a CCD, a CMOS semiconductor arrangement, or a CMOS APS. A PPD provides, for example, at least one of low noise, high quantum efficiency, or low dark current. A CMOS semiconductor arrangement may be a front side illuminated (FSI) image sensor, detecting radiation from a front side, or a back side illuminated (BSI) image sensor, detecting radiation from a back side.

Accordingly, a semiconductor arrangement is provided herein. According to some embodiments, the semiconductor arrangement includes a photodiode that extends to a first depth from a first side in a substrate. An isolation structure laterally surrounds the photodiode, and the isolation structure has a first well extending to a second depth from the first side in the substrate greater than the first depth. A deep trench isolation extends from a third depth, from the first side in the substrate, to a fourth depth from the first side in the substrate. At least a portion of the deep trench isolation underlies the first well. Radiation enters the substrate from a first direction. The isolation structure has a shallow trench isolation tapered from a first maximum width to a first minimum width in a second direction opposite to the first direction. The isolation structure has the deep trench isolation tapered from a second minimum width to a second maximum width in the second direction. The semiconductor arrangement includes a first photodiode configured to detect a first range of wavelengths of radiation and a second photodiode configured to detect a second range of wavelengths of radiation.

A semiconductor arrangement including a photodiode array is provided herein. According to some embodiments, the semiconductor arrangement includes a photodiode array over a substrate, wherein the photodiode array comprises a first photodiode, a second photodiode, and a third photodiode. An isolation structure is disposed between the first photodiode and the second photodiode and surrounds the third photodiode. The isolation structure has a first well and a shallow trench isolation at least partially surrounded by the first well. A near-infrared pass filter overlies the second photodiode and is configured to allow a first range of wavelengths to pass through and be detected by the second photodiode. The photodiode array includes a first subset of photodiodes having a first lateral cross-sectional diameter and a second subset of photodiodes having a second lateral cross-sectional diameter. The first photodiode and the third photodiode are members of the first subset of photodiodes, and the second photodiode is a member of the second subset of photodiodes. Each of the first subset of photodiodes has a corresponding overlying radiation pass filter configured to allow a radiation pass range of wavelengths to pass through and be detected by a corresponding photodiode. Each of the second subset of photodiodes has a corresponding overlying radiation pass filter configured to allow a radiation pass range of wavelengths to pass through and be detected by a corresponding photodiode. The isolation structure includes a first subset of isolation structures surrounding the first subset of photodiodes with each having a first lateral cross-sectional shape. The isolation structure includes a second subset of isolation structures surrounding the second subset of photodiodes with each having a second lateral cross-sectional shape different from the first lateral cross-sectional shape. The first subset of isolation structures includes a plurality of laterally contiguous isolation structures laterally surrounding the third photodiode.

One or more methods of making a semiconductor arrangement are provided herein. According to some embodiments, a first photodiode with a first depth is formed from a first side in a substrate. A first isolation structure is formed laterally surrounding the first photodiode. The first isolation structure comprises a first well extending to a second depth from the first side in the substrate greater than the first depth. An etch into a second side in the substrate, opposite the first side, is performed to form a deep trench. The deep trench extends from a third depth from the first side in the substrate less than the second depth to the second side of the substrate. At least a portion of the deep trench underlies the first well. A deep trench isolation is formed in the deep trench. A near-infrared pass filter overlying the second side of the substrate and the first photodiode is formed. The near-infrared pass filter is configured to allow a first range of wavelengths to pass through and be detected by the first photodiode. Radiation enters the substrate from a first direction and from the second side of the substrate. The etch into the second side of the substrate may be performed such that the deep trench is tapered from a first maximum width to a first minimum width in the first direction. An etch into the first side of the substrate is performed to form a shallow trench. The shallow trench may be tapered from a first maximum width to a first minimum width in a second direction opposite to the first direction. A shallow trench isolation is formed in the shallow trench. The first isolation structure may be formed having a first lateral cross-sectional shape. A second photodiode is formed from the first side of the substrate. A second isolation structure is formed laterally surrounding the second photodiode. The second isolation structure comprises a second well extending to the second depth from the first side in the substrate and having a second lateral cross-sectional shape. A radiation pass filter is formed overlying the second side of the substrate and the second photodiode.

Figure 1B:
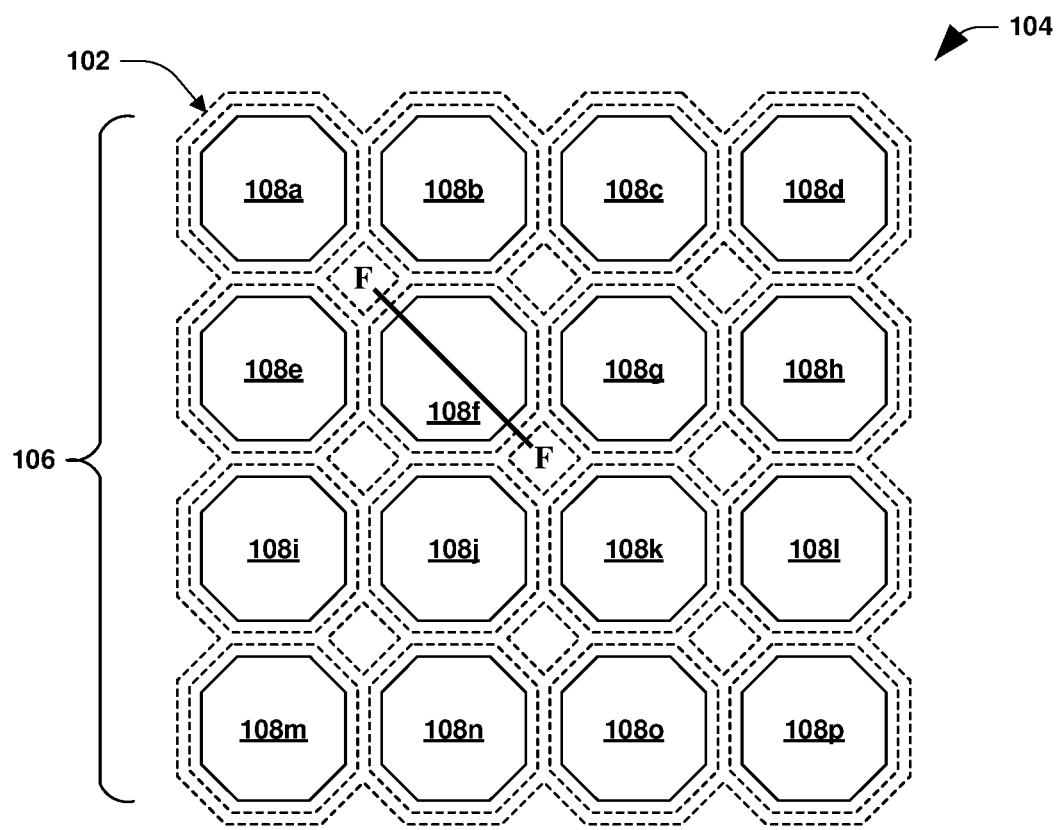
Figure 1C:
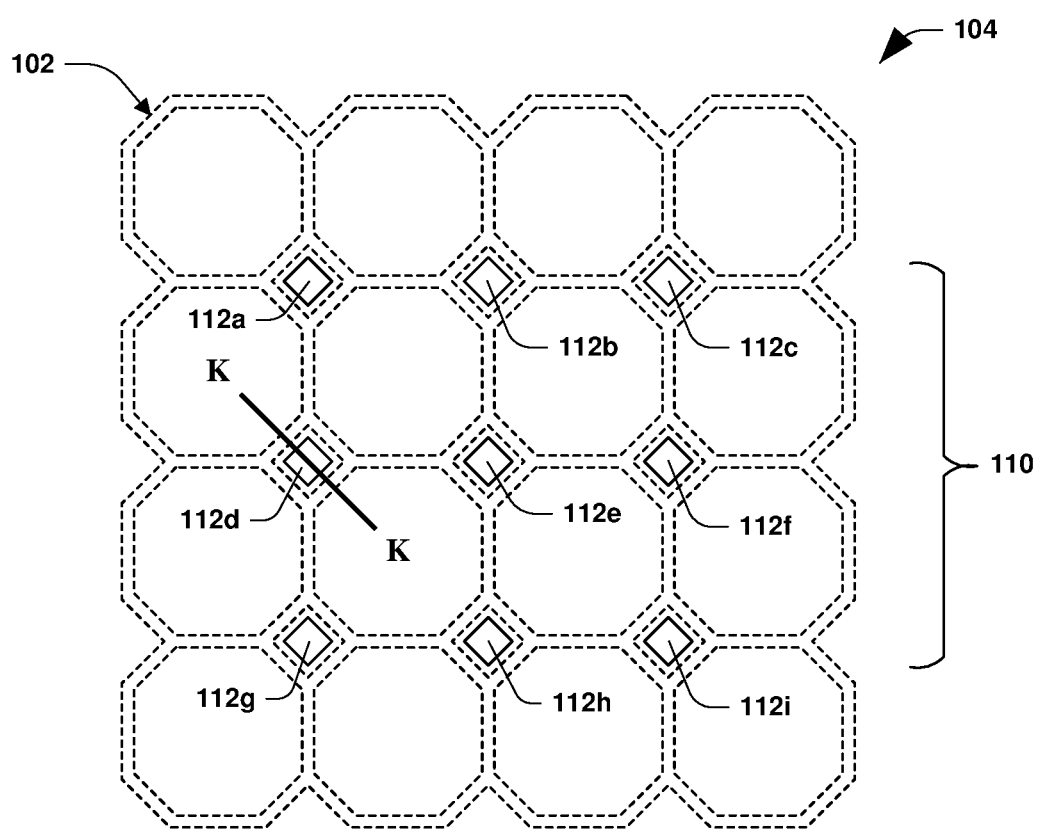
Figure 1D:
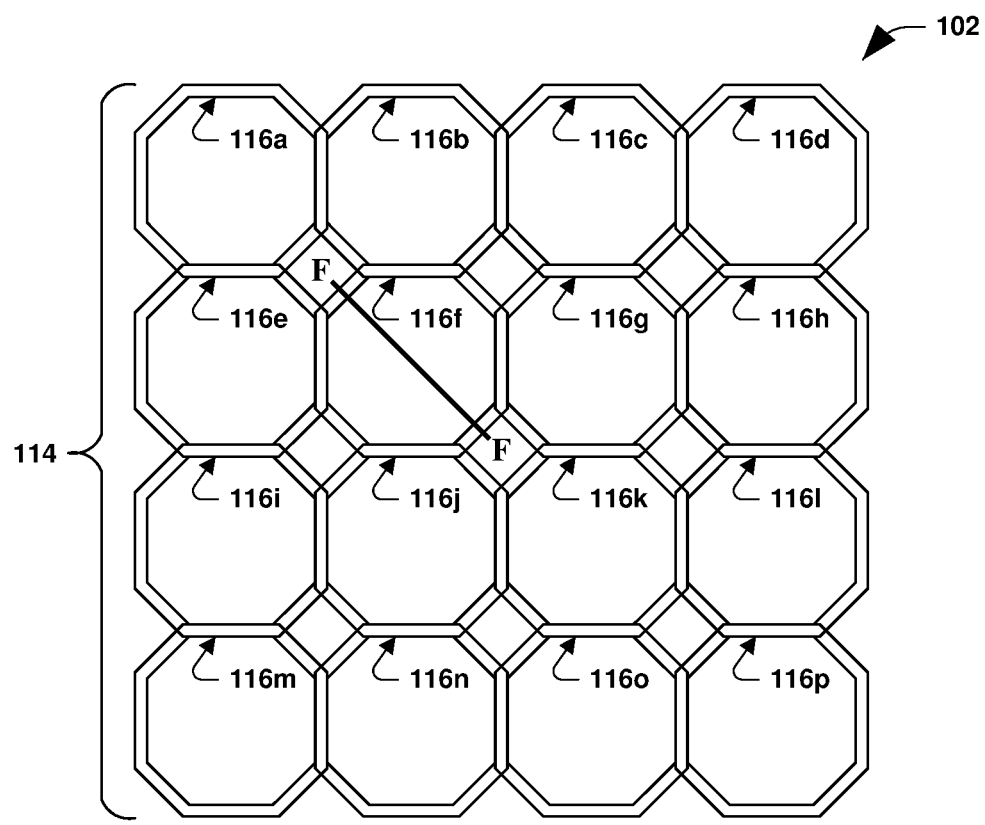

FIG. 1A illustrates a semiconductor arrangement 100, according to some embodiments. The semiconductor arrangement 100 comprises an isolation structure arrangement 102 at least one of surrounding or partially surrounding a photodiode array 104. The photodiode array 104 comprises a first photodiode 101, a second photodiode 103, a third photodiode 105, and a fourth photodiode 107, for example. FIG. 1B illustrates the photodiode array 104 comprising a first subset of photodiodes 106, including first photodiodes 108a-108p. According to some embodiments, the first photodiode 108a in FIG. 1B corresponds to the first photodiode 101 in FIG. 1A and the first photodiode 108f in FIG. 1B corresponds to the third photodiode 105 in FIG. 1A. Each photodiode of the first subset of photodiodes 106 has a corresponding overlying radiation pass filter configured to allow a radiation pass range of wavelengths to pass through and be detected by the corresponding photodiode, as set forth in greater detail below. FIG. 1C illustrates the photodiode array 104 comprising a second subset of photodiodes 110, including second photodiodes 112a-112i. According to some embodiments, the photodiode 112a in FIG. 1C corresponds to the second photodiode 103 in FIG. 1A, and the second photodiode 112d in FIG. 1C corresponds to the fourth photodiode 107 in FIG. 1A. According to some embodiments, the first subset of photodiodes 106 has a greater lateral cross-sectional diameter (as described in greater detail below) than the second subset of photodiodes 110. According to some embodiments, the first subset of photodiodes 106 has a greater lateral cross-sectional area (as described in greater detail below) than the second subset of photodiodes 110. Each photodiode of the second subset of photodiodes 110 has a corresponding overlying radiation pass filter configured to allow a radiation pass range of wavelengths to pass through and be detected by the corresponding photodiode, as set forth in greater detail below. FIG. 1D illustrates the isolation structure arrangement 102 comprising a first subset of isolation structures 114, including first isolation structures 116a-116p. According to some embodiments, each of the first isolation structures 116a-116p laterally surrounds each of the first photodiodes 108a-108p and is formed in an array.

FIG. 1E illustrates first isolation structure 116f surrounding a first photodiode 108f, according to some embodiments. FIG. 1F is a sectional view of the first isolation structure 116f and the first photodiode 108f taken along line F-F of FIGS. 1B, 1D, and 1E. The first isolation structure 116f has a first lateral cross-sectional shape and includes a plurality of sections. The first isolation structure 116f includes sections 116f1-116f8. According to some embodiments, the first isolation structure 116f has a piecewise-linear cross-sectional shape, such as a tetragon (e.g., a square, a rectangle, a diamond, a trapezoid, a parallelogram, or a rhombus), a pentagon, a hexagon, a heptagon, an octagon, or other cross-sectional shape. According to some embodiments, the first isolation structure 116f has at least one of a regular piecewise-linear cross-sectional shape, where all sections have an equivalent length, or a non-regular piecewise-linear cross-sectional shape, where all section do not have an equivalent length. For example, sections 116f8, 116f1, 116f2, 116f4, 116f5, and 116f6 may have an equivalent length and sections 116f7 and 116f3 may have an equivalent length longer than sections 116f8, 116f1, 116f2, 116f4, 116f5, and 116f6. In another example, sections 116f8, 116f1, 116f2, 116f4, 116f5, and 116f6 may have an equivalent length and sections 116f7 and 116f3 may have an equivalent length shorter than sections 116f8, 116f1, 116f2, 116f4, 116f5, and 116f6. Other arrangements and/or configurations of first isolation structure 116f are within the scope of the present disclosure.

According to some embodiments, the first isolation structure 116f has sections that are not piecewise-linear. For example, sections 116f8, 116f1, 116f2, 116f4, 116f5, and 116f6 are curved and sections 116f7 and 116f3 are piecewise-linear. In another example, sections 116f8, 116f1, 116f2, 116f4, 116f5, and 116f6 are curved with a first degree of curvature and sections 116f7 and 116f3 are curved with a second degree of curvature. According to some embodiments, the first isolation structure 116f is one of circular, elliptical, or approximating a circle. According to some embodiments, a layout of the first isolation structure 116f is an octagon with variations due to fabrication resulting in sections approximating a circle. Other structures and/or configurations of the first isolation structure 116f are within the scope of the present disclosure.

The first photodiode 108f has a first lateral cross-sectional diameter W1pd and a first lateral cross-sectional length L1pd. According to some embodiments, the first photodiode 108f has a first lateral cross-sectional shape. According to some embodiments, the first photodiode 108f has a first lateral cross-sectional area bounded by the first isolation structure 116f. According to some embodiments, the first photodiode 108f has a first lateral cross-sectional shape approximating a lateral cross-sectional shape of the first isolation structure 116f. According to some embodiments, the first photodiode 108f has a portion approximating a first lateral cross-sectional shape of the first isolation structure 116f. According to some embodiments, a layout of the first photodiode 108f has a portion approximating an octagon, or other lateral cross-sectional shape set forth above, with variations due to fabrication resulting in the portion approximating a circle. First photodiode 108f may transfer charge to a floating diffusion, as described in greater detail below. According to some embodiments, the floating diffusion is bounded by the first isolation structure 116f. According to some embodiments, the floating diffusion has a portion approximating a lateral cross-sectional shape of the first isolation structure 116f. According to some embodiments, a layout of the floating diffusion has a portion approximating an octagon, or other lateral cross-sectional shape set forth above, with variations due to fabrication resulting in the portion approximating a circle. Other structures and/or configurations of the first photodiode 108f are within the scope of the present disclosure.

Figure 1G:
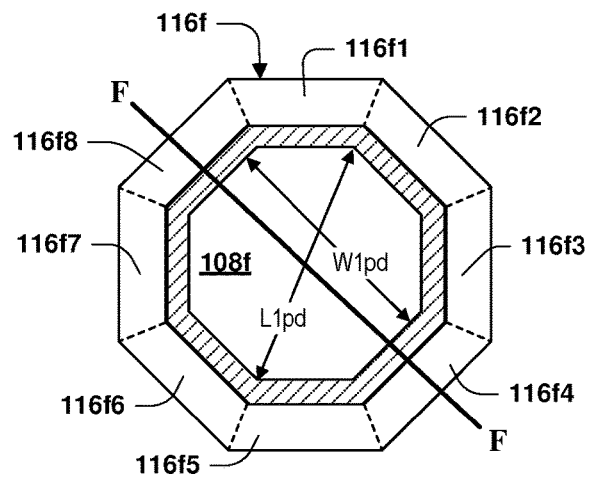
Figure 1G:
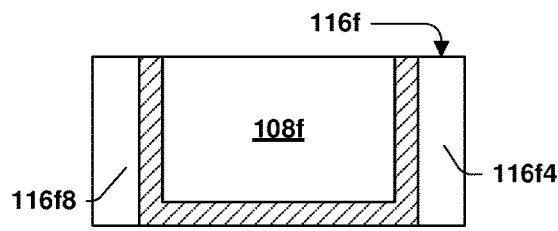
Figure 1G:
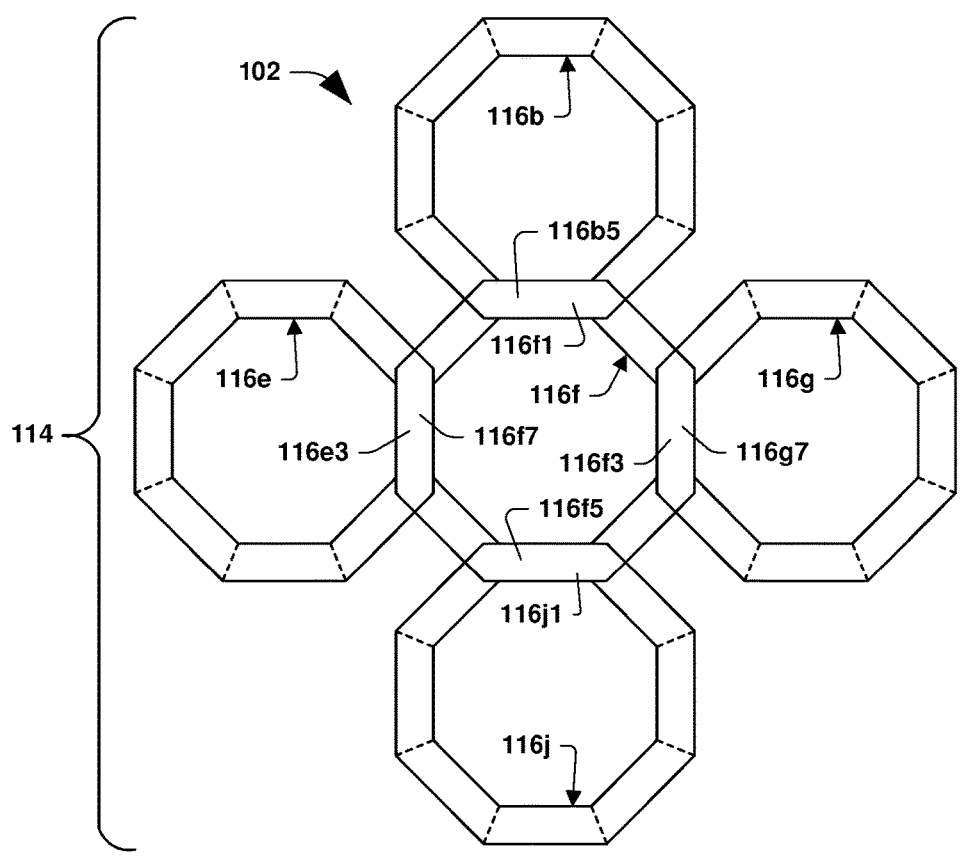

FIG. 1G illustrates the isolation structure arrangement 102 comprising a first subset of isolation structures 114, according to some embodiments. Each of the first subset of isolation structures 114 laterally surrounds a photodiode from the first subset of photodiodes 106 and is formed in an array. The first subset of isolation structures 114 includes a plurality of first isolation structures adjacent to the first isolation structure 116f. The plurality of first isolation structures includes first isolation structures 116b, 116g, 116j, and 116e. According to some embodiments, each of the first isolation structures 116a-116p illustrated in FIG. 1D (e.g., the first isolation structure 116f) is at least one of adjacent to, contiguous with, overlapping, or overlapping a portion of at least one first isolation structure (e.g., one of the first isolation structures 116a-116p). According to some embodiments, the first isolation structure 116f includes a section 116f1 that is contiguous with a section 116b5 of the first isolation structure 116b. According to some embodiments, each of the first isolation structures 116a-116p is at least one of adjacent to, contiguous with, overlapping, or overlapping a portion of at least two first isolation structures (e.g., two of the first isolation structures 116a-116p). According to some embodiments, the first isolation structure 116f includes a section 116f3 that is contiguous with a section 116g7 of the first isolation structure 116g. According to some embodiments, each of the first isolation structures 116a-116p is at least one of adjacent to, contiguous with, overlapping, or overlapping a portion of at least three first isolation structures (e.g., three of the first isolation structures 116a-116p). According to some embodiments, the first isolation structure 116f includes a section 116f5 that is contiguous with a section 116j1 of the first isolation structure 116j. According to some embodiments, each of the first isolation structures 116a-116p is at least one of adjacent to, contiguous with, overlapping, or overlapping a portion of at least four first isolation structures (e.g., four of the first isolation structures 116a-116p). According to some embodiments, the first isolation structure 116f includes a section 116f7 that is contiguous with a section 116e3 of the first isolation structure 116e. Other structures and/or configurations of the first isolation structures 116a-116p are within the scope of the present disclosure.

According to some embodiments, each of the first isolation structures 116a-116p (e.g., the first isolation structure 116f) includes a section that is the same as a section of at least one first isolation structure. For example, the first isolation structure 116f may include the section 116f1 that is the same as the section 116b5 of the first isolation structure 116b. According to some embodiments, each of the first isolation structures 116a-116p includes a section that is the same as a section of a second first isolation structure. For example, the first isolation structure 116f may also include the section 116f3 that is the same as the section 116g7 of the first isolation structure 116g. According to some embodiments, each of the first isolation structures 116a-116p includes a third section that is the same as a section of a third first isolation structure. For example, the first isolation structure 116f may also include the section 116f5 that is the same as the section 116*j*1 of the first isolation structure 116*j*. According to some embodiments, each of the first isolation structures 116*a*-116*p* includes a fourth section that is the same as a section of a fourth first isolation structure. For example, the first isolation structure 116*f* may include the section 116*f*7 that is the same as the section 116*e*3 of the first isolation structure 116*e*. Other structures and/or configurations of the first isolation structures 116*a*-116*p* are within the scope of the present disclosure.

Figure 1H:
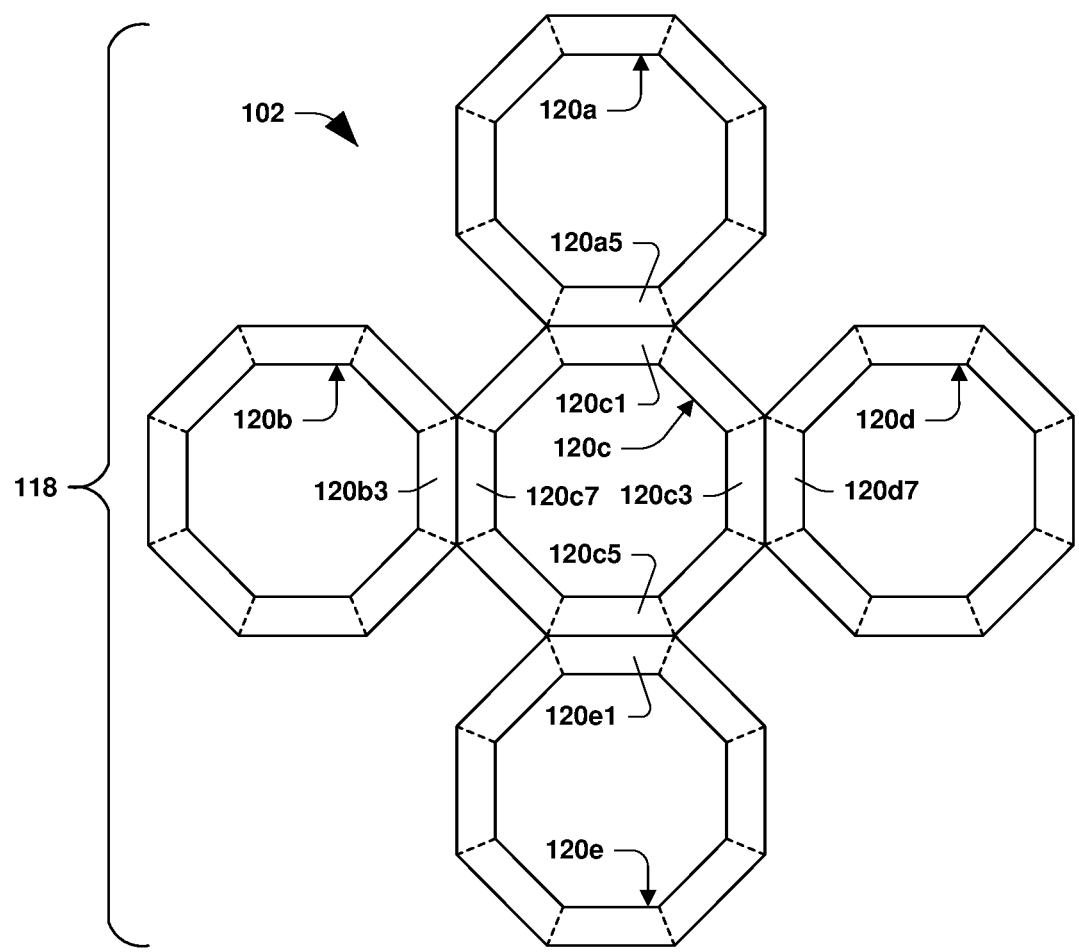

FIG. 1H illustrates the isolation structure arrangement 102 comprising a first subset of isolation structures 118, including first isolation structures 120*a*-120*e*, according to some embodiments. The first subset of isolation structures 118 may replace the first subset of isolation structures 114 in FIG. 1G. Each of the first isolation structures 120*a*-120*e* laterally surrounds a photodiode from the first subset of photodiodes 106 and is formed in an array. According to some embodiments, each of the first isolation structures 120*a*-120*e* includes a plurality of sections as set forth with reference to first isolation structure 116*f*, illustrated in FIG. 1E (e.g., sections 116*f*1-116*f*8). In the example illustrated in FIG. 1F, each of the first isolation structures 120*a*-120*e* laterally surrounds a corresponding photodiode (e.g., a photodiode 112*a*-*e* of the first subset of photodiodes 106). In other words adjacent photodiodes may be laterally separated by at least two first isolation structures (e.g., two of the first isolation structures 120*a*-120*e*). For example, a first photodiode surrounded by the first isolation structure 120*c* is separated from a first photodiode surrounded by the first isolation structure 120*b* by both the first isolation structure 120*c* and the first isolation structure 120*b*.

According to some embodiments, each of the first isolation structures 120*a*-120*e* (e.g., the first isolation structure 120*c*) is adjacent to and contiguous with at least one of the first isolation structures 120*a*-120*e*. For example, the first isolation structure 120*c* may include a section 120*c*1 that is contiguous with a section 120*a*5 of the first isolation structure 120*a*. According to some embodiments, each of the first isolation structures 120*a*-120*e* is adjacent to and contiguous with at least two first isolation structures (e.g., two of the first isolation structures 120*a*-120*e*). For example, the first isolation structure 120*c* may also include a section 120*c*3 that is contiguous with a section 120*d*7 of the first isolation structure 120*d*. According to some embodiments, each of the first isolation structures 120*a*-120*e* is adjacent to and contiguous with at least three first isolation structures (e.g., three of the first isolation structures 120*a*-120*e*). For example, the first isolation structure 120*c* may also include a section 120*c*5 that is contiguous with a section 120*e*1 of the first isolation structure 120*e*. According to some embodiments, each of the first isolation structures 120*a*-120*e* is adjacent to and contiguous with at least four first isolation structures (e.g., four of the first isolation structures 120*a*-120*e*). For example, the first isolation structure 120*c* may also include a section 120*c*7 that is contiguous with a section 120*b*3 of the first isolation structure 120*b*. Other structures and/or configurations of the first isolation structures 120*a*-120*e* are within the scope of the present disclosure.

Figure 1I:
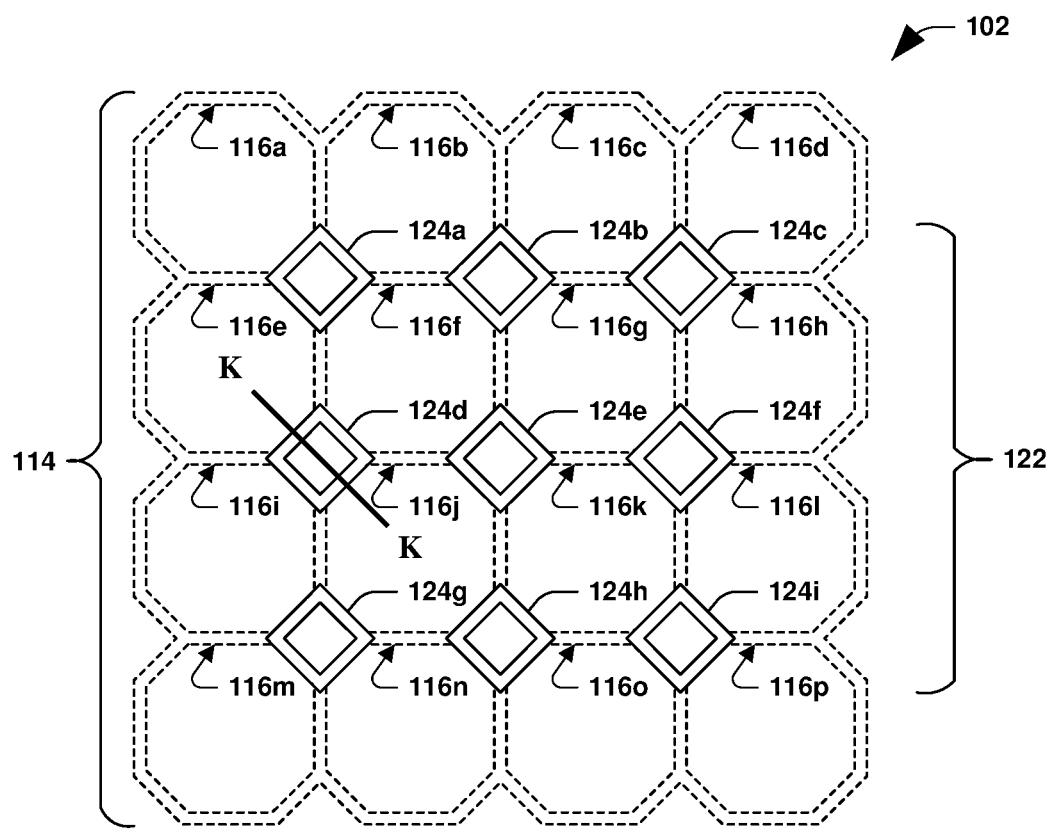

FIG. 1I illustrates the isolation structure arrangement 102 comprising a second subset of isolation structures 122, including second isolation structures 124*a*-124*i*. According to some embodiments, each of the second isolation structures 124*a*-124*i* laterally surrounds each of the second photodiodes 112*a*-112*i* and is formed in an array. According to some embodiments, the second subset of isolation structures 122, including the second isolation structures 124*a*-124*i*, are interleaved between the first subset of isolation structures 114, including the first isolation structures 116*a*-116*p*. Other structures and/or configurations of the second isolation structures 124*a*-124*i* are within the scope of the present disclosure.

Figure 1J:
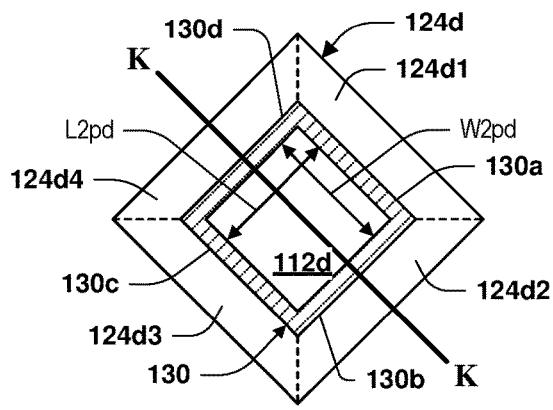
Figure 1K:
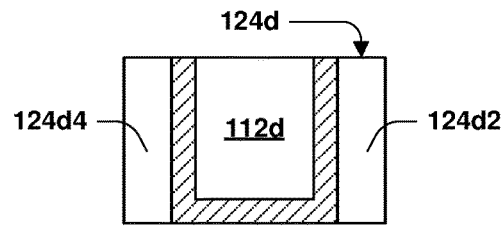

FIG. 1J illustrates the second isolation structure 124*d* surrounding the second photodiode 112*d*, according to some embodiments. FIG. 1K is a sectional view of the second isolation structure 124*d* and the second photodiode 112*d* taken along line K-K of FIGS. 1C, 1I, and 1J. The second isolation structure 124*d* has a second lateral cross-sectional shape and includes a plurality of sections. The second isolation structure 124*d* includes sections 124*d*1-124*d*4. According to some embodiments, the sections 124*d*1-124*d*4 of the second isolation structure 124*d* are at least one of sections or portions of sections of adjacent second isolation structures. The second isolation structure 124*d* includes a border 130. According to some embodiments, the border 130 is a p-n junction border and the sections 124*d*1-124*d*4 are sections of first isolation structures (e.g., the first isolation structures 116*a*-116*p*). The border 130 includes border sections 130*a*-130*d*. According to some embodiments, the border sections 130*a*-130*d* are p-n junction border sections and the sections 124*d*1-124*d*4 are isolation structures of first isolation structures (e.g., the first isolation structures 116*a*-116*p*).

According to some embodiments, the second isolation structure 124*d* has a second piecewise-linear cross-sectional shape, such as a tetragon (e.g., a square, a rectangle, a diamond, a trapezoid, a parallelogram, or a rhombus). According to some embodiments, the second isolation structure 124*d* has a regular piecewise-linear cross-sectional shape, where all sections have an equivalent length. According to some embodiments, the second isolation structure 124*d* has a non-regular piecewise-linear cross-sectional shape, where all sections do not have an equivalent length. For example, the sections 124*d*4 and 124*d*1 may have an equivalent length and the sections 124*d*2 and 124*d*3 may have an equivalent length longer than the sections 124*d*4 and 124*d*1. In another example, the sections 124*d*4 and 124*d*1 may have an equivalent length and the sections 124*d*2 and 124*d*3 may have an equivalent length shorter than the sections 124*d*4 and 124*d*1. Other structures and/or configurations of the second isolation structure 124*d* are within the scope of the present disclosure.

According to some embodiments, the second isolation structure 124*d* has sections that are not piecewise-linear. For example, the sections 124*d*4 and 124*d*1 may be curved and the sections 124*d*2 and 124*d*3 may be piecewise-linear. In another example, the sections 124*d*4 and 124*d*1 may be curved with a first degree of curvature and the sections 124*d*2 and 124*d*3 may be curved with a second degree of curvature. According to some embodiments, the second isolation structure 124*d* may be at least one of circular, approximating a circle, elliptical, or approximating an ellipse. According to some embodiments, the layout of the second isolation structure 124*d* is a diamond with variations due to fabrication resulting in sections approximating a circle or an ellipse. Other structures and/or configurations of the second isolation structure 124*d* are within the scope of the present disclosure.

The second photodiode 112*d* has a second lateral cross-sectional diameter W2*pd* and a second lateral cross-sectional length L2*pd*. According to some embodiments, the lateral cross-sectional diameter W2*pd* of second photodiode 112*d* is less than the first lateral cross-sectional diameter W1*pd* of the first photodiode 108*f*. According to some embodiments, the lateral cross-sectional length L2*pd* of the second photodiode 112d is less than the first lateral cross-sectional length L1pd of the first photodiode 108f. According to some embodiments, the second photodiode 112d has a second lateral cross-sectional shape. According to some embodiments, the second photodiode 112d has a second lateral cross-sectional area bounded by the second isolation structure 124d. According to some embodiments, the second lateral cross-sectional shape of the second photodiode 112d is less than the first lateral cross-sectional shape of the first photodiode 108f. According to some embodiments, the second lateral cross-sectional area of the second photodiode 112d is less than the first lateral cross-sectional area of the first photodiode 108f. According to some embodiments, the second photodiode 112d has a second lateral cross-sectional shape approximating the shape of the second isolation structure 124d. For example, a layout of the second photodiode 112d may have a portion approximating a diamond, or other second lateral cross-sectional shape set forth above, with variations due to fabrication resulting in a portion approximating a circle or an ellipse. The second photodiode 112d may transfer charge to a floating diffusion, as described in greater detail below. According to some embodiments, the floating diffusion is bounded by the second isolation structure 124d. According to some embodiments, the floating diffusion has a portion approximating a diamond, or other second lateral cross-sectional shape set forth above, with variations due to fabrication resulting in the portion approximating a circle or an ellipse. Other structures and/or configurations of the second photodiode 112d are within the scope of the present disclosure.

Figure 1L:
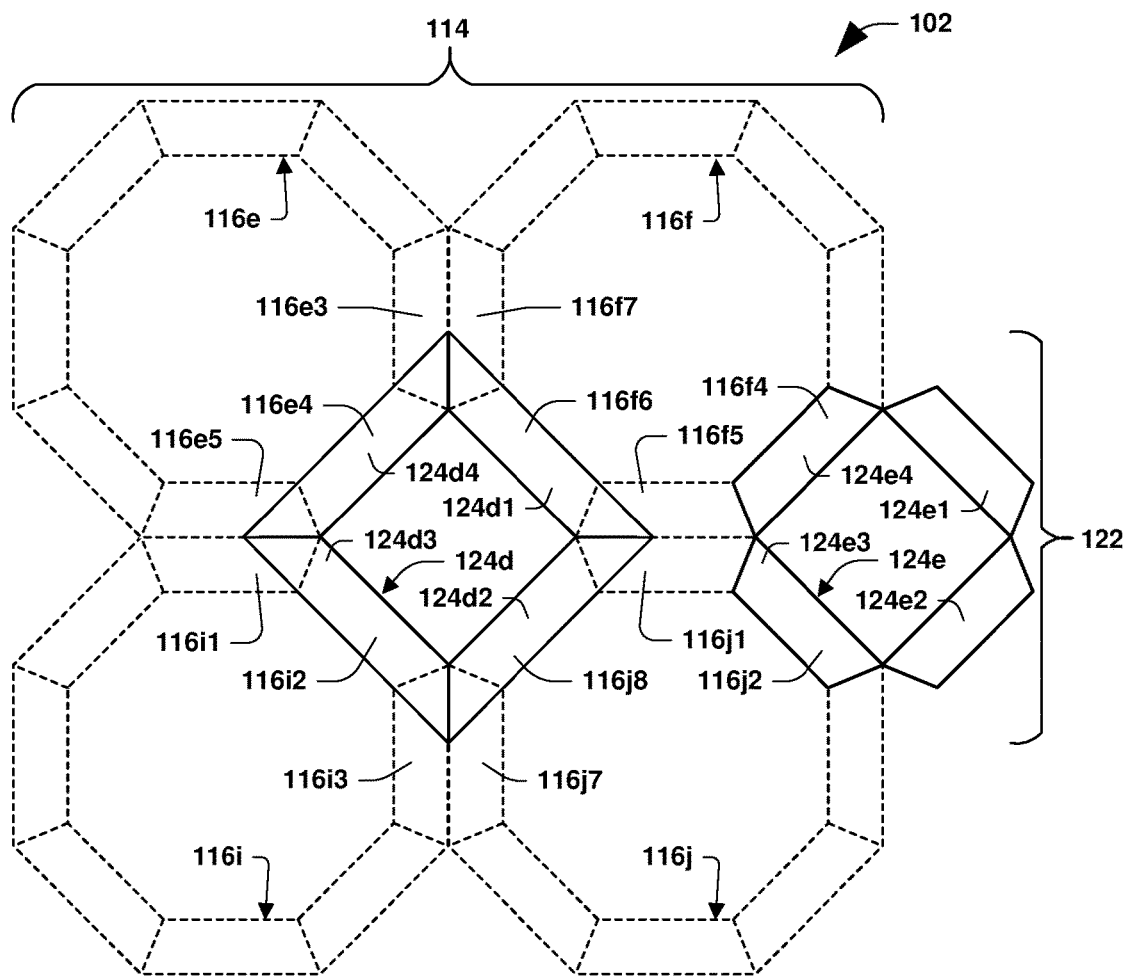

FIG. 1L illustrates the isolation structure arrangement 102 comprising the second subset of isolation structures 122, according to some embodiments. Each of the second subset of isolation structures 122 laterally surrounds a photodiode from the second subset of photodiodes 110 and is formed in an array. The second subset of isolation structures 122, including a plurality of second isolation structures, is adjacent to the first subset of isolation structures 114, including the plurality of first isolation structures. For example, the second isolation structure 124d is adjacent to the first isolation structures 116e, 116f, 116i, and 116j, and the second isolation structure 124e is adjacent to the first isolation structures 116f and 116j. According to some embodiments, each of the second subset of isolation structures 124d and 124e includes a plurality of sections. For example, the second isolation structure 124d includes sections 124d1-124d4 and the second isolation structure 124e includes sections 124e1-124e4. According to some embodiments, each of the first isolation structures 116e, 116f, 116i, and 116j includes a plurality of sections. The first isolation structure 116e includes sections 116e1-116e8 (e.g., sections 116e3, 116e4, and 116e5); the first isolation structure 116f includes sections 116f1-116f8 (e.g., sections 116f4, 116f5, 116f6, and 116f7); the first isolation structure 116i includes sections 116i1-116i8 (e.g., sections 116i1, 116i2, and 116i3); and the first isolation structure 116j includes sections 116j1-116j8 (e.g., sections 116j1, 116j2, 116j7, and 116j8). According to some embodiments, each of the second subset of isolation structures 122 (e.g., the second isolation structures 124d and 124e) is at least one of adjacent to or contiguous with at least one first isolation structure in the first subset of isolation structures 114 (e.g., first isolation structures 116e, 116f, 116i, 116j).

According to some embodiments, each of the second subset of isolation structures 122 includes a section that is the same as a section of one of the first subset of isolation structures 114. For example, the second isolation structure 124e includes the section 124e4 that is the same as the section 116f4 of the first isolation structure 116f. In another example, the second isolation structure 124e includes the section 124e3 that is the same as the section 116j2 of the first isolation structure 116j. According to some embodiments, each of the second subset of isolation structures 122 includes a section that is the same as at least one of a section, a portion of a section, or a plurality of portions of sections of a first isolation structure. For example, the second isolation structure 124d includes the section 124d1 that is at least one of the same as the section 116f6, the same as a portion of the section 116f7, or the same as a portion of the section 116f5. The second isolation structure 124d includes the section 124d2 that is at least one of the same as the section 116j8, the same as a portion of the section 116j1, or the same as a portion of the section 116j7. The second isolation structure 124d includes the section 124d3 that is at least one of the same as the section 116i2, the same as a portion of the section 116i1, or the same as a portion of the section 116i3. Likewise, the second isolation structure 124d includes the section 124d4 that is at least one of the same as the section 116e4, the same as a portion of the section 116e3, or the same as a portion of the section 116e5. Other structures and/or configurations of the plurality of second isolation structures 124d and 124e are within the scope of the present disclosure.

Figure 1M:
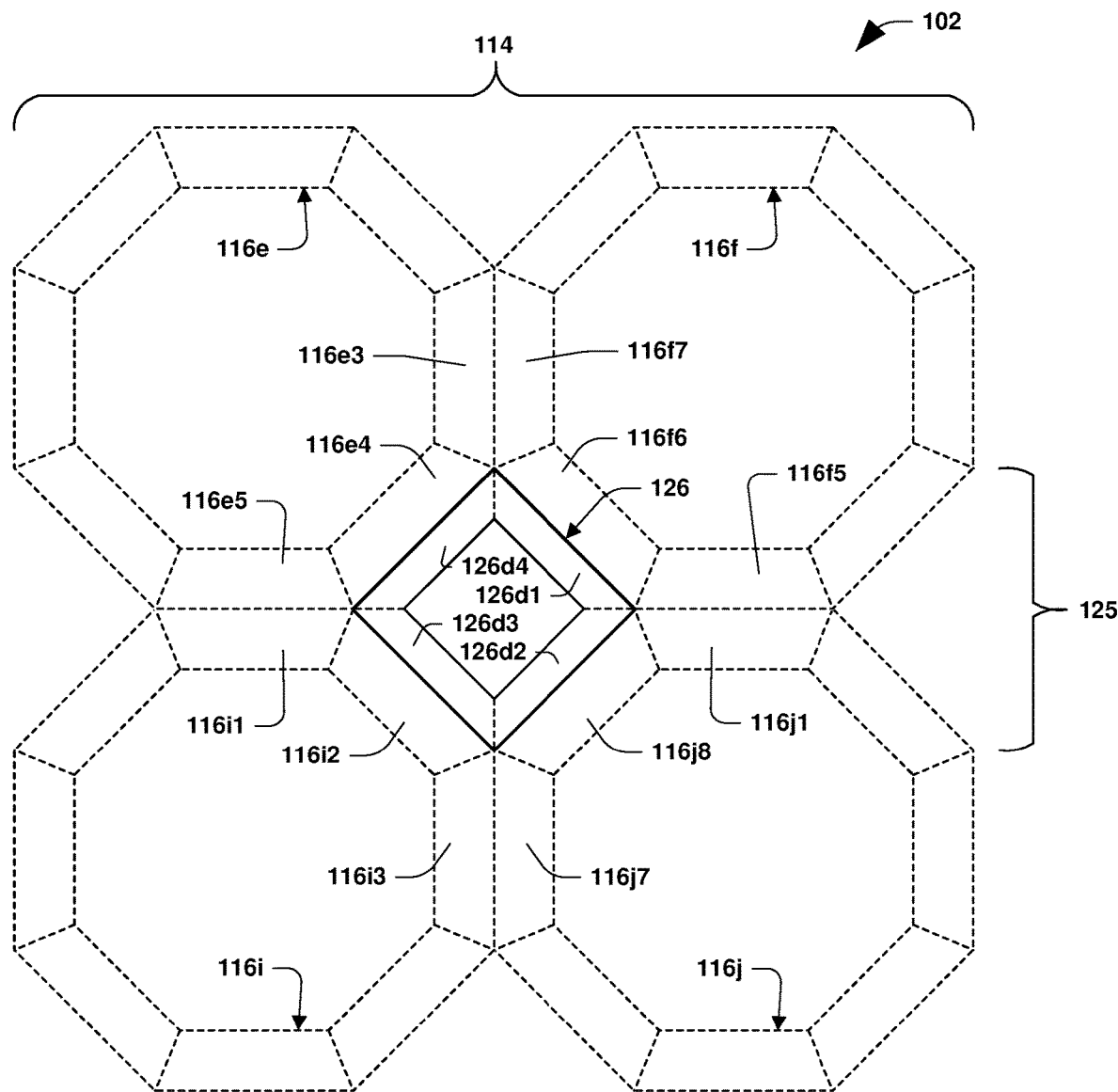

FIG. 1M illustrates the isolation structure arrangement 102 comprising a second subset of isolation structures 125, according to some embodiments. The second subset of isolation structures 125 may replace the second subset of isolation structures 122 in FIG. 1L. Each of the second subset of isolation structures 125 laterally surrounds a photodiode from the second subset of photodiodes 110 and is formed in an array. The second subset of isolation structures 125 comprises a plurality of second isolation structures (e.g., second isolation structure 126). According to some embodiments, second isolation structure 126 may be formed in an array such as the array of the second subset of isolation structures 122 of FIG. 1L. The second subset of isolation structures 125 laterally surrounds second photodiodes (e.g., the second photodiodes 112a-112i of FIG. 10). According to some embodiments, the second isolation structure 126 includes a plurality of sections 126d1, 126d2, 126d3, 126d4, similar to sections of the second isolation structure 124d of FIG. 1J. In the example illustrated in FIG. 1M, the second isolation structure 126 laterally surrounds a corresponding second photodiode (e.g., the second photodiodes 112a-112i illustrated in FIG. 10) of the second subset of photodiodes 110. According to some embodiments, diagonally adjacent photodiodes (e.g., the second photodiodes 112a-112i illustrated in FIG. 10 that are diagonally adjacent to the first photodiodes 108a-108p illustrated in FIG. 1D) are diagonally separated by at least two isolation structures. For example, a second photodiode disposed within the second isolation structure 126 is diagonally adjacent to a first photodiode disposed within the first isolation structure 116e, and is separated by the second isolation structure 126 and the first isolation structure 116e. Other structures and/or configurations of the second subset of the isolation structures 125 are within the scope of the present disclosure.

According to some embodiments, the second isolation structure 126 is at least one of adjacent to, contiguous with, overlapping, or overlapping a portion of at least one first isolation structure. For example, the second isolation structure 126 may include a section 126d1 that is adjacent to and contiguous with a section 116f6 of the first isolation structure 116f. According to some embodiments, the second isolation structure 126 is at least one of adjacent to, contiguous with, overlapping, or overlapping a portion of at least two first isolation structures (e.g., two of the first isolation structures 116e, 116f, 116i, 116j). For example, the second isolation structure 126 may also include a section 126d2 that is adjacent to and contiguous with a section 116j8 of the first isolation structure 116j. According to some embodiments, the second isolation structure 126 is at least one of adjacent to, contiguous with, overlapping, or overlapping a portion of at least three first isolation structures (e.g., three of the first isolation structures 116e, 116f, 116i, 116j). For example, the second isolation structure 126 may also include a section 126d3 that is adjacent to and contiguous with a section 116i2 of the first isolation structure 116i. According to some examples, the second isolation structure 126 is at least one of adjacent to, contiguous with, overlapping, or overlapping a portion of at least four first isolation structures (e.g., four of the first isolation structures 116e, 116f, 116i, 116j). For example, the second isolation structure 126 may also include a section 126d4 that is adjacent to and contiguous with a section 116e4 of the first isolation structure 116e. Other structures and/or configurations of the second isolation structure 126 are within the scope of the present disclosure.

According to some embodiments, the first isolation structures 116a-116p of the first subset of isolation structures 114 are larger than the second isolation structures 124a-124i of the second subset of isolation structures 122. According to some embodiments, the first isolation structures 116a-116p have at least one of a larger lateral cross-sectional diameter or a larger cross-sectional area. According to some embodiments, the first isolation structures 116a-116p have a different lateral cross-sectional shape than the second isolation structures 124a-124i. According to some embodiments, each of the first photodiodes 108a-108p of the first subset of photodiodes 106 are larger than each of the second photodiodes 112a-112i of the second subset of photodiodes 110. According to some embodiments, each of the first photodiodes 108a-108p has at least one of a larger lateral cross-sectional diameter or a larger cross-sectional area than each of the second photodiodes 112a-112i. According to some embodiments, each of the first photodiodes 108a-108p has a different lateral cross-sectional shape than each of the second photodiodes 112a-112i.

According to some embodiments, the first subset of photodiodes 106 and the second subset of photodiodes 110 are image sensors, such as at least one of optical image sensors, proximity image sensors, motion image sensors, infrared image sensors, or near-infrared (NIR) image sensors. NIR image sensors may be used for security, personal authentication, range finding applications, to enhance a color optical image, etc. Optical image sensors may use an array of photodiodes to detect an optical image in ranges of wavelengths of color optical radiation with a color filter pattern, for example. The color filter pattern may be, for example, a Bayer filter pattern of red-green-blue (RGB), with a 2×2 color unit cell of two green filters in the diagonal positions and blue and red in the off-diagonal positions. The color filter pattern may be, for example, a Bayer filter pattern of red-green-blue-white (RGBW), with a 2×2 color unit cell of one green filter and one white filter in the diagonal positions and blue and red in the off-diagonal positions. NIR image sensors may use an array of photodiodes to detect an NIR image in a range of wavelengths of NIR radiation. The image detected by the NIR image sensors may be used to digitally enhance the detected optical image, for example.

According to some embodiments, the semiconductor arrangement 100 may be used to detect an optical image and a corresponding NIR image. The first subset of photodiodes 106 may be laid out with a color filter pattern to detect an optical image and the second subset of photodiodes 110 may be laid out with an NIR filter to detect a corresponding NIR image. Alternatively, the first subset of photodiodes 106 may be laid out with an NIR filter pattern to detect an NIR image and the second subset of photodiodes 110 may be laid out with a color filter pattern to detect a corresponding optical image.

According to some embodiments, the first subset of photodiodes 106 may be resized with respect to the second subset of photodiodes 110. For example, the first subset of photodiodes 106 may be resized to capture an optical image with greater quality than an NIR image captured by the second subset of photodiodes 110 when the NIR image is used to enhance the optical image. The first subset of photodiodes 106 may be resized corresponding to a degree of quality with respect to the NIR image. For example, the first subset of photodiodes 106 may be resized to have a larger lateral cross-sectional diameter than the second subset of photodiodes 110. The first subset of photodiodes 106 may be resized to have a lateral cross-sectional diameter that is 3 times larger than the second subset of photodiodes 110. The first subset of photodiodes 106 may be resized to have a lateral cross-sectional diameter that is 2.5 times larger than the second subset of photodiodes 110. The first subset of photodiodes 106 may be resized to have a lateral cross-sectional diameter that is 2 times larger than the second subset of photodiodes 110. The first subset of photodiodes 106 may be resized to have a lateral cross-sectional diameter that is 1.5 times larger than the second subset of photodiodes 110. Other resizing of the lateral cross-sectional diameter of first subset of photodiodes 106 with respect to the second subset of photodiodes 110 is within the scope of the present disclosure.

The first subset of photodiodes 106 may be resized to have a larger lateral cross-sectional area or a larger lateral cross-sectional shape than the second subset of photodiodes 110. For example, the first subset of photodiodes 106 may be resized to have a lateral cross-sectional area or a larger lateral cross-sectional shape that is 3 times larger than the second subset of photodiodes 110. The first subset of photodiodes 106 may be resized to have a lateral cross-sectional area or a larger lateral cross-sectional shape that is 2.5 times larger than the second subset of photodiodes 110. The first subset of photodiodes 106 may be resized to have a lateral cross-sectional area or a larger lateral cross-sectional shape that is 2 times larger than the second subset of photodiodes 110. The first subset of photodiodes 106 may be resized to have a lateral cross-sectional area or a larger lateral cross-sectional shape that is 1.5 times larger than the second subset of photodiodes 110. Other resizing of the lateral cross-sectional area or the larger lateral cross-sectional shape of first subset of photodiodes 106 with respect to the second subset of photodiodes 110 is within the scope of the present disclosure.

According to some embodiments, the first subset of photodiodes 106 may be resized with respect to the first subset of isolation structures 114 and the second subset of photodiodes 110 may be resized with respect to the second subset of isolation structures 122. The first subset of isolation structures 114 may be resized to have a larger lateral cross-sectional diameter than the second subset of isolation structures 122. For example, the first subset of isolation structures 114 may be resized to have a lateral cross-sectional diameter that is 3 times larger than the second subset of isolation structures 122. The first subset of isolation structures 114 may be resized to have a lateral cross-sectional diameter that is 2.5 times larger than the second subset of isolation structures 122. The first subset of isolation structures 114 may be resized to have a lateral cross-sectional diameter that is 2 times larger than the second subset of isolation structures 122. The first subset of isolation structures 114 may be resized to have a lateral cross-sectional diameter that is 1.5 times larger than the second subset of isolation structures 122. Other resizing of the lateral cross-sectional diameter of first subset of isolation structures 114 with respect to the second subset of isolation structures 122 is within the scope of the present disclosure.

The first subset of isolation structures 114 may be resized to have at least one of a larger lateral cross-sectional area or a larger lateral cross-sectional shape than the second subset of isolation structures 122. For example, the first subset of isolation structures 114 may be resized to have at least one of a lateral cross-sectional area or a larger lateral cross-sectional shape that is 3 times larger than the second subset of isolation structures 122. The first subset of isolation structures 114 may be resized to have at least one of a lateral cross-sectional area or a larger lateral cross-sectional shape that is 2.5 times larger than the second subset of isolation structures 122. The first subset of isolation structures 114 may be resized to have at least one of a lateral cross-sectional area or a larger lateral cross-sectional shape that is 2 times larger than the second subset of isolation structures 122. The first subset of isolation structures 114 may be resized to have at least one of a lateral cross-sectional area or a larger lateral cross-sectional shape that is 1.5 times larger than the second subset of isolation structures 122. Other resizing of the lateral cross-sectional area or the larger lateral cross-sectional shape of first subset of isolation structures 114 with respect to the second subset of isolation structures 122 is within the scope of the present disclosure.

According to some embodiments, the first subset of isolation structures 114 may be resized with an octagon shape and the second subset of isolation structures 122 may be resized with a diamond shape. In this configuration, the first subset of isolation structures 114 may form an array and the second subset of isolation structures 122 may form an array. According to some embodiments, each of the first subset of isolation structures 114 may be at least one of contiguous with, overlapping, or overlapping a portion of four adjacent second isolation structures (e.g., the second isolation structures 124a-124i) of the second subset of isolation structures 122. According to some embodiments, each of the second subset of isolation structures 122 may be at least one of contiguous with, overlapping, or overlapping a portion of four adjacent first isolation structures (e.g., the first isolation structures 116a-116p) of the first subset of isolation structures 114. Other structures and/or configurations of the first subset of isolation structures 114 with respect to the second subset of isolation structures 122 are within the scope of the present disclosure.

Figure 2:
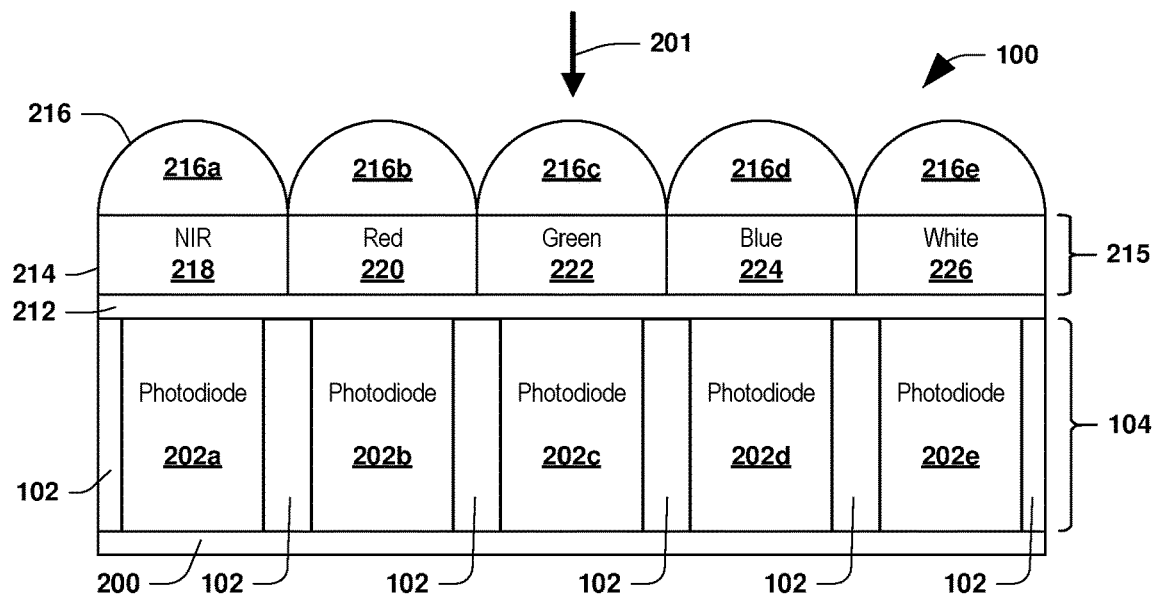
FIG. 2 illustrates a semiconductor arrangement including a photodiode array, according to some embodiments.

FIG. 2 illustrates the semiconductor arrangement 100 including the photodiode array 104, according to some embodiments. The photodiode array 104 comprises a substrate 200 and photodiodes 202a-202e over the substrate 200. The photodiode array 104 is configured to sense radiation, such as incident light, which is projected towards the substrate 200 along a direction of projected radiation 201. The photodiodes (e.g. the photodiodes 202a-202e) of the photodiode array 104 are separated by the isolation structure arrangement 102. An ARC layer 212 (i.e., an antireflective coating layer) is arranged over the photodiodes 202a-202e and over the substrate 200. A radiation filter layer 214 is arranged over the ARC layer 212, over the photodiodes 202a-202e, and over the substrate 200. The radiation filter layer 214 comprises a plurality of radiation pass filters 215, each configured to allow a radiation pass range of wavelengths to pass through and be detected by the corresponding photodiode. The plurality of radiation pass filters 215 comprises an NIR pass filter 218 and a plurality of color pass filters. The plurality of color pass filters comprises a red pass filter 220, a green pass filter 222, a blue pass filter 224, and a white pass filter 226. The NIR pass filter 218 is configured to allow an NIR range of wavelengths to pass through and be detected by the photodiode 202a. The color pass filters are configured to allow a color range of wavelengths to pass through and be detected by a corresponding photodiode. The red pass filter 220 is configured to allow a red range of wavelengths to pass through and be detected by the photodiode 202b. The green pass filter 222 is configured to allow a green range of wavelengths to pass through and be detected by the photodiode 202c. The blue pass filter 224 is configured to allow a blue range of wavelengths to pass through and be detected by the photodiode 202d. The white pass filter 226 is configured to allow a white range of wavelengths to pass through and be detected by the photodiode 202e. Other arrangements and/or configurations of the radiation filter layer 214 or the plurality of the radiation pass filters 215 are within the scope of the present disclosure.

A micro-lens array 216 is arranged over the ARC layer 212 and the radiation filter layer 214, according to some embodiments. The micro-lens array 216 is arranged to steer radiation towards the photodiode array 104. The micro-lens array 216 includes a plurality of micro-lenses (e.g. micro-lenses 216a-216e) configured to transmit radiation to a corresponding photodiode (e.g., the photodiodes 202a-202e) of the photodiode array 104. A micro-lens 216a is configured to transmit radiation through the NIR pass filter 218 to the photodiode 202a. A micro-lens 216b is configured to transmit radiation through the red pass filter 220 to the photodiode 202b. A micro-lens 216c is configured to transmit radiation through the green pass filter 222 to the photodiode 202c. A micro-lens 216d is configured to transmit radiation through the blue pass filter 224 to the photodiode 202d. A micro-lens 216d is configured to transmit radiation through the white pass filter 226 to the photodiode 202e. Other arrangements and/or configurations of the micro-lens array 216 are within the scope of the present disclosure.

Figure 3:
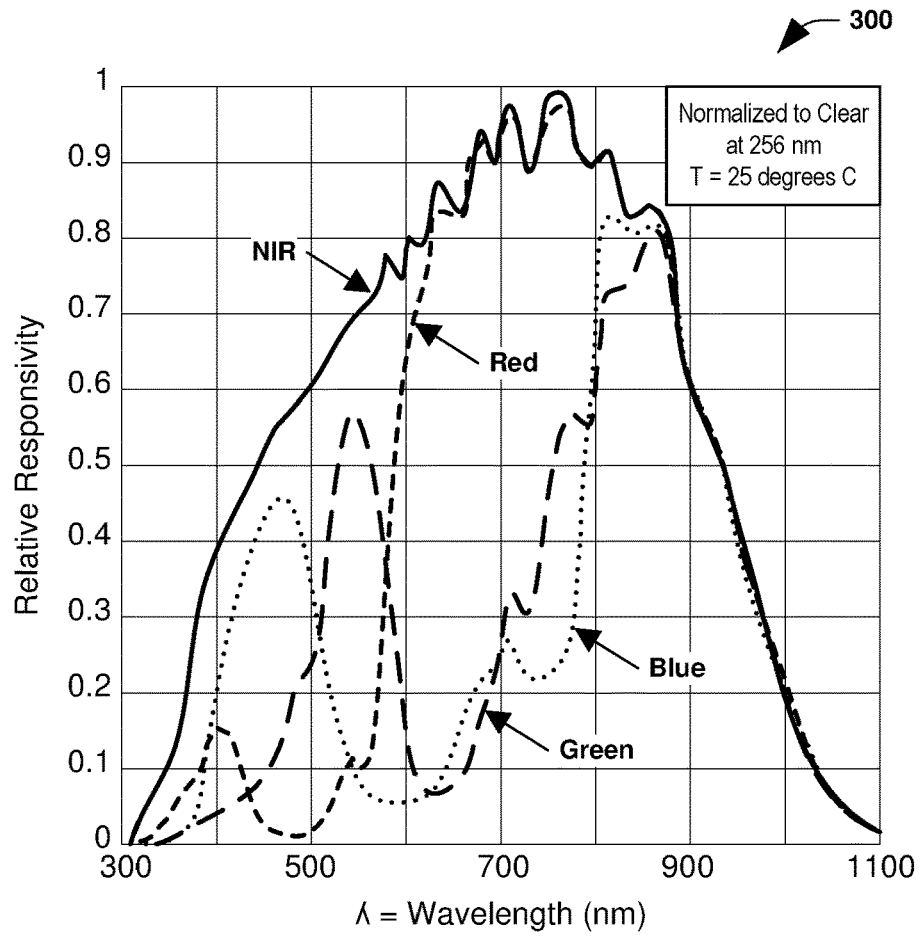
FIG. 3 illustrates a graph of relative responsivity of a photodiode array with respect to wavelengths of detected radiation, according to some embodiments.

FIG. 3 illustrates a graph 300 of relative responsivity of the photodiode array 104 with respect to wavelengths of detected radiation, according to some embodiments. Relative responsivity, also known as spectral responsivity, may be expressed as a ratio of generated photocurrent to incident radiation power, expressed in Amps (A)/Watts (W). Relative responsivity may also be known as wavelength-dependence, and may be expressed as quantum efficiency or a ratio of a number of photo-generated carriers to incident photons, which is a dimensionless quantity. Graph 300 is normalized to clear at a wavelength of 256 nanometers (nm) and a temperature (T) of 25 degrees Celsius (° C.). According to some embodiments, optical radiation, also known as visible radiation, may be narrowly set forth from about 420 nm to about 680 nm and may be broadly set forth from about 380 nm to about 800 nm. White radiation is generally a combination of all optical radiation. According to some embodiments, optical radiation comprises red radiation (e.g., generally a red range of wavelengths from about 620 nm to about 700 nm), green radiation (e.g., generally a green range of wavelengths from about 492 nm to about 577 nm), blue radiation (e.g., generally a blue range of wavelengths from about 455 nm to about 492 nm), and white radiation (e.g., generally a white range of wavelengths from about 380 nm to about 800 nm). According to some embodiments, NIR radiation may be set forth as an NIR range of wavelengths from about 750 nm to about 1400 nm or may be set forth as an NIR range of wavelengths from about 780 nm to about 2500 nm.

Graph 300 illustrates a relative responsivity of blue radiation over 0.4 for wavelengths between about 450 nm to about 500 nm and wavelengths between about 780 nm to about 950 nm. A relative responsivity of green radiation over 0.4 is provided for wavelengths between about 750 nm to about 950 nm. A relative responsivity of red radiation over 0.4 is provided for wavelengths between about 550 nm to about 950 nm. A relative responsivity of NIR radiation over 0.4 is provided for NIR wavelengths between about 400 nm to about 950 nm. Accordingly, with detection of NIR wavelengths in addition to detection of optical wavelengths, the photodiode array 104 may detect a greater number of photo-generated carriers in response to incident photons than detection of optical wavelengths alone. The detected NIR radiation may be at least one of translated into a digital image for display or used to enhance a detected optical image.

Figure 4A:
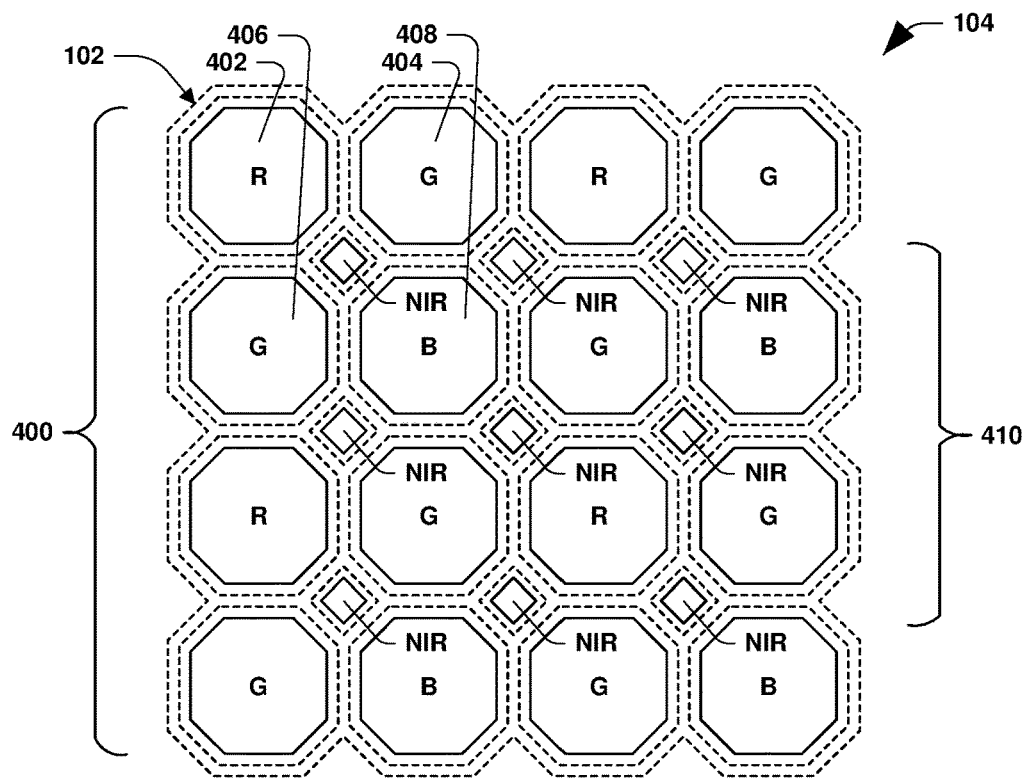
FIGS. 4A-4D illustrate a photodiode array, according to some embodiments.

FIGS. 4A-4D illustrate photodiode array 104, according to some embodiments. FIG. 4A illustrates a first subset of photodiodes 400 comprising a plurality of color photodiodes and a second subset of photodiodes 410 comprising a plurality of NIR photodiodes. According to some embodiments, the first subset of photodiodes 400 has a color filter pattern according to a Bayer filter pattern of RGB. The first subset of photodiodes 400 comprises a red photodiode 402 configured to detect the red range of wavelengths, green photodiodes 404 and 406 configured to detect the green range of wavelengths, and a blue photodiode 408 configured to detect the blue range of wavelengths. According to some embodiments, the red photodiode 402 corresponds to the photodiode 202b that is configured to receive the red range of wavelengths from the red pass filter 220, the green photodiodes 404 and 406 correspond to the photodiode 202c that is configured to receive the green range of wavelengths from the green pass filter 222, and the blue photodiode 408 corresponds to the photodiode 202d that is configured to receive the blue range of wavelengths from the blue pass filter 224. Together, the red photodiode 402, the green photodiodes 404 and 406, and the blue photodiode 408 form a 2×2 color unit cell of two green filters in the diagonal positions and blue and red filters in the off-diagonal positions. According to some embodiments, the red photodiode 402, the green photodiodes 404 and 406, and the blue photodiode 408 are formed in an array that repeats through the first subset of photodiodes 400. According to some embodiments, each NIR photodiode of the second subset of photodiodes 410 corresponds to the photodiode 202a that is configured to detect and receive the NIR range of wavelengths from the NIR pass filter 218. According to some embodiments, each NIR photodiode of the second subset of photodiodes 410 is formed in an array that repeats through the second subset of photodiodes 410. Other arrangements and/or configurations of the first subset of photodiodes 400 and the second subset of photodiodes 410 are within the scope of the present disclosure.

Figure 4B:
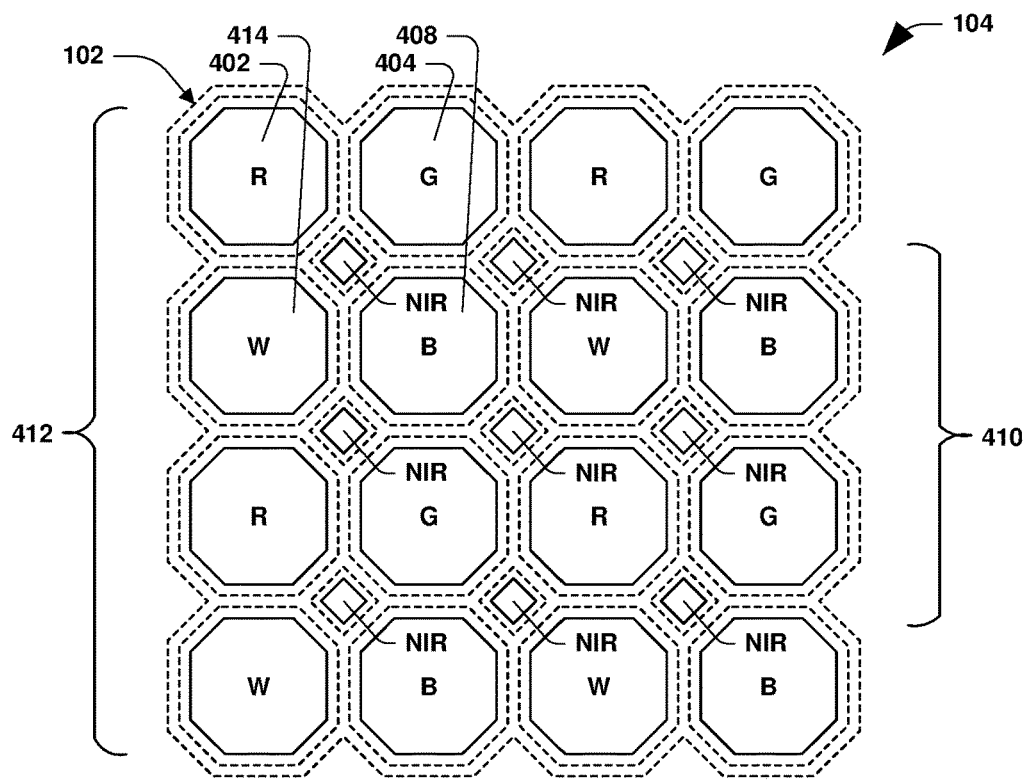

FIG. 4B illustrates a first subset of photodiodes 412 comprising a plurality of color photodiodes and the second subset of photodiodes 410 comprising the plurality of NIR photodiodes. According to some embodiments, the first subset of photodiodes 412 has a color filter pattern according to a Bayer filter pattern of RGBW. The first subset of photodiodes 412 comprises the red photodiode 402 configured to detect the red range of wavelengths, the green photodiode 404 configured to detect the green range of wavelengths, the blue photodiode 408 configured to detect the blue range of wavelengths, and a white photodiode 414 configured to detect the white range of wavelengths. According to some embodiments, the white photodiode 414 corresponds to the photodiode 202e that is configured to receive the white range of wavelengths from the white pass filter 226. According to some embodiments, the red photodiode 402, the green photodiode 404, the blue photodiode 408, and the white photodiode 414 are formed in an array that repeats through the first subset of photodiodes 400. Other arrangements and/or configurations of the first subset of photodiodes 412 and the second subset of photodiodes 410 are within the scope of the present disclosure.

Figure 4C:
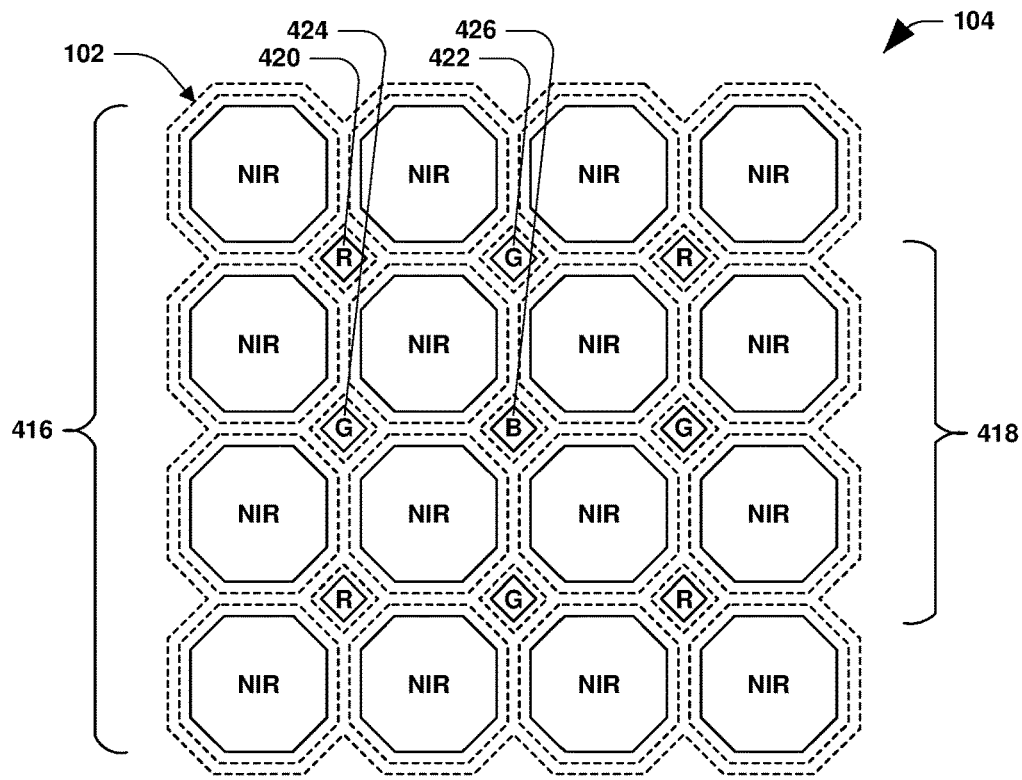

FIG. 4C illustrates a first subset of photodiodes 416 comprising a plurality of NIR photodiodes and a second subset of photodiodes 418 comprising a plurality of color photodiodes. According to some embodiments, each NIR photodiode of the first subset of photodiodes 416 corresponds to the photodiode 202a that is configured to detect and receive the NIR range of wavelengths from the NIR pass filter 218. According to some embodiments, each NIR photodiode of the first subset of photodiodes 416 is formed in an array that repeats through the first subset of photodiodes 416. According to some embodiments, the second subset of photodiodes 418 comprises a color filter pattern according to the Bayer filter pattern of RGB. The second subset of photodiodes 418 comprises a red photodiode 420 configured to detect the red range of wavelengths, green photodiodes 422 and 424 configured to detect the green range of wavelengths, and a blue photodiode 426 configured to detect the blue range of wavelengths. According to some embodiments, the red photodiode 420 corresponds to the photodiode 202b that is configured to receive the red range of wavelengths from the red pass filter 220, the green photodiodes 422 and 424 correspond to the photodiode 202c that is configured to receive the green range of wavelengths from the green pass filter 222, and the blue photodiode 426 corresponds to the photodiode 202d that is configured to receive the blue range of wavelengths from the blue pass filter 224. Together, the red photodiode 420, the green photodiodes 422 and 424, and the blue photodiode 426 form a 2×2 color unit cell of two green filters in the diagonal positions and blue and red filters in the off-diagonal positions. According to some embodiments, the red photodiode 420, the green photodiodes 422 and 424, and the blue photodiode 426 are formed in an array that repeats through the second subset of photodiodes 418. Other arrangements and/or configurations of the first subset of photodiodes 416 and the second subset of photodiodes 418 are within the scope of the present disclosure.

Figure 4D:
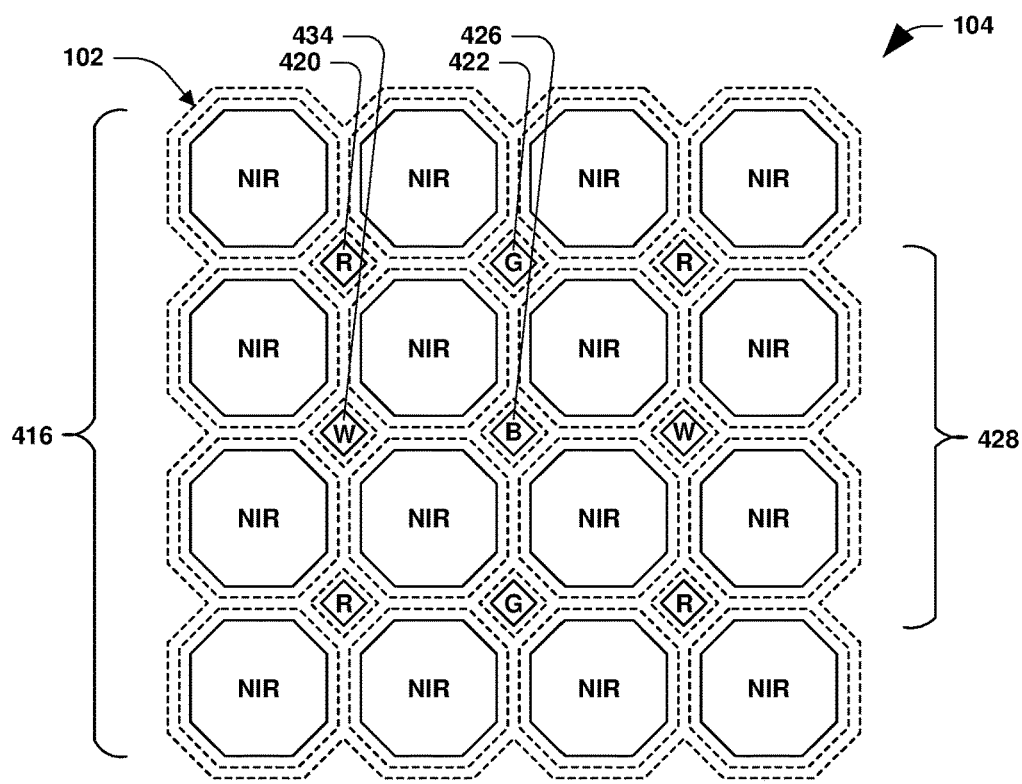

FIG. 4D illustrates the first subset of photodiodes 416 comprising the plurality of NIR photodiodes and a second subset of photodiodes 428 comprising a plurality of color photodiodes. According to some embodiments, the second subset of photodiodes 428 comprises a color filter pattern according to the Bayer filter pattern of RGBW. The second subset of photodiodes 428 comprises the red photodiode 420 configured to detect the red range of wavelengths, the green photodiode 422 configured to detect the green range of wavelengths, the blue photodiode 426 configured to detect the blue range of wavelengths, and a white photodiode 434 configured to detect the white range of wavelengths. According to some embodiments, the white photodiode 434 corresponds to the photodiode 202e that is configured to receive the white range of wavelengths from the white pass filter 226. According to some embodiments, the red photodiode 420, the green photodiode 422, the blue photodiode 426, and the white photodiode 434 are formed in an array that repeats through the second subset of photodiodes 428. Other arrangements and/or configurations of the first subset of photodiodes 416 and the second subset of photodiodes 428 are within the scope of the present disclosure.

Figure 5A:
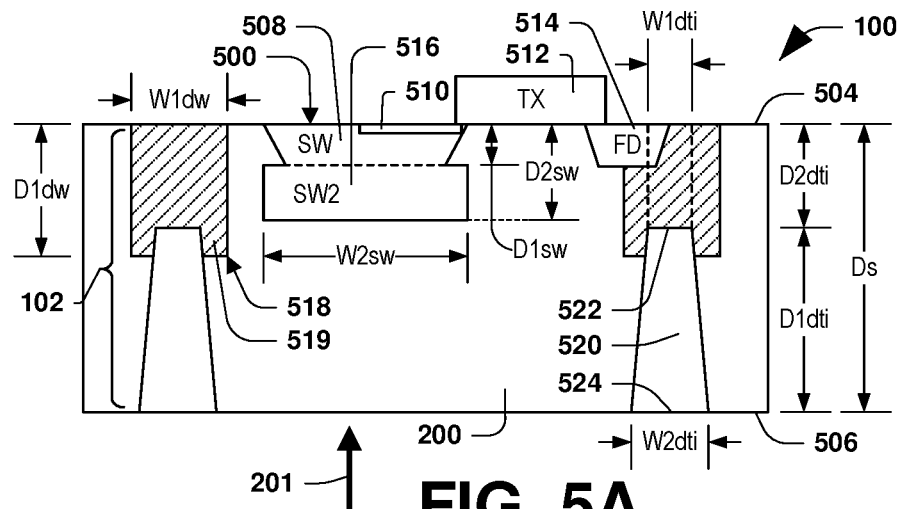
FIGS. 5A-5E schematically illustrate a semiconductor arrangement including a photodiode and an isolation structure arrangement, according to some embodiments.

FIGS. 5A-5E schematically illustrate the semiconductor arrangement 100 including a photodiode 500 and the isolation structure arrangement 102, according to some embodiments. FIG. 5A illustrates the photodiode 500 formed over the substrate 200. The substrate 200 comprises a first side 504 and a second side 506 opposite to the first side 504. The substrate 200 has a substrate depth Ds. The semiconductor arrangement 100 is illustrated as inverted compared to the example illustrated in FIG. 3, such that the direction of projected radiation 201 is projected towards the second side 506 of the substrate 200. The photodiode 500 comprises a charge storage well 508, a pinning layer 510, a transfer gate 512, and a floating diffusion 514. The charge storage well 508 is arranged between the substrate 200 and the pinning layer 510.

According to some embodiments, the charge storage well 508 may extend from the first side 504 of the substrate 200 into the substrate 200 by a storage well depth D1$sw$. The pinning layer 510 may be over twenty times thinner than the charge storage well 508. For example, in a 180 nm process, the pinning layer 510 may be about 100 nm thick, while the charge storage well 508 may be about 2,500-nm thick. According to some embodiments, the storage well depth D1$sw$ of the charge storage well 508 may be considered the depth of photodiode 500 when compared to other components of semiconductor arrangement 100. The charge storage well 508 comprises a first deep storage well section 516. The first deep storage well section 516 is contiguous with and forms a part of charge storage well 508. According to an example, when the first deep storage well section 516 forms a part of charge storage well 508, the first deep storage well section 516 may extend into the first side 504 of the substrate 200 by a deep storage well depth D2$sw$. The first deep storage well section 516 has a deep storage well width W2$sw$. According to some embodiments, the deep storage well depth D2$sw$ of the charge storage well 508 may be considered the depth of photodiode 500 when compared to other components of semiconductor arrangement 100.

According to some embodiments, the isolation structure arrangement 102 comprises an isolation structure 518 and a deep trench isolation 520. The isolation structure 518 laterally surrounds the photodiode 500. The isolation structure 518 comprises a first well 519, which is also known as a deep well. The first well 519 extends into the first side 504 of the substrate 200 by a deep well depth D1$dw$ and has a deep well width W1$dw$. According to some embodiments, the deep well depth D1$dw$ is a maximum deep well depth and the deep well width W1$dw$ is a maximum deep well width. According to some embodiments, the deep well depth D1$dw$ of the first well 519 is greater than the storage well depth D1$sw$ of the charge storage well 508 of the photodiode 500. According to some embodiments, the deep well depth D1$dw$ of the first well 519 is greater than the deep storage well depth D2$sw$ of the first deep storage well section 516 of the photodiode 500. Other arrangements and/or configurations of the deep well depth D1$dw$ and the deep well width W1$dw$ are within the scope of the present disclosure.

The deep trench isolation 520 surrounds the photodiode 500 and has a first side 522 and a second side 524. The deep trench isolation 520 extends into the substrate 200 from the second side 506 of the substrate 200 by a deep trench isolation depth D1$dti$. The deep trench isolation 520 extends into the substrate 200 from the second side 506 of the substrate 200 by a deep trench isolation depth D2$dti$ measured from the first side 504 of the substrate 200. Hence, when measured from the first side 504 of the substrate 200, the deep trench isolation 520 extends into the substrate 200 from the deep trench isolation depth D2$dti$ to the deep trench isolation depth D1$dti$. According to some embodiments, the second side 524 of the deep trench isolation 520 is the same as the second side 506 of the substrate 200. According to some embodiments, the second side 524 of the deep trench isolation 520 is not the same as the second side 506 of the substrate 200. For example, when measured from the first side 504 of the substrate 200, the second side 524 of the deep trench isolation 520 may be less than the second side 506 of the substrate 200. In other words, D2$dti$+D1$dti$<Ds. The deep trench isolation 520 extends from the first side 504 of the substrate 200 from deep trench isolation depth D2$dti$ to deep trench isolation depth D1$dti$. According to some embodiments, the deep trench isolation 520 is not tapered. According to some embodiments, the deep trench isolation 520 is tapered. For example, the deep trench isolation 520 may be tapered from a minimum width W1$dti$ to a maximum width W2$dti$ in a direction opposite to the direction of projected radiation 201. According to some embodiments and with respect to the first side 504 of the substrate 200, a portion of the deep trench isolation 520 underlies the first well 519. According to some embodiments and with respect to the first side 504 of the substrate 200, the deep trench isolation 520 completely underlies the first well 519. Other arrangements and/or configurations of the first well 519 and the deep trench isolation 520 are within the scope of the present disclosure.

According to some embodiments, the first well 519 laterally surrounds the photodiode 500 and at least a portion of the first well 519 laterally surrounds the deep trench isolation 520. A portion of the first well 519 laterally surrounds the deep trench isolation 520 such that an outer periphery of the portion of the first well 519 laterally surrounds an outer periphery of a portion of the deep trench isolation 520. According to some embodiments, the first well 519 overlaps a portion of the deep trench isolation 520. With respect to the first side 504 of the substrate 200, the deep trench isolation depth D2$dti$ of the deep trench isolation 520 is less than the deep well depth D1$dw$ of the first well 519. According to some embodiments, the deep trench isolation 520 has a maximum width W2$dti$ and the isolation structure 518 has a maximum width of the deep well width W1$dw$, and the maximum width W2$dti$ is less than the deep well width W1$dw$. Other arrangements and/or configurations of the first well 519 and the deep trench isolation 520 are within the scope of the present disclosure.

In some embodiments, the deep trench isolation depth D1$dti$ of the deep trench isolation 520 is formed with dimensions compared to the substrate depth Ds of the substrate 200. According to an example, a greater deep trench isolation depth D1$dti$ may provide at least one of greater electrical isolation or greater optical isolation of photodiode 500. According to an example, the deep trench isolation depth D1$dti$ may be limited by vertical overlap in the direction of projected radiation 201 with a portion of photodiode 500, such as floating diffusion 514. The deep trench isolation depth D1$dti$ may provide increased isolation of photodiode 500, depending upon a deep storage well depth D2$sw$ of a first deep storage well section 516 of the photodiode 500. According to an example, the deep storage well depth D2$sw$ may correspond to the substrate depth Ds of the substrate 200 and is described in greater detail below. In some embodiments, the deep trench isolation depth D1$dti$ is between about 45% and 80% of the substrate depth Ds of the substrate 200. In some embodiments, the deep trench isolation depth D1$dti$ is between about 50% and 75% of the substrate depth Ds of the substrate 200. In some embodiments, the deep trench isolation depth D1$dti$ is between about 60% and 70% of the substrate depth Ds of the substrate 200. In some embodiments, the deep storage well width W2$sw$ of the photodiode 500 is between 40% and 45% of the substrate depth Ds of substrate 200. In some embodiments, the deep storage well width W2$sw$ of the photodiode 500 is between 35% and 40% of the substrate depth Ds of substrate 200. Other arrangements and/or configurations of deep trench isolation 520 are within the scope of the present disclosure.

In some embodiments, the deep storage well width W2$sw$ of the photodiode 500 may be between about 2.0 micrometers (μm) and 2.5 μm, with a deep well width W1$dw$ of the first well 519 being between about 0.19 μm and 0.41 μm and a maximum width W2$dti$ of the deep trench isolation 520 being less than the deep well width W1$dw$. In some embodiments, the deep storage well width W2$sw$ of the photodiode 500 may be between about 2.1 μm and 2.4 μm, with a deep well width W1$dw$ of the first well 519 being between about 0.33 μm and 0.41 μm and a maximum width W2$dti$ of deep trench isolation 520 being less than deep well width W1$dw$. In some embodiments, the deep storage well width W2$sw$ of the photodiode may be between about 2.2 μm and 2.3 μm, with a deep well width W1$dw$ of the first well 519 being between about 0.35 μm and 0.39 μm and a maximum width W2$dti$ of the deep trench isolation 520 being less than the deep well width W1$dw$. Other arrangements and/or configurations of photodiode 500 and deep trench isolation 520 are within the scope of the present disclosure.

Figure 5B:
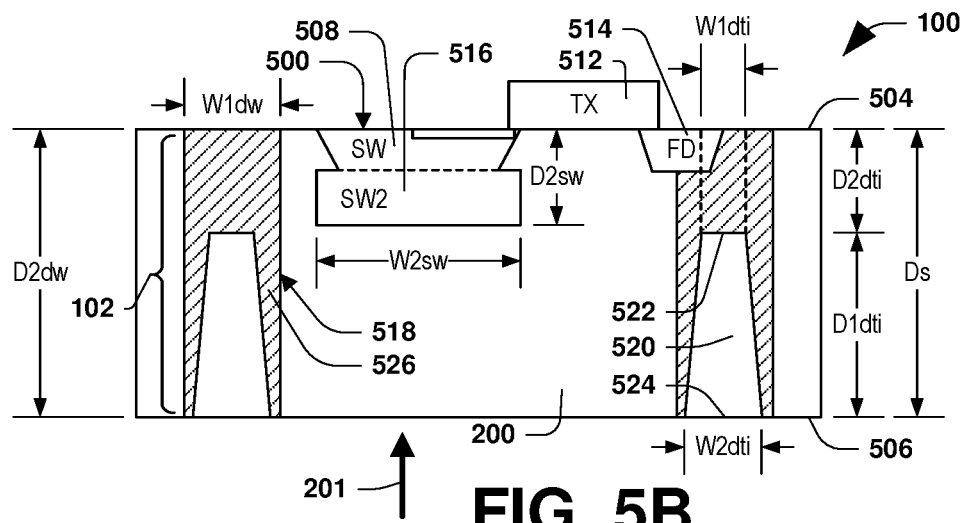

FIG. 5B illustrates the photodiode 500 formed over the substrate 200, according to some embodiments. The isolation structure 518 laterally surrounds the photodiode 500. The isolation structure 518 comprises a first well 526, which is also known as a deep well. The first well 526 extends into the first side 504 of the substrate 200 by a deep well depth D2$dw$ and has a deep well width W1$dw$. According to some embodiments, the deep well depth D2$dw$ is a maximum deep well depth and the deep well width W1$dw$ is a maximum deep well width. According to some embodiments, the deep well depth D2$dw$ of the first well 526 is greater than the deep storage well depth D2$sw$ of the first deep storage well section 516 of the photodiode 500. According to some embodiments, the deep well depth D2$dw$ of the first well 526 extends from the first side 504 of the substrate 200 to the second side 506 of the substrate 200. According to some embodiments, the deep well depth D2$dw$ of the first well 526 extends from the first side 504 of the substrate 200 to a depth greater than a depth of the deep trench isolation 520 measured from the first side 504 of the substrate 200. In other words, D2$dw$>D2$dti$+D1$dti$. According to some embodiments, the deep well width W1$dw$ of the first well 526 is greater than a minimum width W1$dti$ of deep trench isolation 520. According to some embodiments, the deep well width W1$dw$ of the first well 526 is greater than a maximum width W2$dti$ of the deep trench isolation 520. According to some embodiments, the first well 526 completely surrounds the deep trench isolation 520. Other arrangements and/or configurations of the first well 526 and the deep trench isolation 520 are within the scope of the present disclosure.

Figure 5C:
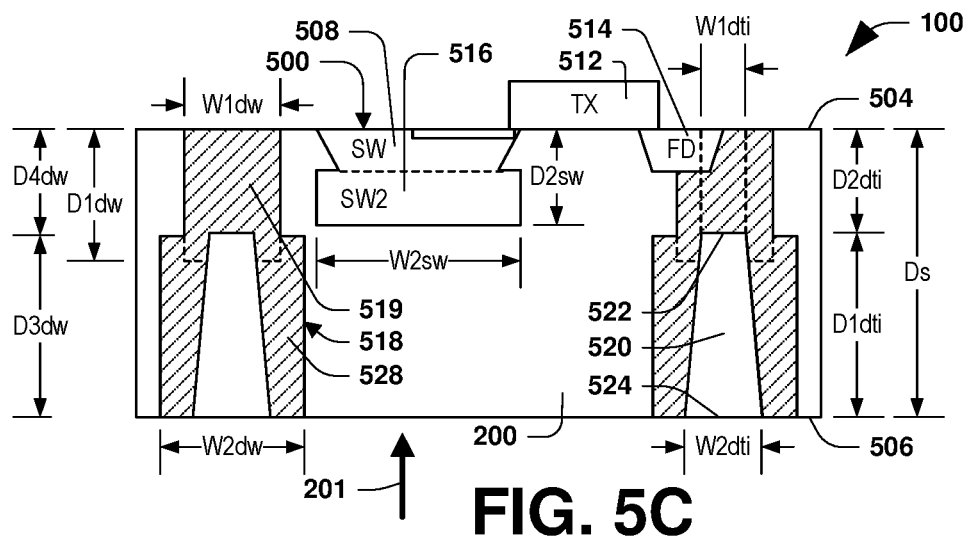

FIG. 5C illustrates the photodiode 500 formed over the substrate 200, according to some embodiments. The isolation structure 518 laterally surrounds the photodiode 500 and comprises the first well 519 and a second well 528, which is also known as a deep well. The second well 528 extends into the substrate 200 from the second side 506 of the substrate 200 by a deep well depth D3$dw$ and has a deep well width W2$dw$. As measured from the first side 504 of the substrate 200, the second well 528 extends from a deep well depth D4$dw$ to the deep well depth D3$dw$. In this case, isolation structure 518 has a total depth from the first side 504 of the substrate 200 of D4$dw$+D3$dw$. According to some embodiments, the first well 519 overlaps the second well 528. According to some embodiments, the first well 519 and the second well 528 are contiguous and formed with the same dopant type. According to some embodiments, a combination of the first well 519 and the second well 528 completely surrounds the deep trench isolation 520. According to some embodiments, a combination of the first well 519 and the second well 528 extends from the first side 504 of the substrate 200 to the second side 506 of the substrate 200. According to some embodiments, when measured from the first side 504 of the substrate 200, the deep well depth D4$dw$ is greater than the deep storage well depth D2$sw$ of the first deep storage well section 516 of the photodiode 500. The deep well width W1$dw$ of the first well 519 is less than the deep well width W2$dw$ of the second well 528 and completely surrounds the deep trench isolation 520. Because the deep well width W1$dw$ of the first well 519 is less than the deep well width W2$dw$ of the second well 528, the photodiode 500 may be configured with a greater area. Other arrangements and/or configurations of the first well 519, the second well 528, and the deep trench isolation 520 are within the scope of the present disclosure.

Figure 5D:
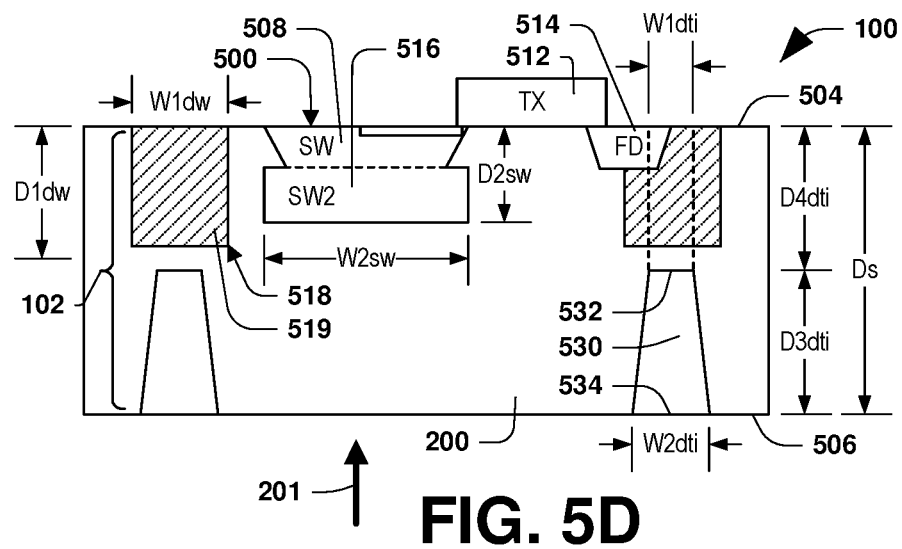

FIG. 5D illustrates the photodiode 500 formed over the substrate 200, according to some embodiments. The isolation structure 518 laterally surrounds the photodiode 500 and comprises the first well 519. A deep trench isolation 530 surrounds the photodiode 500 and has a first side 532 and a second side 534. The deep trench isolation 530 extends into the substrate 200 from the second side 506 of the substrate 200 by a deep trench isolation depth D3$dti$. The deep trench isolation 530 extends into the substrate 200 from the second side 506 of the substrate 200 by a deep trench isolation depth D4$dti$ measured from the first side 504 of the substrate 200. Hence, when measured from the first side 504 of the substrate 200, the deep trench isolation 530 extends into the substrate 200 from the deep trench isolation depth D4$dti$ to the deep trench isolation depth D3$dti$. The isolation structure 518 and the first well 519 do not overlap the deep trench isolation 530. The deep well width W1$dw$ of the first well 519 is greater than a maximum width W2$dti$ of the deep trench isolation 530. Other arrangements and/or configurations of the isolation structure 518 and the deep trench isolation 530 are within the scope of the present disclosure.

Figure 5E:
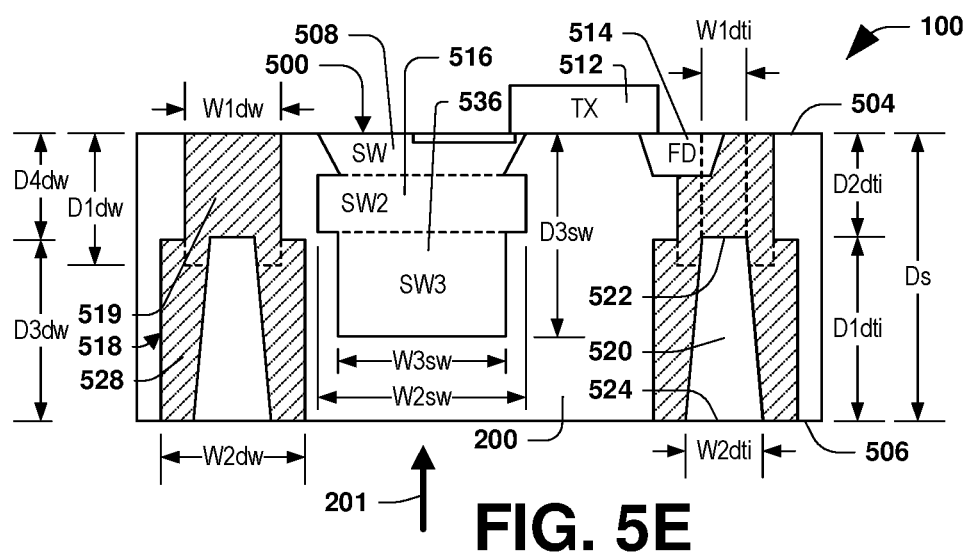

FIG. 5E illustrates the photodiode 500 formed over the substrate 200, according to some embodiments. The isolation structure 518 laterally surrounds the photodiode 500 and comprises the first well 519 and the second well 528. The second well 528 extends into the substrate 200 from the second side 506 of the substrate 200 by the deep well depth D3$dw$ and has the deep well width W2$dw$. As measured from the first side 504 of the substrate 200, the second well 528 extends from the deep well depth D4*dw* to the deep well depth D3*dw*. In this case, the isolation structure 518 has a total depth from the first side 504 of the substrate 200 of D4*dw*+D3*dw*. The charge storage well 508 comprises a first deep storage well section 516 and a second deep storage well section 536. The first deep storage well section 516 and second deep storage well section 536 are contiguous with and form a part of charge storage well 508. According to some embodiments, the second deep storage well section 536 extends into the substrate 200 by a deep storage well depth D3*sw* from the first side 504 of the substrate 200.

According to some embodiments, the second deep storage well depth D3*sw* of charge storage well 508 may be considered the depth of the photodiode 500 when compared to other components of the semiconductor arrangement 100. The first deep storage well section 516 has a deep storage well width W2*sw* and the second deep storage well section 536 has a deep storage well width W3*sw*. According to some embodiments, the width W2*sw* of first deep storage well section 516 is wider than the width W3*sw* of second deep storage well section 536. The first deep storage well section 516 is laterally surrounded by the first well 519, and the second deep storage well section 536 is laterally surrounded by the second well 528. When measured from the first side 504 of the substrate 200, the deep storage well depth D3*sw* of the second deep storage well section 536 is greater than the deep trench isolation depth D2*dti* of the deep trench isolation 520.

In some embodiments, the deep storage well width W3*sw* of the photodiode 500 may be configured in relation to a deep well width W2*dw* of the second well 528. A greater deep storage well width W3*sw* may provide a greater amount of material to receive charge carriers for photodiode 500 and a greater deep well width W2*dw* may provide at least one of a greater electrical isolation or a greater optical isolation. The deep storage well width W3*sw* and the deep well width W2*dw* may also limit the density of photodiodes in the photodiode array 104. According to some embodiments, a range of deep storage well widths W3*sw* and a range of deep well widths W2*dw* may provide charge carriers for detection by the photodiode 500 and at least one of an electrical isolation or an optical isolation. According to some embodiments, the deep storage well width W3*sw* of the photodiode 500 may be between about 1.0 µm and 1.4 µm, with a deep well width W2*dw* of the second well 528 being between about 1.0 µm and 1.4 µm and a maximum width W2*dti* of the deep trench isolation 520 being less than deep well width W2*dw*. In some embodiments, the deep storage well width W3*sw* of the photodiode 500 may be between about 1.1 µm and 1.3 µm, with a deep well width W2*dw* of the second well 528 being between about 1.1 µm and 1.3 µm and a maximum width W2*dti* of deep trench isolation 520 being less than deep well width W2*dw*. In some embodiments, the deep storage well width W3*sw* of the photodiode 500 may be between about 1.15 µm and 1.25 µm, with a deep well width W2*dw* of the second well 528 being between about 1.15 µm and 1.25 µm and a maximum width W2*dti* of the deep trench isolation 520 being less than deep well width W2*dw*. Other arrangements and/or configurations of deep trench isolation 520 are within the scope of the present disclosure.

Figure 6:
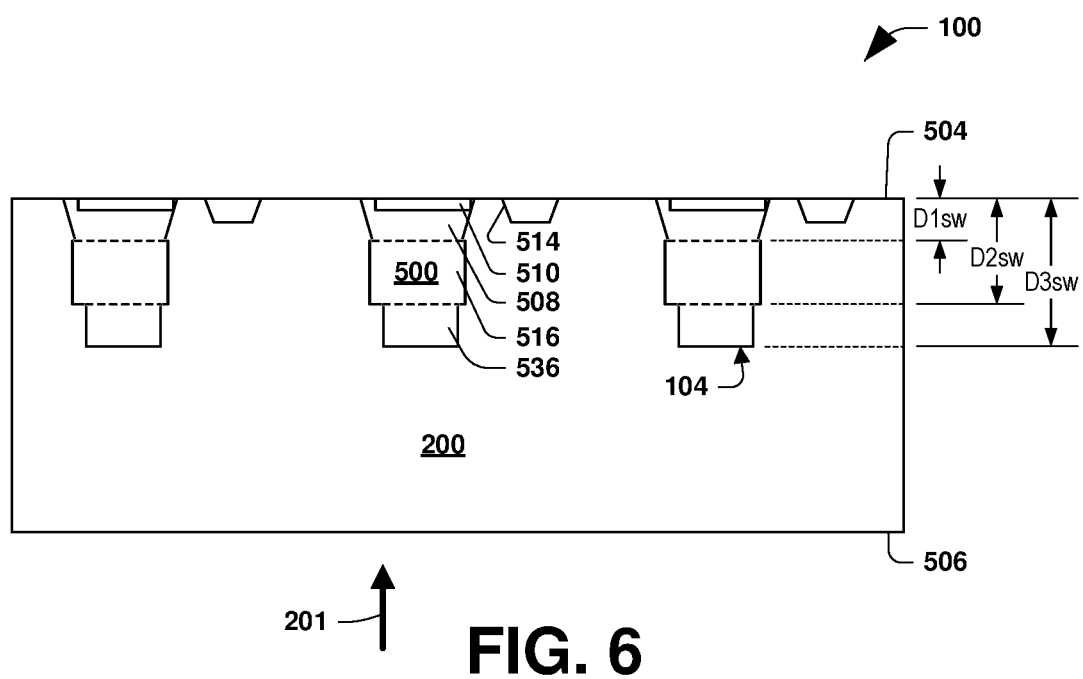
FIGS. 6-34 illustrate a semiconductor arrangement at various stages of fabrication, according to some embodiments.

FIG. 6 illustrates the semiconductor arrangement 100 at a stage of fabrication, according to some embodiments. The semiconductor arrangement 100 comprises the substrate 200. In some embodiments, the substrate 200 corresponds to a device wafer of the semiconductor arrangement 100. The first side 504 of the substrate 200 corresponds to a front side of the substrate 200 and the second side 506 of the substrate 200 corresponds to a back side of the substrate 200. The semiconductor arrangement 100 is configured to sense radiation, such as incident light, which is projected towards the substrate 200 along the direction of projected radiation 201.

The substrate 200 comprises at least one of an epitaxial layer, a silicon-on-insulator (SOI) structure, a wafer, or a die formed from a wafer. The substrate 200 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. The substrate 200 comprises at least one of monocrystalline silicon, crystalline silicon with a <100> crystallographic orientation, crystalline silicon with a <110> crystallographic orientation, crystalline silicon with a <111> crystallographic orientation, or other suitable material. The substrate 200 has at least one doped region. Other structures and/or configurations of the substrate 200 are within the scope of the present disclosure.

In some embodiments, the semiconductor arrangement 100 comprises at least one photodiode of the photodiode array 104 in the substrate 200. In some embodiments, the photodiode 500 corresponds to at least one of the first photodiode 101, the second photodiode 103, the third photodiode 105, or the fourth photodiode 107 of the photodiode array 104. In some embodiments, the photodiode 500 corresponds to at least one photodiode of the first subset of photodiodes 106 (e.g., the first photodiodes 108*a*-108*p*) or the second subset of photodiodes 110 (e.g., the second photodiodes 112*a*-112*i*). The photodiode 500 is formed by at least one of doping, ion implantation, molecular diffusion, or other suitable techniques. In some embodiments, the photodiode 500 comprises at least one of a pinned layer photodiode, a phototransistor, a photogate, or other suitable component. At least some of the photodiodes of the photodiode array 104 can vary from one another to have at least one of different heights, thicknesses, widths, material compositions, etc. The substrate 200 may comprise any number of photodiodes or other components within the scope of the present disclosure.

At least some of the photodiodes of the photodiode array 104 or other components comprise at least one of boron, germanium, indium, phosphorous, $BF_2$, arsenic, antimony, fluorine, InAs, InSb, GaSb, GaAs, InP, a silicide, silicon, doped silicon, or other suitable material. The photodiode array 104 is configured to sense radiation, such as incident light, which is projected towards the substrate 200 along the direction of projected radiation 201. At least some of the photodiodes of the photodiode array 104 comprise a material that is relatively highly absorptive to NIR wavelengths or optical wavelengths. Other structures and/or configurations of the photodiode 500, the photodiode array 104, or other components, are within the scope of the present disclosure.

Photodiode 500 comprises the charge storage well 508, arranged between the substrate 200 and the pinning layer 510, and the floating diffusion 514. According to some embodiments, the photodiode 500 comprises the first deep storage well section 516 and the second deep storage well section 536 are contiguous with and form a part of the charge storage well 508. Other structures and/or configurations of the first deep storage well section 516 and the second deep storage well section 536 are within the scope of the present disclosure.

In some embodiments, the substrate 200 comprises an epitaxial layer. In some embodiments, the substrate 200 comprises a first-type epitaxial layer with a first-type dopant, which is at least one of a p-type or an n-type. A second-type dopant is the other dopant, of the p-type or the n-type, from the first-type dopant. In some embodiments, the charge storage well 508, the floating diffusion 514, the first deep storage well section 516, and the second deep storage well section 536 comprise the second-type dopant. In some embodiments, the floating diffusion 514 comprises the second-type dopant in a higher concentration than the charge storage well 508, the first deep storage well section 516, and the second deep storage well section 536. The substrate 200 is formed with the first-type dopant to form the at least one doped region by at least one of ion implantation, molecular diffusion, or other suitable techniques. A number or an amount of dopants into the substrate 200 is controlled, such as to control a concentration of dopants. In some embodiments, an energy of dopants implanted into the substrate 200 is controlled, such as to control a depth to which dopants are implanted. In some embodiments, a depth of dopants in the substrate 200 is controlled by increasing or decreasing a voltage used to direct the dopants into the substrate 200. In some embodiments, a depth of dopants in the substrate 200 is controlled by increasing or decreasing a time of exposure of dopants to the substrate 200. In some embodiments, a depth of dopants in the substrate 200 is controlled by increasing or decreasing a concentration of dopants exposed to the substrate 200. Other processes and/or procedures for controlling a depth of dopants in the substrate 200 are within the scope of the present disclosure.

In some embodiments, the charge storage well 508 of the photodiode 500 comprises a second type dopant, which is the other type of the substrate 200. The charge storage well 508 forms a p-n junction with the substrate 200. The charge storage well 508 is also known as a buried signal charge storage well. The floating diffusion 514 comprises the second type dopant and has a higher concentration of dopants than charge storage well 508. The floating diffusion 514 forms a p-n junction with the substrate 200. The substrate 200 may comprise a more heavily doped region under floating diffusion 514 to repel photoelectrons so they may be collected by the charge storage well 508. The pinning layer 510 comprises the first-type dopant and has a higher concentration than the substrate 200. Other configurations and/or compositions of the substrate 200 and the photodiode 500 are within the scope of the present disclosure.

Figure 7:
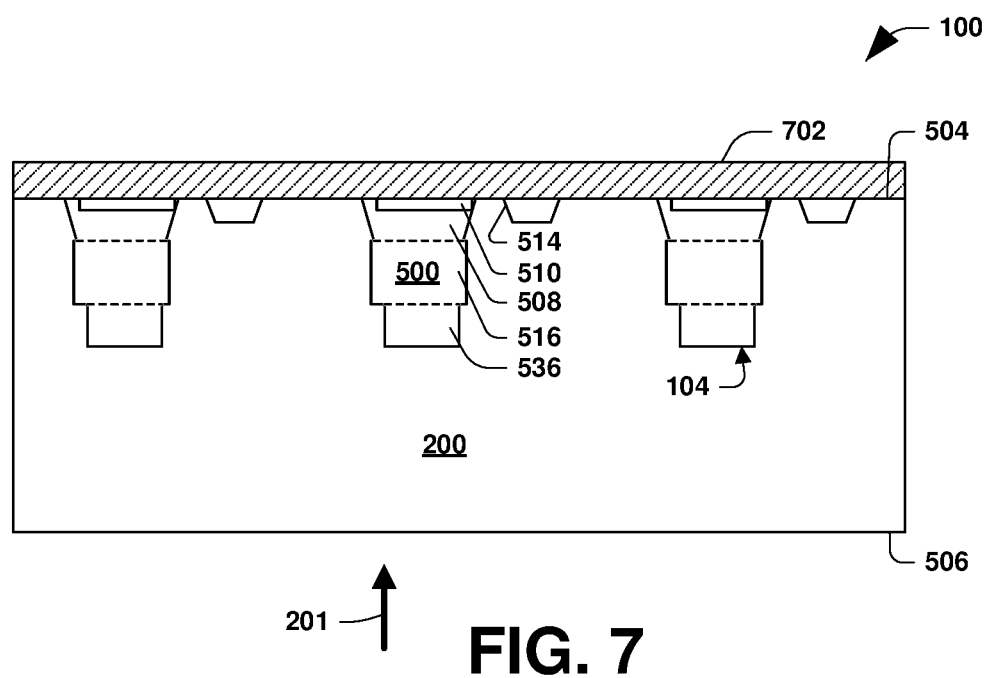

FIG. 7 illustrates the semiconductor arrangement 100 at a stage of fabrication with a first mask layer 702 formed over the substrate 200, according to some embodiments. The first mask layer 702 at least one of overlies the substrate 200, is in direct contact with the substrate 200, or is in indirect contact with the substrate 200. In some embodiments, the first mask layer 702 is a hard mask layer. The first mask layer 702 comprises at least one of an oxide, a nitride, a metal, or other suitable material. The first mask layer 702 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques. Other structures and/or configurations of the first mask layer 702 are within the scope of the present disclosure.

Figure 8:
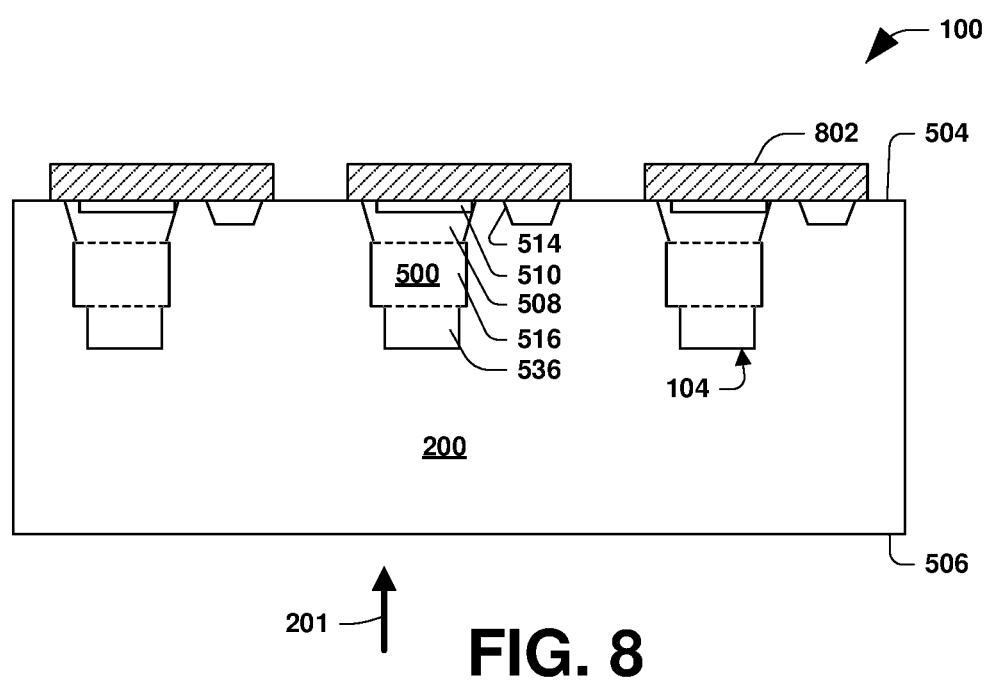

FIG. 8 illustrates the semiconductor arrangement 100 at a stage of fabrication with the first mask layer 702 patterned to form a first patterned mask layer 802 over the substrate 200, according to some embodiments. According to some embodiments, a photoresist (not shown) is used to form the first patterned mask layer 802. The photoresist is formed over the first mask layer 702 by at least one of PVD, sputtering, CVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer.

An etching process used to remove portions of the first mask layer 702 to form the first patterned mask layer 802 is at least one of a dry etching process, a wet etching process, an anisotropic etching process, an isotropic etching process, a plasma etching process, or another suitable etching process. The etching process uses at least one of HF, diluted HF, $HCl_2$, $H_2S$, or other suitable material. In some embodiments, the etching process performed to remove portions of the first mask layer 702 and form the first patterned mask layer 802 also removes at least some of the substrate 200, such as portions of the substrate 200 underlying openings in the first patterned mask layer 802. Other processes and/or techniques for forming the first patterned mask layer 802 are within the scope of the present disclosure.

Figure 9:
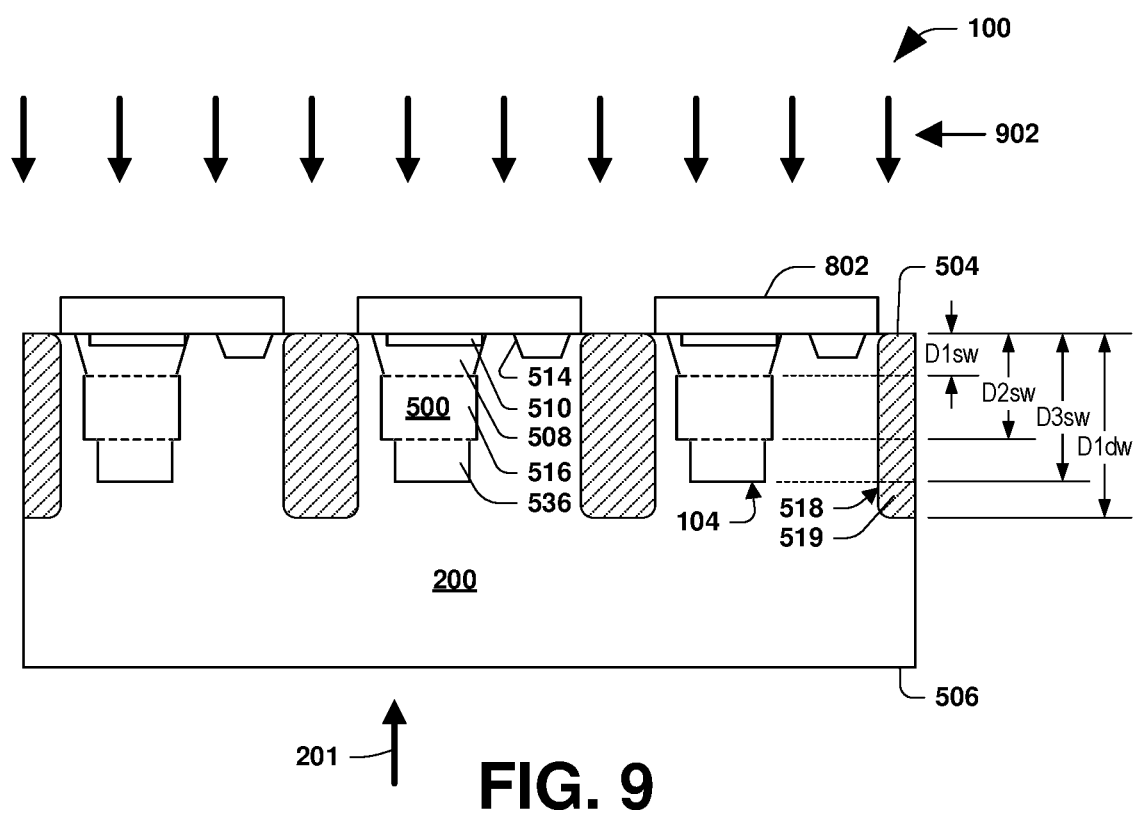

FIG. 9 illustrates the semiconductor arrangement 100 at a stage of fabrication with the isolation structure 518 comprising the first well 519, according to some embodiments. The first well 519 is formed in the substrate 200. In some embodiments, the first well 519 is formed via a deep implantation 902 and comprises the first-type dopant. In some embodiments, the first well 519 comprises the first-type dopant in a higher concentration than the first-type dopant in the substrate 200. In some embodiments, the deep implantation 902 comprises implanting a doping between about $1.5e15$ $cm^{-3}$ to about $1.5e17$ $cm^{-3}$ of a first dopant at an energy of between about 1.5 kiloelectron volts (keV) to about 2.5 keV. In some embodiments, the first dopant comprises at least one of nitrogen, phosphorus, or arsenic. In some embodiments, the first dopant comprises at least one of boron, aluminum, or gallium. In some embodiments, a first dopant of boron provides a junction depth between 2.0 µm and 3.0 µm with a depletion region depth greater than 2.5 µm. In some embodiments, a first dopant of boron provides a junction depth between 2.1 µm and 2.4 µm with a depletion region greater than 2.5 µm. In some embodiments, a depletion region greater than 2.5 µm provides a deep well depth D1$dw$ of the first well 519 greater than a deep storage well depth D2$sw$ of the first deep storage well section 516 of photodiode 500. In some embodiments, the first well 519 provides one of a reduction or an elimination of electrical cross-talk, where an electrical signal is produced from incident radiation that passes between adjacent photodiodes. Other processes and/or techniques for forming the first well 519 are within the scope of the present disclosure.

Figure 10:
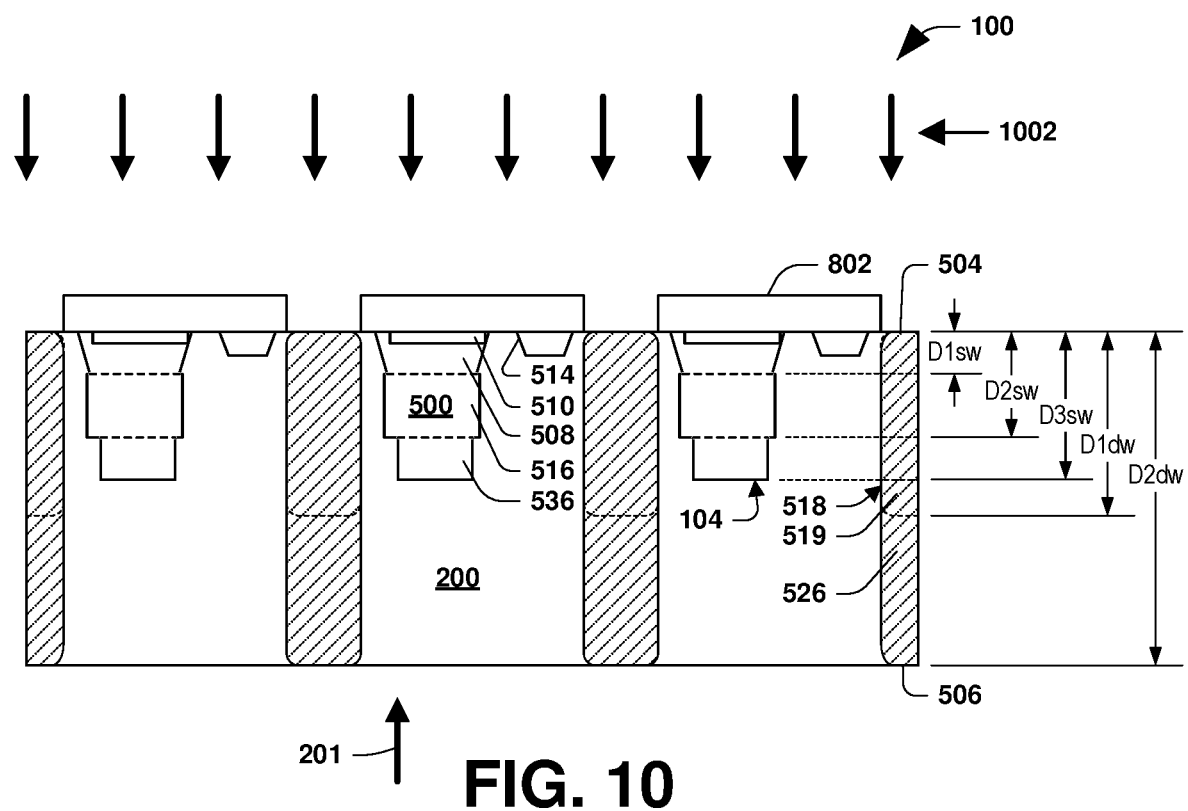

FIG. 10 illustrates the semiconductor arrangement 100 at a stage of fabrication with the isolation structure 518 comprising the first well 526, according to some embodiments. The first well 526 is formed in the substrate 200. The first well 526 is deeper than the first well 519 of FIG. 9 (illustrated herein for reference). In some embodiments, the first well 526 is formed via deep implantation 902 comprising the first-type dopant. In some embodiments, the first well 526 comprises the first-type dopant in a higher concentration than the substrate 200. In some embodiments, the deep implantation 902 comprises implanting a doping between about 1.5e15 cm$^{-3}$ to about 1.5e17 cm$^{-3}$ of a first dopant with a resistivity of about 10 ohm-cm at an energy of between about 3.0 keV to about 5.0 keV. In some embodiments, the first dopant comprises at least one of nitrogen, phosphorus, or arsenic. In some embodiments, the first dopant comprises at least one of boron, aluminum, or gallium. In some embodiments, a first dopant of boron provides a junction depth between 5.0 µm and 6.0 µm with a depletion region between 5.0 µm and 6.0 µm. In some embodiments, a depletion region greater than 5.0 µm provides a deep well depth D1$dw$ of the first well 526 greater than a deep storage well depth D2$sw$ of the first deep storage well section 516 of the photodiode 500. In some embodiments, the deep implantation 902 comprises implanting a doping between about 1.0e14 cm$^{-3}$ with a resistivity of about 100 ohm-cm at an energy of between about 3.0 keV to about 5.0 keV. In some embodiments, a first dopant of boron provides a junction depth greater than 6.0 µm with a depletion region greater than 6.0 µm. In some embodiments, a depletion region greater than 6.0 µm provides a deep well depth D1$dw$ of the first well 526 greater than a deep storage well depth D2$sw$ of the first deep storage well section 516 of the photodiode 500. In some embodiments, the first well 526 provides one of a reduction or an elimination of electrical cross-talk, where an electrical signal is produced from incident radiation that passes between adjacent photodiodes. Other processes and/or techniques for forming the first well 526 are within the scope of the present disclosure.

Figure 11:
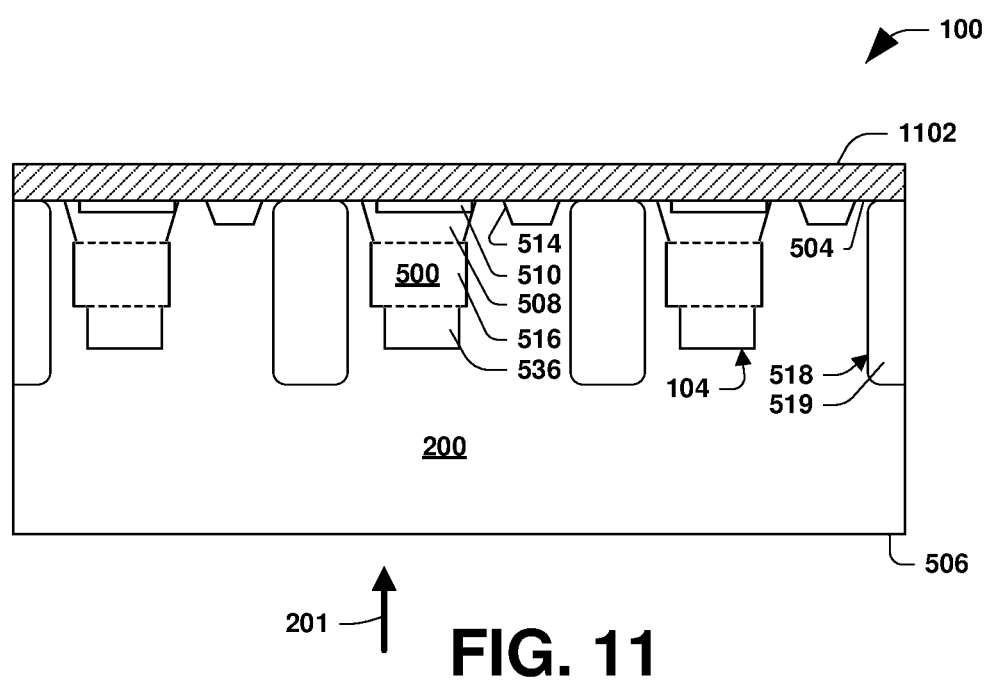

FIG. 11 illustrates the semiconductor arrangement 100 at a stage of fabrication after removal of the first patterned mask layer 802 and illustrated with a second mask layer 1102 formed over the substrate 200, according to some embodiments. The first patterned mask layer 802 is removed after at least one of the first well 519 or the first well 526 is formed. The first patterned mask layer 802 is removed by at least one of wafer back-grinding, chemical-mechanical polishing (CMP), planarization, a dry etching process, a wet etching process (i.e., a liquid etching process), an anisotropic etching process, an isotropic etching process, plasma etching, or other suitable techniques or processes. The etching process uses at least one of HF, diluted HF, HCl$_2$, H$_2$S, or other suitable material. In some embodiments, removal of the first patterned mask layer 802 exposes the first side 504 (e.g., a top surface) of the substrate 200.

The second mask layer 1102 at least one of overlies the substrate 200, is in direct contact with the substrate 200, or is in indirect contact with the substrate 200. An intermediate layer, such as at least one of a protection layer or a dielectric layer may be formed between the second mask layer 1102 and the substrate 200. The second mask layer 1102 is formed by at least one of PVD, sputtering, CVD, LPCVD, ALCVD, UHVCVD, RPCVD, ALD, MBE, LPE, spin on, growth, or other suitable techniques. The second mask layer 1102 may be formed using a process akin to a process used for formation of the first mask layer 702 set forth above with reference to FIG. 7. A photoresist comprising a light-sensitive material, where properties, such as solubility, of the photoresist are affected by light may be used to form the second mask layer 1102. The photoresist may be a negative photoresist or a positive photoresist.

Figure 12:
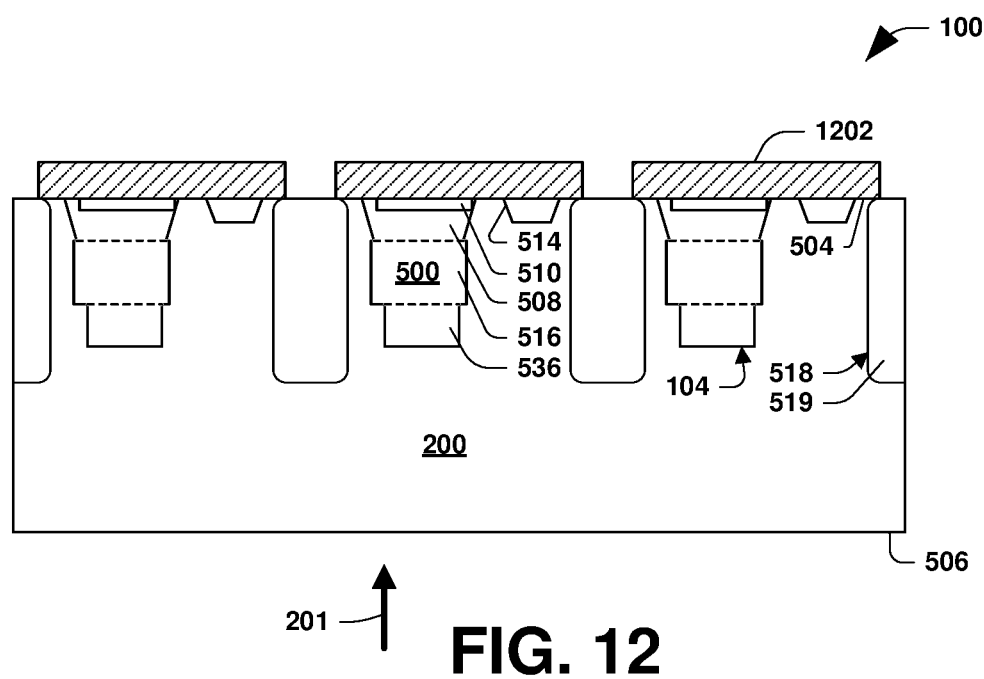

FIG. 12 illustrates the semiconductor arrangement 100 at a stage of fabrication with the second mask layer 1102 patterned to form a second patterned mask layer 1202 over the substrate 200, according to some embodiments. The second patterned mask layer 1202 may be formed using a process akin to a process used for formation of the first patterned mask layer 802 set forth above with reference to FIG. 8. The second patterned mask layer 1202 has openings exposing portions of the substrate 200. In some embodiments, the openings in the second patterned mask layer 1202 are between photodiodes of the photodiode array 104 or other components, such that the openings do not overlie or are laterally offset from the photodiodes or other components. In some embodiments, an opening in the second patterned mask layer 1202 is between two adjacent photodiodes of the photodiode array 104 or other components, such that the opening overlies a portion of the substrate 200 between a first photodiode and a second photodiode of the photodiode array 104. According to some embodiments, an opening in the second patterned mask layer 1202 overlies a portion of a photodiode 500, a portion of a photodiodes of the photodiode array 104, or other component.

Figure 13:
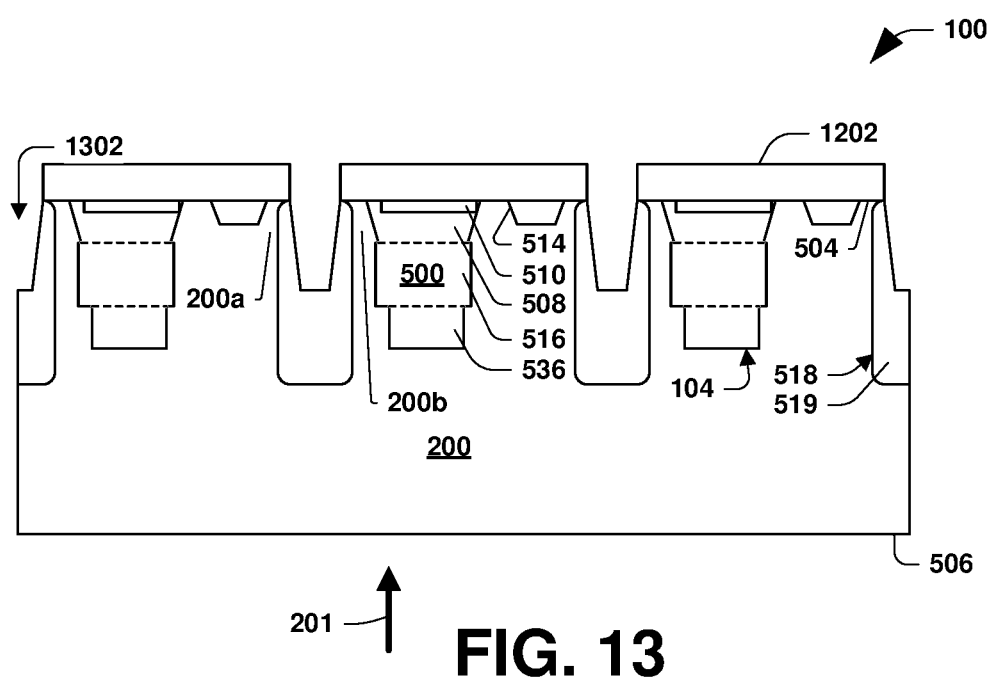

FIG. 13 illustrates the semiconductor arrangement 100 at a stage of fabrication with a shallow trench 1302 formed using the second patterned mask layer 1202, according to some embodiments. The shallow trench 1302 extends through the substrate 200 and into the first wells 519. The shallow trench 1302 is at least one of laterally offset from photodiode 500 or between two photodiodes of the photodiode array 104. In some embodiments, the shallow trench 1302 is between two adjacent photodiodes of the photodiode array 104, a first portion 200*a* of the substrate 200 separates the shallow trench 1302 from a first photodiode of two adjacent photodiodes of the photodiode array 104, and a second portion 200*b* of the substrate 200 separates the shallow trench 1302 from a second photodiode of the two adjacent photodiodes of the photodiode array 104. In some embodiments, an etching process is performed to form the shallow trench 1302, where openings in the second patterned mask layer 1202 allow one or more etchants applied during the etching process to remove portions of the substrate 200 while the second patterned mask layer 1202 protects or shields portions of the substrate 200 that are covered by the second patterned mask layer 1202. The etching process is at least one of a dry etching process, a wet etching process, an anisotropic etching process, an isotropic etching process, or another suitable etching process. The etching process uses at least one of HF, diluted HF, HCl$_2$, H$_2$S, or other suitable material. Other processes and/or techniques for forming the shallow trench 1302 are within the scope of the present disclosure.

Figure 14:
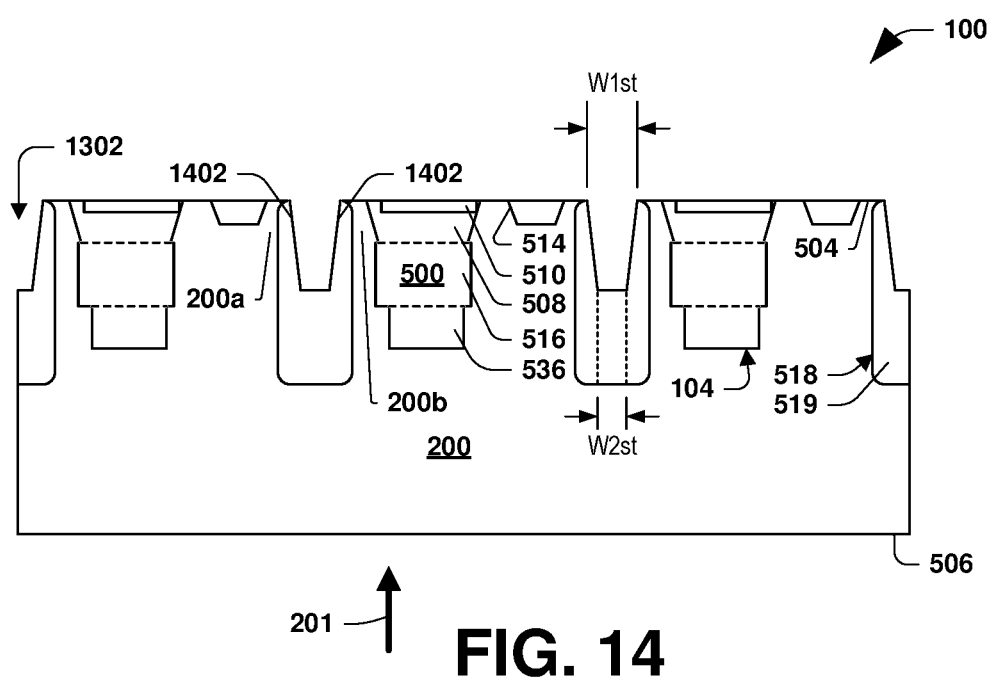

FIG. 14 illustrates the semiconductor arrangement 100 at a stage of fabrication after removal of the second patterned mask layer 1202, according to some embodiments. The second patterned mask layer 1202 is removed after the shallow trench 1302 is formed. The second patterned mask layer 1202 is removed using a process akin to a process used for removal of the first patterned mask layer 802 set forth above with reference to FIG. 11.

A portion of the substrate 200 defining the shallow trench 1302 has a first sidewall 1402 and a second sidewall 1404. In some embodiments, at least one of at least some of the first sidewall 1402 is tapered or at least some of the second sidewall 1404 is tapered. With reference to the first side 504 of the substrate 200, the first sidewall 1402 has a first slope, such as a negative slope, and the second sidewall 1404 has a second slope, such as a positive slope. In some embodiments, the second slope is opposite in polarity relative to the first slope. In some embodiments, a cross-sectional area of the shallow trench 1302 decreases along a direction opposite to the direction of projected radiation 201, such that a width of an upper portion of the shallow trench 1302 is greater than a width of a lower portion of the shallow trench 1302. In some embodiments, at least some of a sidewall defining the shallow trench 1302, such as at least some of the first sidewall 1402 or at least some of the second sidewall 1404, extends vertically, such as in a direction parallel to the direction of projected radiation 201. The shallow trench 1302 has a first maximum width W1$st$ and a first minimum width W2$st$. In some embodiments, the shallow trench 1302 is tapered from the first maximum width W1$st$ to the first minimum width W2$st$ in a direction opposite to the direction of projected radiation 201. Other structures and/or configurations of the shallow trench 1302 relative to other elements, features, etc. are within the scope of the present disclosure.

In some embodiments, a lowermost portion of a shallow trench 1302 from the first side 504 of the substrate 200 is lower than an uppermost portion of a component such as, for example, at least one of the pinning layer 510, the floating diffusion 514, or the charge storage well 508. According to some embodiments, the lowermost portion of the shallow trench 1302 from the first side 504 of the substrate 200 is higher than a lowermost portion of a component, such as, for example, the first deep storage well section 516 or the second deep storage well section 536. According to some embodiments, the lowermost portion of the shallow trench 1302 is lower than a lowermost portion of a component, such as, for example, the charge storage well 508 or the floating diffusion 514. According to some embodiments, the lowermost portion of the shallow trench 1302 is level or coplanar with the lowermost portion of the component. Other structures and/or configurations of the shallow trench 1302 relative to the photodiode 500 and/or components, other elements, features, etc. are within the scope of the present disclosure.

Figure 15:
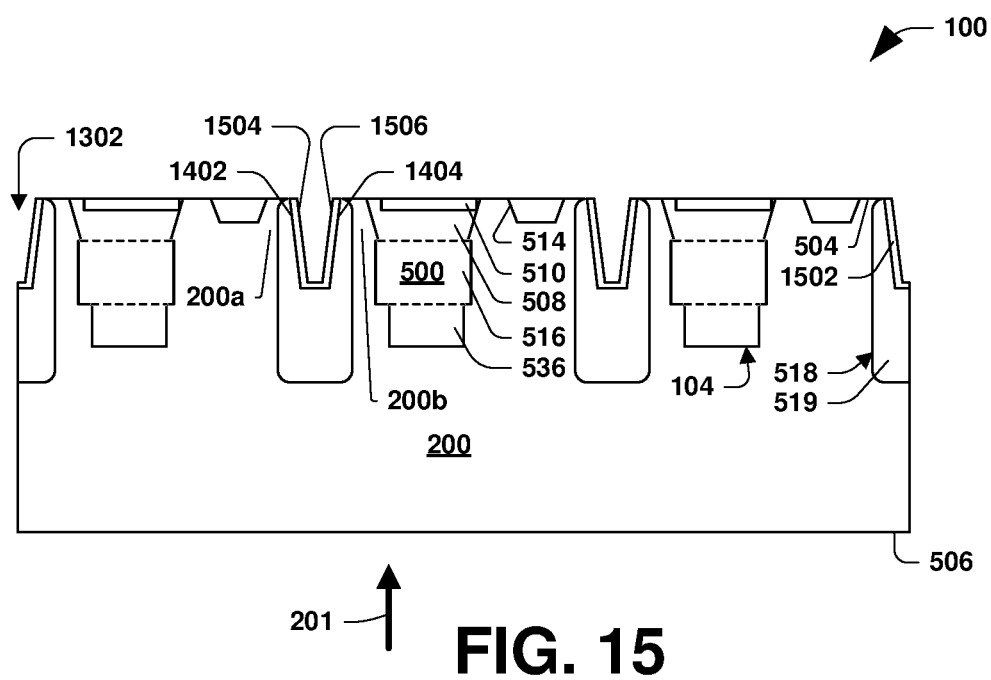

FIG. 15 illustrates the semiconductor arrangement 100 at a stage of fabrication with a first barrier layer 1502 formed over the substrate 200 in the shallow trench 1302, according to some embodiments. In some embodiments, the first barrier layer 1502 is in direct contact with the first side 504 (e.g., the top surface) of the substrate 200, such as the first sidewall 1402 and the second sidewall 1404 defining the shallow trench 1302. In some embodiments, the first barrier layer 1502 is in indirect contact with the first side 504 (e.g., the top surface) of the substrate 200. Other structures and/or configurations of the first barrier layer 1502 relative to other elements, features, etc. are within the scope of the present disclosure.

The first barrier layer 1502 comprises at least one of aluminum oxide ($Al_2O_3$), hafnium oxide, tantalum nitride, or other suitable material. The first barrier layer 1502 is formed by at least one of PVD, sputtering, CVD, LPCVD, ALCVD, UHVCVD, RPCVD, ALD, MBE, LPE, spin on, growth, or other suitable techniques. In some embodiments, formation of the first barrier layer 1502 is followed by planarizing a top surface of the deposited material.

A first portion of the first barrier layer 1502 is in the shallow trench 1302. The first portion of the first barrier layer 1502 has a third sidewall 1504 with which the first sidewall 1402 of the substrate 200 aligns. The first portion of the first barrier layer 1502 in the shallow trench 1302 has a fourth sidewall 1506 with which the second sidewall 1404 of the substrate 200 aligns. Other structures and/or configurations of the first barrier layer 1502 relative to other elements, features, etc. are within the scope of the present disclosure.

Figure 16:
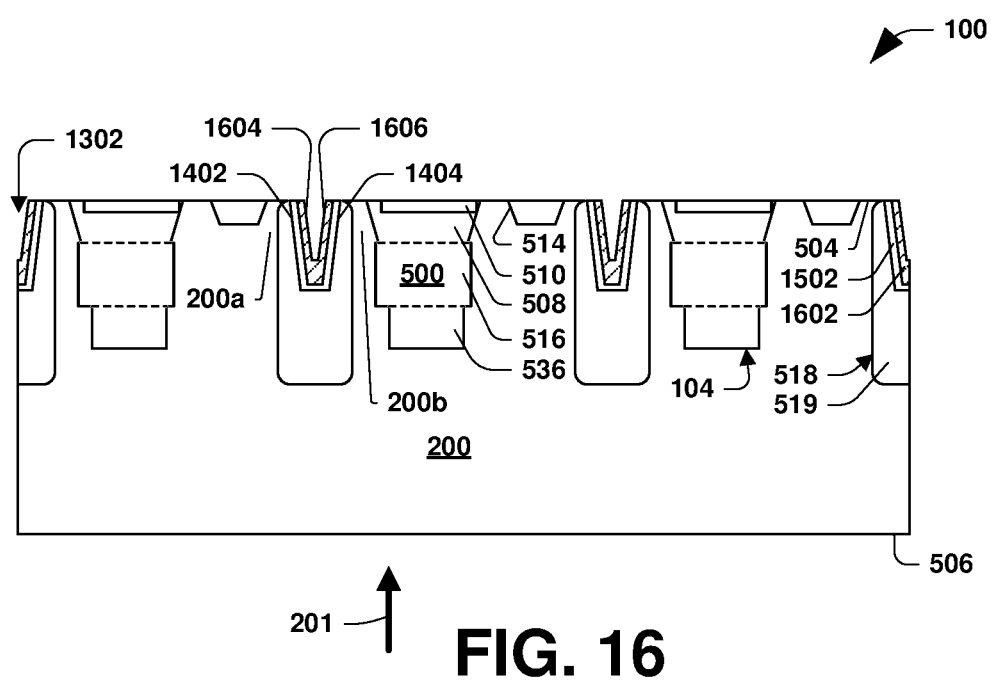

FIG. 16 illustrates the semiconductor arrangement 100 at a stage of fabrication with a first dielectric layer 1602 formed over the first barrier layer 1502 and in the shallow trench 1302, according to some embodiments. In some embodiments, the first dielectric layer 1602 is in direct contact with the first barrier layer 1502. In some embodiments, the first dielectric layer 1602 is in indirect contact with the first barrier layer 1502. The first barrier layer 1502 is between the first dielectric layer 1602 and at least the substrate 200. Other structures and/or configurations of the first dielectric layer 1602 relative to other elements, features, etc. are within the scope of the present disclosure.

The first dielectric layer 1602 comprises at least one of silicon dioxide, silicon nitride, silicon oxynitride, hafnium oxide, fluorinated silica glass (FSG), or other suitable material. The first dielectric layer 1602 is formed by at least one of PVD, sputtering, CVD, LPCVD, ALCVD, UHVCVD, RPCVD, ALD, MBE, LPE, spin on, growth, or other suitable techniques. In some embodiments, formation of the first dielectric layer 1602 is followed by planarizing a top surface of the deposited material. A coefficient of thermal expansion of the first dielectric layer 1602 is between about 1 to about 20 (such as between about 2.5 to about 16). Other structures and/or configurations of the first dielectric layer 1602 are within the scope of the present disclosure.

A first portion of the first dielectric layer 1602 is in the shallow trench 1302. The first portion of the first dielectric layer 1602 has a fifth sidewall 1604 with which the third sidewall 1504 of the first portion of the first barrier layer 1502 aligns. The first portion of the first dielectric layer 1602 in the shallow trench 1302 has a sixth sidewall 1606 with which the fourth sidewall 1506 of the first portion of the first barrier layer 1502 aligns. Other structures and/or configurations of the first dielectric layer 1602 relative to other elements, features, etc. are within the scope of the present disclosure.

Figure 17:
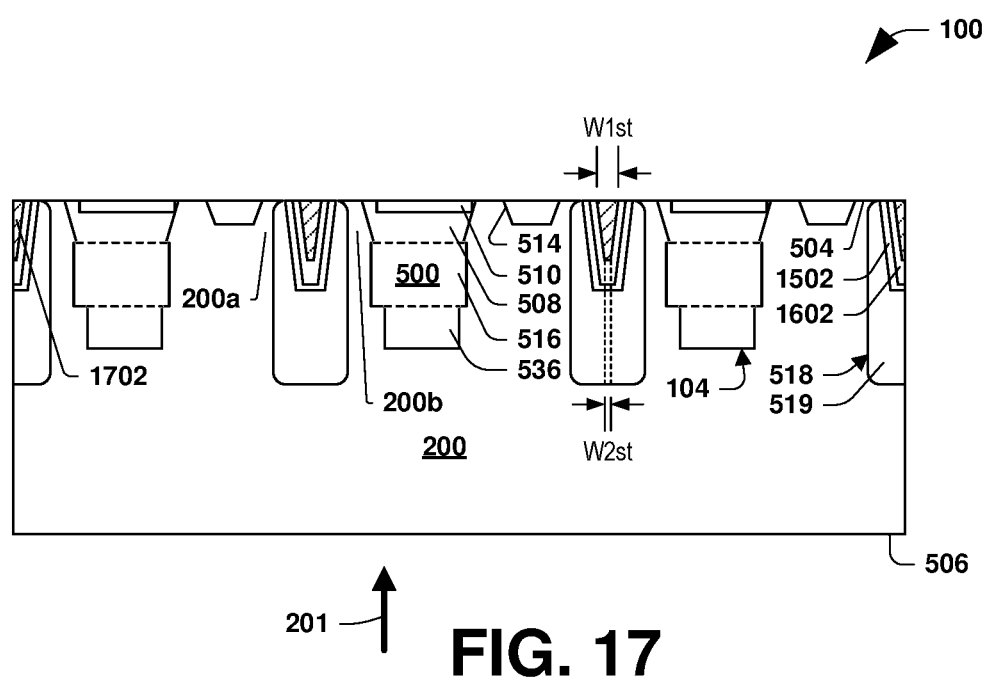

FIG. 17 illustrates the semiconductor arrangement 100 at a stage of fabrication with a shallow trench isolation 1702 formed over the first dielectric layer 1602, over the first barrier layer 1502, and in the shallow trench 1302, according to some embodiments. In some embodiments, the shallow trench isolation 1702 is in direct contact with the first dielectric layer 1602. In some embodiments, the shallow trench isolation 1702 is in indirect contact with the first dielectric layer 1602. The first dielectric layer 1602 is between the shallow trench isolation 1702 and at least one of the first barrier layer 1502 or the substrate 200. The first barrier layer is between the substrate 200 and at least one of the first dielectric layer 1602 or the shallow trench isolation 1702. Other structures and/or configurations of the shallow trench isolation 1702 relative to other elements, features, etc. are within the scope of the present disclosure.

The shallow trench isolation 1702 comprises at least one of silicon dioxide, silicon nitride, silicon oxynitride, hafnium oxide, fluorinated silica glass (FSG), or other suitable material. The shallow trench isolation 1702 is formed by at least one of PVD, sputtering, CVD, LPCVD, ALCVD, UHVCVD, RPCVD, ALD, MBE, LPE, spin on, growth, or other suitable techniques. In some embodiments, formation of the shallow trench isolation 1702 is followed by planarizing a top surface of the deposited material. Other structures and/or configurations of the shallow trench isolation 1702 are within the scope of the present disclosure.

A first portion of the shallow trench isolation 1702 is in the shallow trench 1302. The first portion of the shallow trench isolation 1702 has a seventh sidewall 1704 with which the fifth sidewall 1604 of the first portion of the first dielectric layer 1602 aligns. The first portion of the shallow trench isolation 1702 in the shallow trench 1302 has an eighth sidewall 1706 with which the sixth sidewall 1606 of the first portion of the first dielectric layer 1602 aligns. In some embodiments, at least one of at least some of the seventh sidewall 1704 is tapered or at least some of the eighth sidewall 1706 is tapered. The seventh sidewall 1704 has a first slope, such as a negative slope, and the eighth sidewall 1706 has a second slope, such as a positive slope. In some embodiments, the second slope is opposite in polarity relative to the first slope. In some embodiments, a cross-sectional area of the shallow trench isolation 1702 decreases along the direction of projected radiation 201, such that a width W1$sti$ of an upper portion of the shallow trench isolation 1702 is greater than a width W2$sti$ of a lower portion of the shallow trench isolation 1702. In some embodiments, at least some of a sidewall defining the shallow trench isolation 1702, such as at least one of at least some of the seventh sidewall 1704 or at least some of the eighth sidewall 1706, extends vertically, such as in a direction parallel to the direction of projected radiation 201. In some embodiments, the shallow trench isolation 1702 has a first maximum width W1$sti$ and a first minimum width W1$sti$. In some embodiments, the shallow trench isolation 1702 is tapered from the first maximum width W1$sti$ to the first minimum width W2$sti$ in a direction opposite to the direction of projected radiation 201. In some embodiments, the shallow trench isolation 1702 provides one of a reduction or an elimination of electrical cross-talk, where an electrical signal is produced from incident radiation that passes between adjacent photodiodes. Other structures and/or configurations of the shallow trench isolation 1702 relative to other elements, features, etc. are within the scope of the present disclosure.

Figure 18:
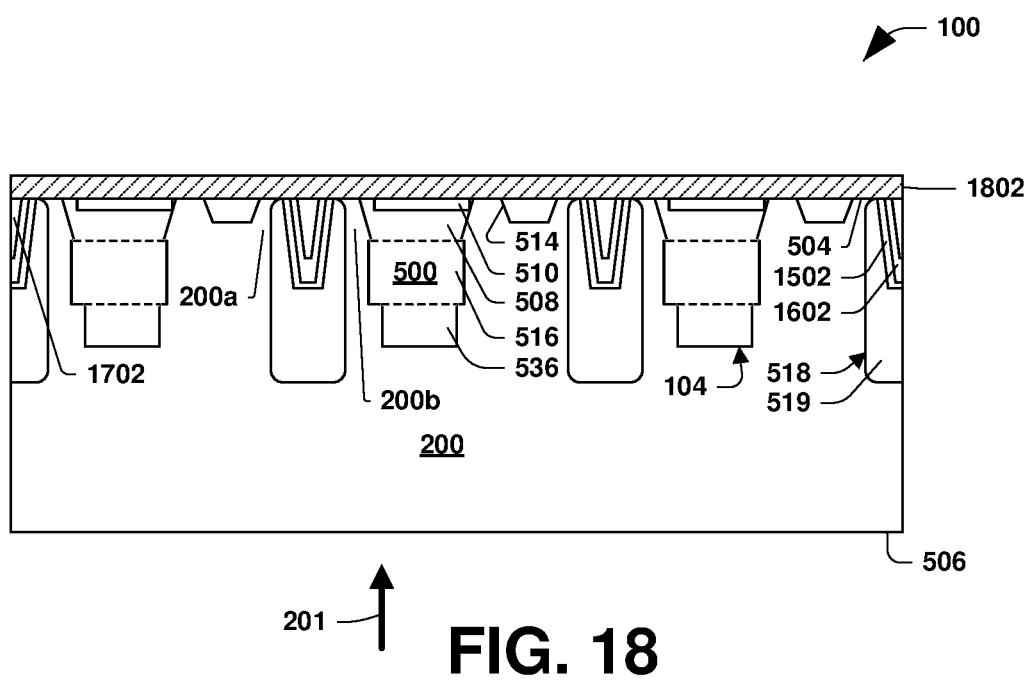

FIG. 18 illustrates the semiconductor arrangement 100 at a stage of fabrication with a second dielectric layer 1802 formed over the shallow trench isolation 1702 and the substrate 200, according to some embodiments. In some embodiments, the second dielectric layer 1802 is in direct contact with at least one of the shallow trench isolation 1702 or the substrate 200. In some embodiments, the second dielectric layer 1802 is in indirect contact with at least one of the shallow trench isolation 1702 or the substrate 200. In some embodiments, the second dielectric layer 1802 comprises a dielectric material such as at least one of oxide, nitride, or other suitable materials. The second dielectric layer 1802 is formed by at least one of PVD, sputtering, CVD, LPCVD, ALCVD, UHVCVD, RPCVD, ALD, MBE, LPE, spin on, growth, or other suitable techniques. Other structures and/or configurations of the second dielectric layer 1802 relative to other elements, features, etc. are within the scope of the present disclosure.

Figure 19:
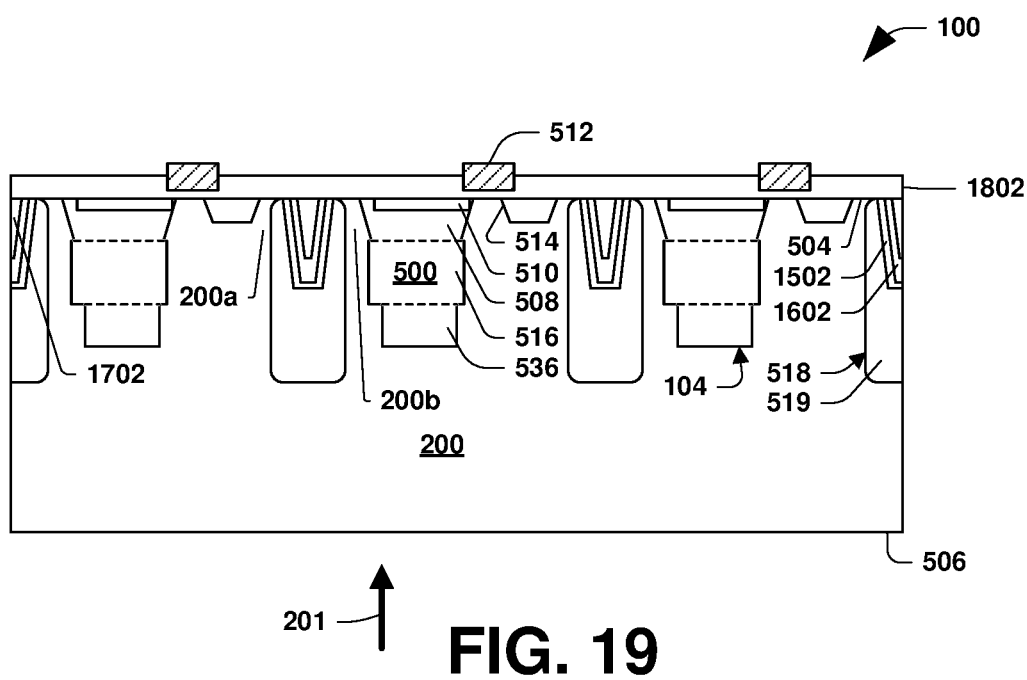

FIG. 19 illustrates the semiconductor arrangement 100 at a stage of fabrication with the transfer gate 512 formed over at least one of the second dielectric layer 1802 or the substrate 200, according to some embodiments. In some embodiments, the transfer gate 512 is in direct contact with at least one of the second dielectric layer 1802 or the substrate 200. In some embodiments, the transfer gate 512 is in indirect contact with at least one of the second dielectric layer 1802 or the substrate 200.

The transfer gate 512 reads out a signal charge corresponding to detected signal strength of radiation impinging on the photodiode 500. To read out signal charge from the charge storage well 508, the transfer gate 512 is used to create a variable potential barrier for charge carriers in the junction of the charge storage well 508 and the substrate 200. When a transfer gate voltage is applied to turn the transfer gate 512 "on" (e.g., a positive bias relative to the substrate 200 for an n-channel device where charge storage well 508 is the n-type) charge carriers in the charge storage well 508 transfer across a barrier in the substrate 200 to the floating diffusion 514 until a potential in the charge storage well 508 is approximately equal to the potential barrier. In the process of reading out the charge carriers, the charge storage well 508 is essentially reset to a higher potential. The transfer gate voltage is then removed to turn the transfer gate 512 "off" to a lower potential. New photoelectrons are collected in the charge storage well 508 during an integration period with an associated drop in potential in the charge storage well 508. At the end of the integration period, the transfer gate 512 is again pulsed "on" to skim off the collected charge carriers.

The transfer gate 512 comprises a conductive material such as at least one of polysilicon, metal, or other suitable materials. The transfer gate 512 is formed by at least one of PVD, sputtering, CVD, LPCVD, ALCVD, UHVCVD, RPCVD, ALD, MBE, LPE, spin on, growth, or other suitable techniques. Other structures and/or configurations of the transfer gate 512 relative to other elements, features, etc. are within the scope of the present disclosure.

Figure 20:
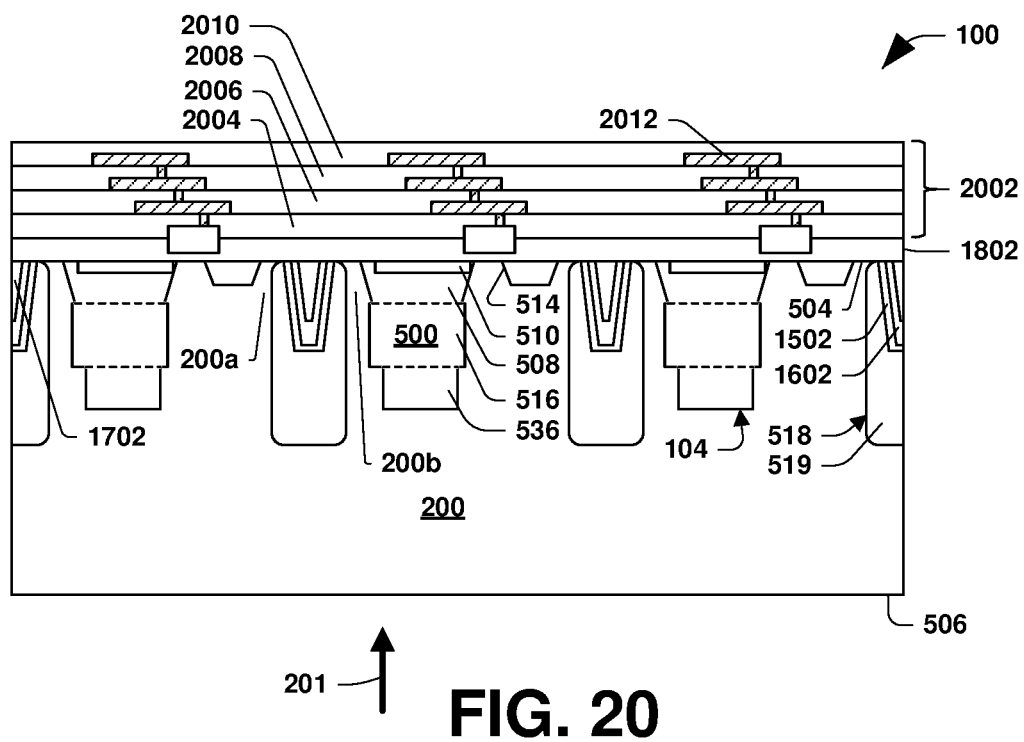

FIG. 20 illustrates the semiconductor arrangement 100 at a stage of fabrication with an interconnect structure 2002 formed over at least one of the transfer gate 512, the second dielectric layer 1802, or the substrate 200, according to some embodiments. The interconnect structure 2002 at least one of overlies the transfer gate 512, is in direct contact with the transfer gate 512, or is in indirect contact with the transfer gate 512. The interconnect structure 2002 at least one of overlies the second dielectric layer 1802, is in direct contact with the second dielectric layer 1802, or is in indirect contact with the second dielectric layer 1802. The interconnect structure 2002 at least one of overlies the substrate 200, is in direct contact with the substrate 200, or is in indirect contact with the substrate 200.

The interconnect structure 2002 comprises one or more interconnect layers, such as at least one of a first interconnect layer 2004, a second interconnect layer 2006, a third interconnect layer 2008, or a fourth interconnect layer 2010. The one or more interconnect layers of the interconnect structure 2002 comprise at least one of patterned dielectric layers or conductive layers that provide interconnections, such as wiring, between at least one of various doped features, circuitry, input/output, etc. of the semiconductor arrangement 100. In some embodiments, the interconnect structure 2002 comprises an interlayer dielectric and multi-layer interconnect structures, such as at least one of contacts, vias, metal lines, or other types of structures. For purposes of illustration, the interconnect structure 2002 comprises conductive lines 2012, where the positioning and configuration of conductive lines 2012 may vary depending upon design needs. Other structures and configurations of the interconnect structure 2002 are within the scope of the present disclosure.

Figure 21:
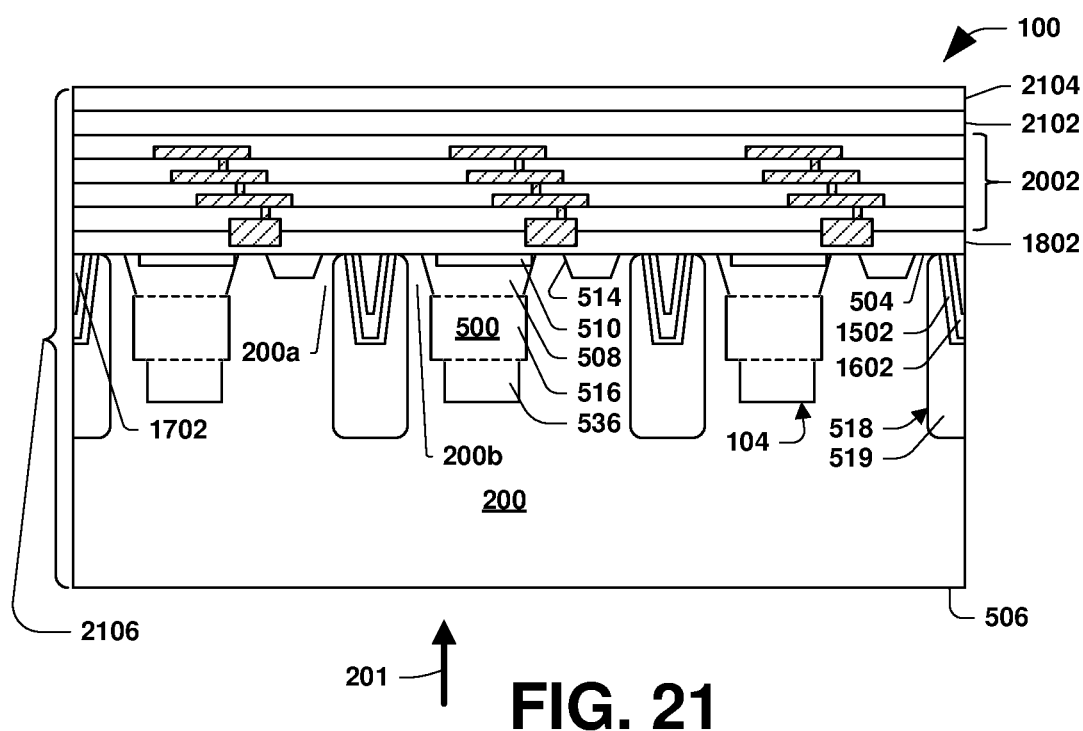

FIG. 21 illustrates the semiconductor arrangement 100 at a stage of fabrication with a passivation layer 2102 formed over the interconnect structure 2002 and a first oxide layer 2104 formed over the passivation layer 2102, according to some embodiments. A first wafer 2106 comprises the substrate 200, the second dielectric layer 1802, the transfer gate 512, the interconnect structure 2002, the passivation layer 2102, and the first oxide layer 2104. The passivation layer 2102 at least one of overlies the interconnect structure 2002, is in direct contact with the interconnect structure 2002, or is in indirect contact with the interconnect structure 2002. The passivation layer 2102 at least one of overlies the substrate 200, is in direct contact with the substrate 200, or is in indirect contact with the substrate 200. The first oxide layer 2104 at least one of overlies the passivation layer 2102, is in direct contact with the passivation layer 2102, or is in indirect contact with the passivation layer 2102. The first oxide layer 2104 at least one of overlies the substrate 200, is in direct contact with the substrate 200, or is in indirect contact with the substrate 200.

In some embodiments, the passivation layer 2102 protects at least some of the interconnect structure 2002 from undergoing corrosion or other alterations during subsequent formation processes of the semiconductor arrangement 100. In some embodiments, the passivation layer 2102 includes at least one of aluminum nitride (AlN), aluminum oxide ($Al_2O_3$), $SiO_2$, silicon nitride ($Si_3N_4$), a chemically inert, corrosion-resistant dielectric material, or an organic compound having at least one of the n-type, the p-type, or other silicon-type molecular structure, or other suitable materials. Other configurations and/or compositions of the passivation layer 2102 are within the scope of the present disclosure.

In some embodiments, the passivation layer 2102 is formed by at least one of PVD, sputtering, CVD, LPCVD, ALCVD, UHVCVD, RPCVD, ALD, MBE, LPE, spin on, growth, passivation, or other suitable techniques. A passivation process includes at least one of oxidation of a surface of an underlying material or complexing of the surface of the underlying material with an organic compound. The passivation layer 2102 includes a layer or layers of film covering an underlying material, such as a material of the interconnect structure 2002 or the substrate 200. A chemically-stable material is used to produce the layer or layers of film. The layer or layers of film at least one of inhibits dissolution or reduces at least one of electrical or chemical reactivity with regard to the underlying material, at least one of during or after subsequent processes or treatments of the semiconductor arrangement 100. Other processes of forming the passivation layer 2102 are within the scope of the present disclosure.

The passivation layer 2102 at least one of inhibits diffusion of at least one of charges, atoms, or ions into the underlying material, mitigates oxidation of the underlying material, protects the underlying material from environmental conditions, or acts as a diffusion barrier with regard to the underlying material. Other purposes and/or functions of the passivation layer 2102 are within the scope of the present disclosure.

In some embodiments, the first oxide layer 2104 is conformally formed over and across at least one of the passivation layer 2102, the interconnect structure 2002, or the substrate 200. In some embodiments, the first oxide layer 2104 comprises at least one of $SiO_2$, $Si_3N_4$, silicon oxynitride (SiON), dielectric material(s) with a high dielectric constant (high-k), or other suitable materials. The first oxide layer 2104 may be formed by at least one of CVD, PVD, ALD, high-density plasma CVD (HDPCVD), metal organic CVD (MOCVD), plasma enhanced CVD (PECVD), or other suitable techniques. In some embodiments, the oxide layer 2104 has a thickness of between 0.5 nm and 3 nm. If the oxide layer 1204 is too thick, such as greater than 3 nm, it may be difficult to remove in a following process. If the first oxide layer 2104 is too thin, such as less than 0.5 nm, the underlying structure may be damaged when bonding the first wafer 2106 to another wafer.

Figure 22:
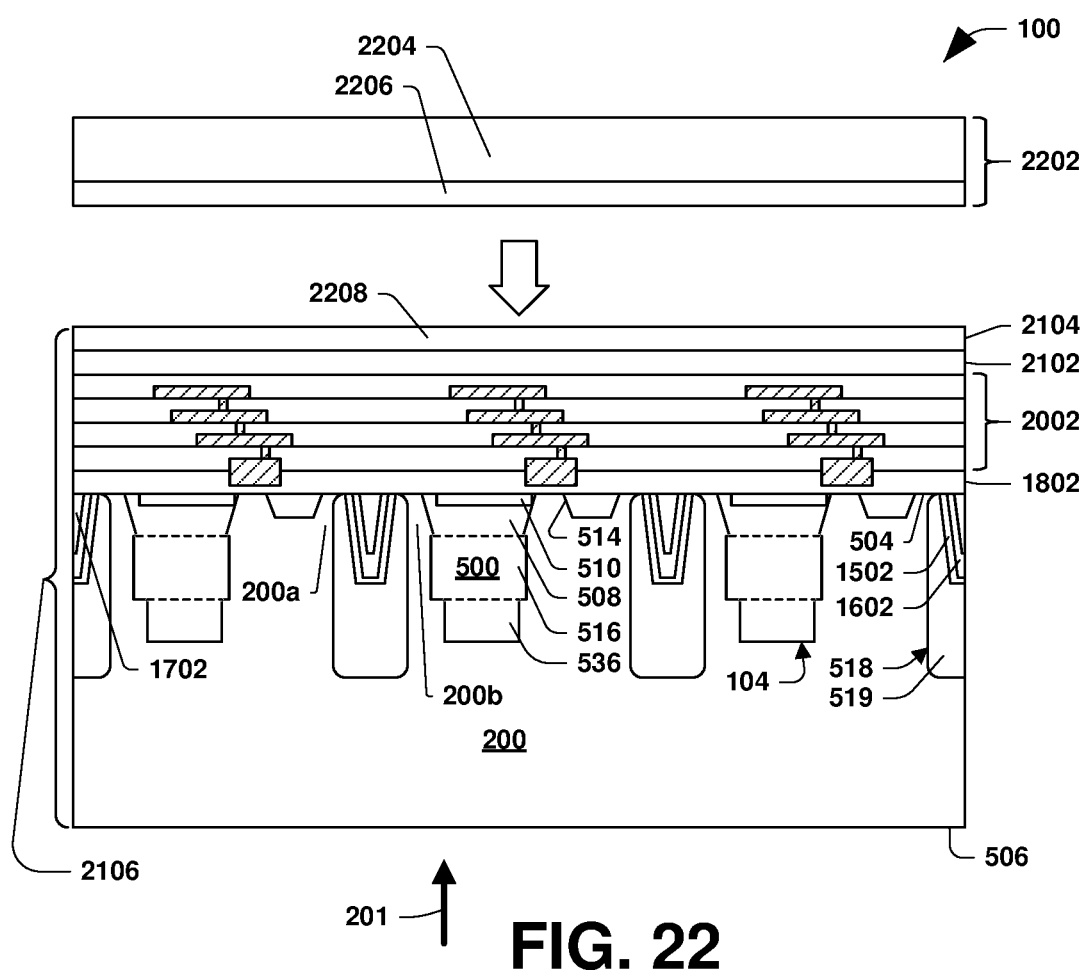

FIG. 22 illustrates the semiconductor arrangement 100 at a stage of fabrication with a second wafer 2202, at times referred to as a carrier wafer, in a process to bond to the first wafer 2106, according to some embodiments. The second wafer 2202 has a second substrate 2204 and a second wafer interface region 2206. A layer of $SiO_2$ is formed in the second wafer interface region 2206 by exposing the second wafer interface region 2206 to 02. The second wafer interface region 2206 at least one of overlies the second substrate 2204, is in direct contact with the second substrate 2204, or is in indirect contact with the second substrate 2204. In some embodiments, the first wafer 2106 is treated with a process to create a first wafer interface region 2208 in the first oxide layer 2104.

In some embodiments, the first wafer 2106 and the second wafer 2202 are subjected to a thermal process (heat treatment) for forming a thermal oxide layer in the first wafer interface region 2208 of the first wafer 2106 and the second wafer interface region 2206 of the second wafer 2202. The thermal oxide layer is formed inside of a heated chamber, a furnace, or other suitable temperature-controlled environment. A thermal oxide layer is formed by subjecting the first wafer 2106 or second wafer 2202 to an environment of oxygen (e.g., $O_2$) and a specified temperature, such as 1000° C., for one hour. According to some embodiments, the thermal oxide layer is $SiO_2$ and is formed by a molecular reaction between the Si of the first wafer interface region 2208 of the first wafer 2106 or the second wafer interface region 2206 of the second wafer 2202 and the 02. In some embodiments, a thickness of the thermal oxide layer of the first wafer interface region 2208 of the first wafer 2106 is selected to provide a good reaction with the second wafer interface region 2206 of the second wafer 2202 during a subsequent anneal process to form covalent bonds between the first wafer 2106 and the second wafer 2202, such as a thickness of 1000 angstroms (A).

In some embodiments, the first wafer 2106 is treated with plasma in a first plasma chamber (not shown) and the second wafer 2202 is treated with plasma in a second plasma chamber (not shown). In some embodiments, the first wafer 2106 and the second wafer 2202 are each treated with plasma in the same plasma chamber (not shown). Plasma treatment includes injecting a material into the first plasma chamber, the second plasma chamber, or the same plasma chamber and applying a voltage to the injected material to generate plasma from the injected material. The injected material may be argon (Ar) or other suitable materials, and the plasma may be Ar plasma or other suitable plasma. According to some embodiments, the plasma treatment includes subjecting the first wafer 2106 and the second wafer 2202 to an environment of silane ($SiH_4$) and nitrous oxide ($N_2O$), and applying a bias voltage directed at the first wafer interface region 2208 and the second wafer interface region 2206. A plasma oxide layer of $SiO_2$ is formed by subjecting the first wafer 2106 and the second wafer 2202 to an environment of SiH$_4$ and N$_2$O at a specified temperature, such as 300° C., for a specified period of time, such as for one hour, and directing the voltage toward the first wafer interface region 2208 and the second wafer interface region 2206. In some embodiments, a thickness of the plasma oxide layer of the first wafer interface region 2208 of the first wafer 2106 is selected to provide a good reaction with the second wafer interface region 2206 of the second wafer 2202 during a subsequent anneal process to form covalent bonds between the first wafer 2106 and the second wafer 2202, such as a thickness of 1000 angstroms (A).

The first wafer interface region 2208 and the second wafer interface region 2206 are aligned, such as to overlap or be vertically coincident with one another, and pressed together by applying at least one of a first pressure P1 to the first wafer interface region 2208 in a direction toward the second wafer interface region 2206 or a second pressure P2 to the second wafer interface region 2206 in a direction toward the first wafer interface region 2208. Due to the force of at least one of the first pressure P1 or the second pressure P2, the SiO$_2$ molecules at the second wafer interface region 2206 combine with the Si atoms at the first wafer interface region 2208 by way of Van der Waals interaction to form a Si—SiO$_2$ surface bond. In some embodiments, the anneal process includes subjecting an interface of the first wafer interface region 2208 and the second wafer interface region 2206 to a specified temperature for a specified amount of time, such as 350° C. for three hours. As the Si—O—Si covalent bonds form at the interface of the first wafer interface region 2208 and the second wafer interface region 2206, the H atoms combine with O atoms to form H$_2$O as a byproduct. Other temperatures and/or anneal times for forming the Si—O—Si covalent bonds between the first wafer 2106 and the second wafer 2202 are within the scope of the disclosure.

Figure 23:
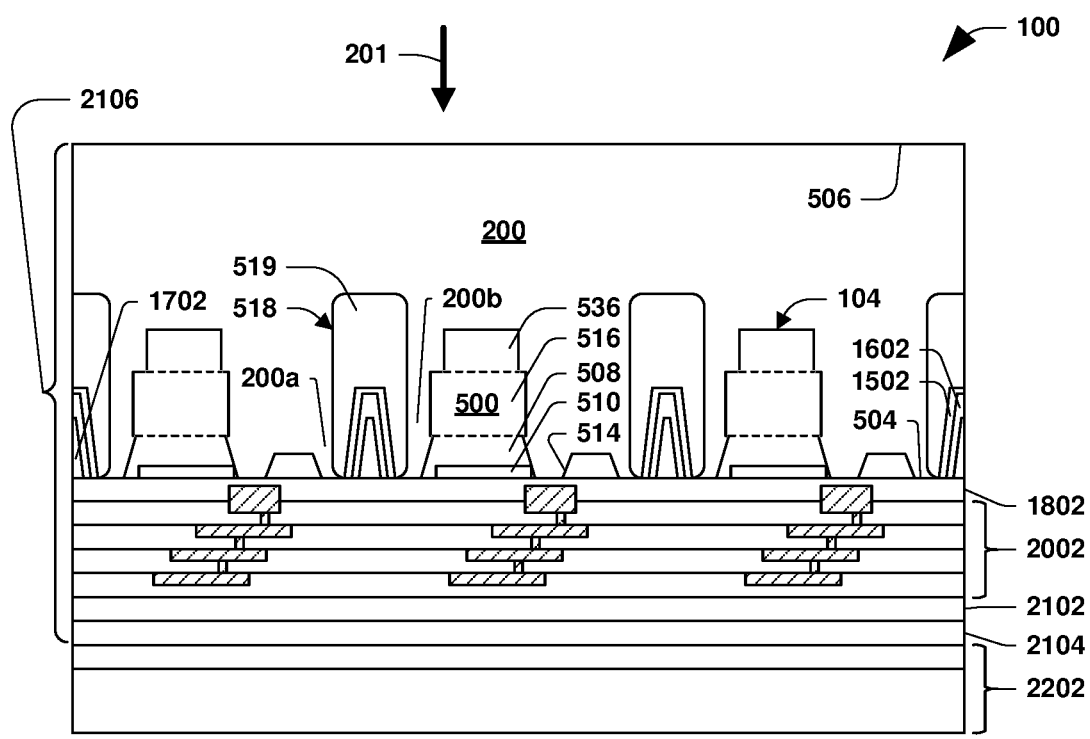

FIG. 23 illustrates the semiconductor arrangement 100 at a stage of fabrication with the second wafer 2202 bonded to the first wafer 2106, according to some embodiments. The second wafer 2202 is bonded to the first wafer 2106 after an anneal process for forming covalent bonds of Si—O—Si at the interface of the first wafer interface region 2208 and the second wafer interface region 2206. Referring to FIG. 23, the semiconductor arrangement 100 has been inverted.

Figure 24:
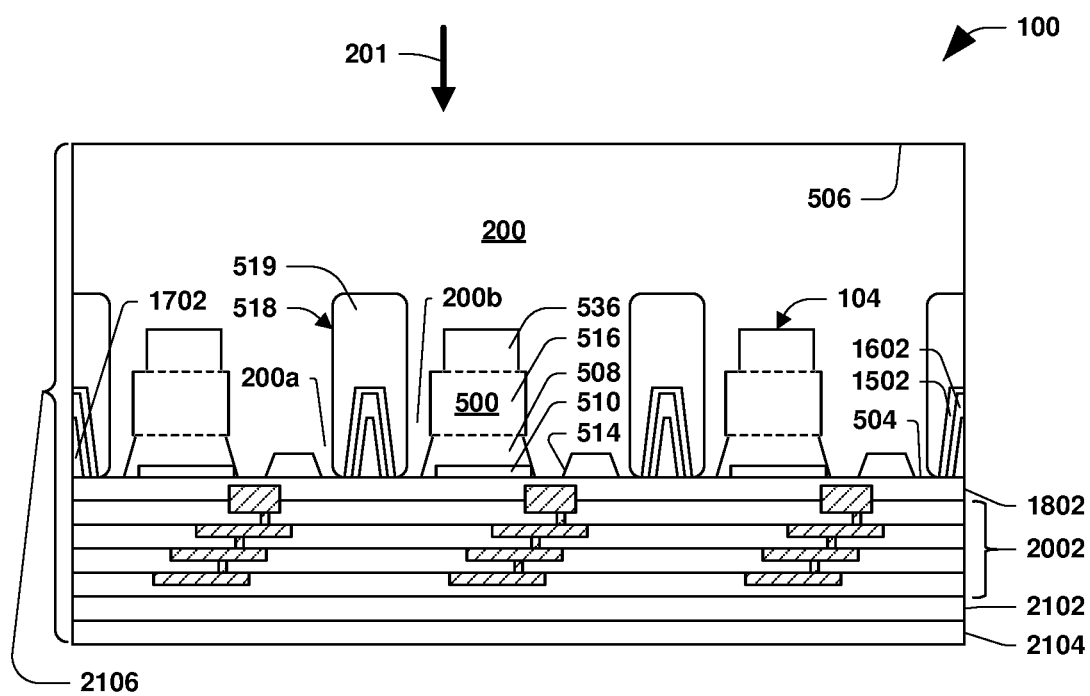

FIG. 24 illustrates the semiconductor arrangement 100 at a stage of fabrication after removal of the second wafer 2202, according to some embodiments. The first wafer 2106 is reduced by removing the second substrate 2204 and the second wafer interface region 2206. According to some embodiments, the semiconductor arrangement 100 is rotated 180 degrees or inverted to facilitate removal of the second wafer 2202. The second wafer 2202 is removed by at least one of wafer back-grinding, liquid etching, dry etching, plasma etching, chemical-mechanical polishing, planarization, or other suitable techniques.

Figure 25:
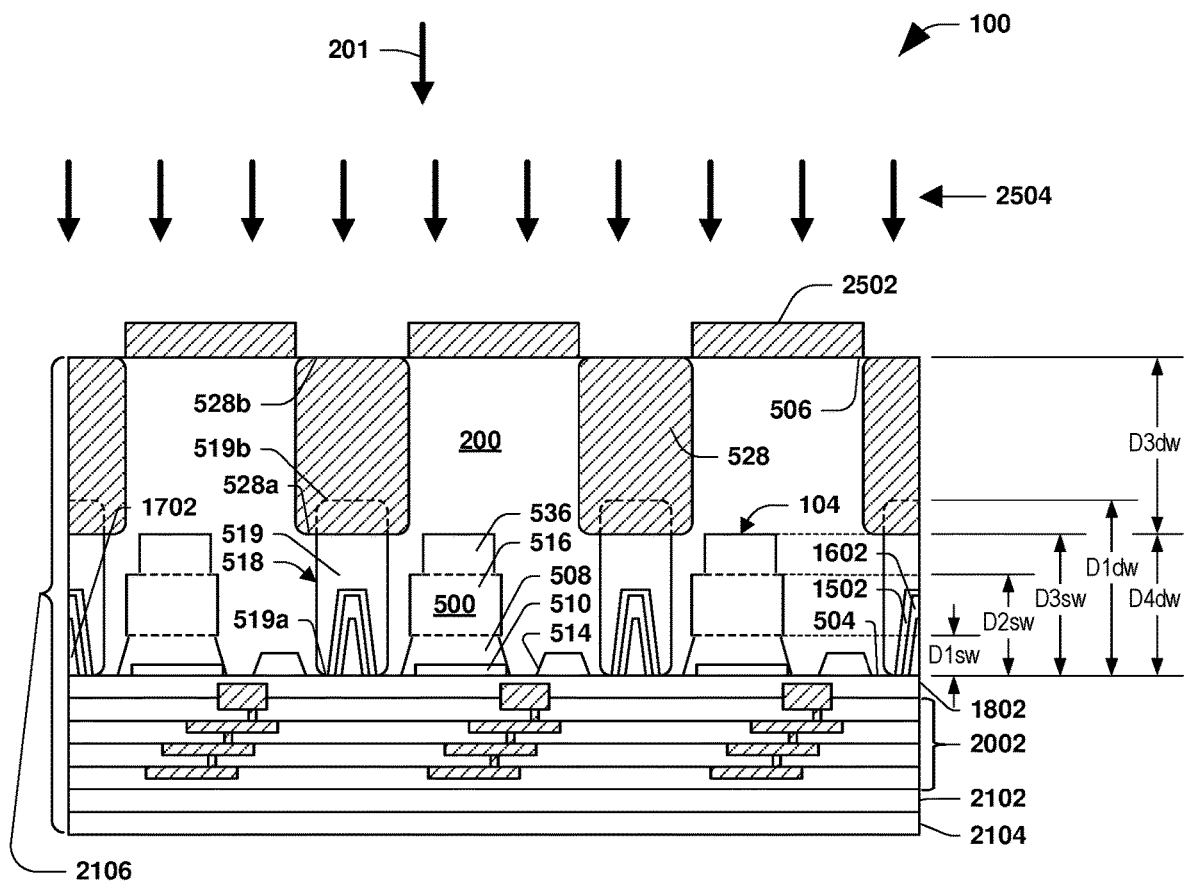

FIG. 25 illustrates the semiconductor arrangement 100 at a stage of fabrication with a mask layer patterned to form a third patterned mask layer 2502 over the substrate 200 and isolation structure 518 comprising the first well 519 and the second well 528, according to some embodiments. The third patterned mask layer 2502 may be formed using a process akin to a process used for formation of the first patterned mask layer 802 as set forth above with reference to FIG. 8. In some embodiments, the second well 528 may be formed using a process akin to a process used for formation of the first well 519 in the substrate 200 as set forth above and as illustrated in FIG. 9. In some embodiments, the second well 528 is formed via deep implantation 2504 and comprises the first-type dopant. In some embodiments, the second well 528 comprises the first-type dopant in a higher concentration than the first-type dopant in the substrate 200. The deep implantation 2504 is formed using a process akin to a process used for formation of the deep implantation 902 set forth above with reference to FIG. 9. In some embodiments, the first well 519 has a first side 519*a* and a second side 519*b*, and the second well 528 has a first side 528*a* and a second side 528*b*.

In some embodiments, the isolation structure 518 comprising a combination of the first well 519 and the second well 528 surrounds the photodiode 500. In some embodiments, the first well 519 laterally surrounds the photodiode 500 and the second well 528 does not laterally surround the photodiode 500. In some embodiments, the first well 519 laterally surrounds a portion of the photodiode 500 and the second well 528 laterally surrounds a portion of the photodiode 500 (e.g., when the second deep storage well section 536 of the photodiode 500 extends from the first side 504 of the substrate 200 beyond the first side 528*a* of the second well 528).

In some embodiments, the first well 519 is contiguous with the second well 528 (e.g., the second side 519*b* of the first well 519 is contiguous with the first side 528*a* of the second well 528). In some embodiments, the first well 519 overlaps the second well 528 (e.g., the second side 519*b* of the first well 519 overlaps the first side 528*a* of the second well 528). In some embodiments, the first well 519 and the second well 528 are contiguous and formed with the same dopant type. In some embodiments, the isolation structure 518 comprising a combination of the first well 519 and the second well 528 extends from the first side 504 of the substrate 200 to the second side 506 of the substrate 200. In some embodiments, the isolation structure 518 comprising a combination of the first well 519 and the second well 528 extends from the first side 504 of the substrate 200 and does not extend to the second side 506 of the substrate 200. In some embodiments, the isolation structure 518 comprising a combination of the first well 519 and the second well 528 does not extend from the first side 504 of the substrate 200 and does extend to the second side 506 of the substrate 200. Relative widths and depths of the first well 519, the second well 528, and the photodiode 500 are set forth above with reference to FIG. 5C. In some embodiments, the second well 528 provides one of a reduction or an elimination of electrical cross-talk, where an electrical signal is produced from incident radiation that passes between adjacent photodiodes. Other arrangements and/or configurations of the first well 519 and the second well 528, and processes and/or techniques for forming the first well 519, the second well 528, and the third patterned mask layer 2502 are within the scope of the present disclosure.

Figure 26:
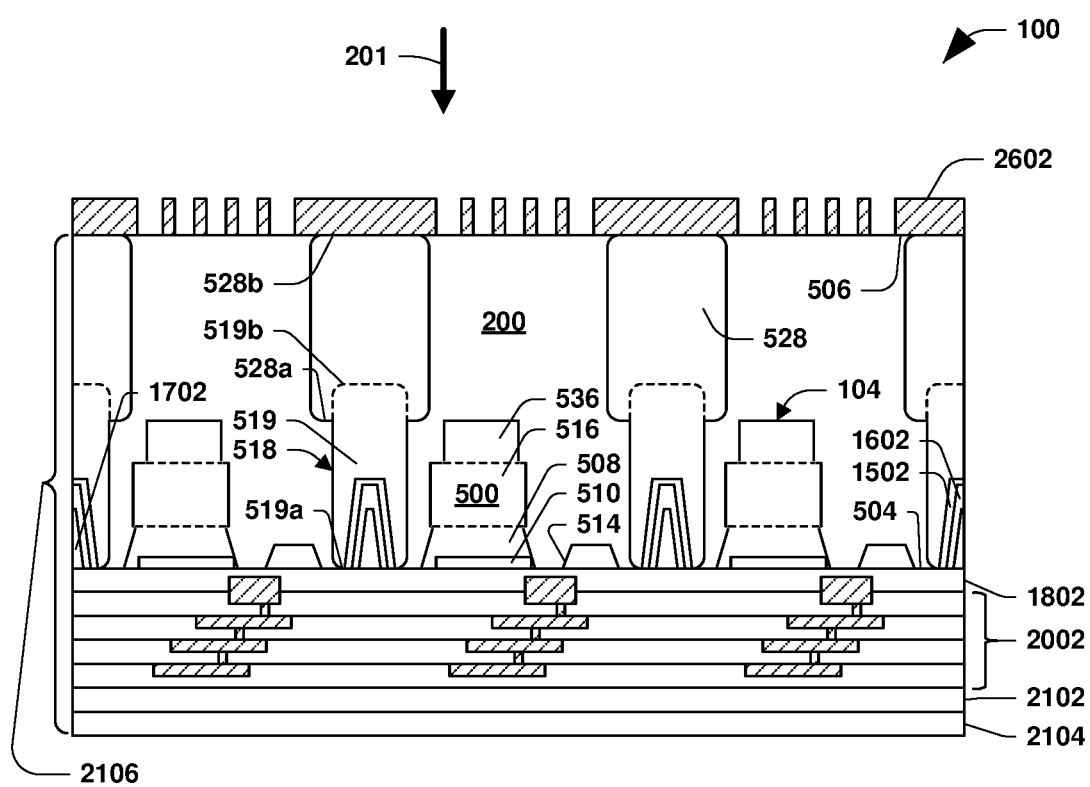

FIG. 26 illustrates the semiconductor arrangement 100 at a stage of fabrication after removal of the third patterned mask layer 2502 and illustrates a mask layer patterned to form a fourth patterned mask layer 2602 over at least one of the substrate 200 or the isolation structure 518, according to some embodiments. The third patterned mask layer 2502 is removed using a process akin to a process used for removal of the first patterned mask layer 802 set forth above with reference to FIG. 11. In some embodiments, removal of the third patterned mask layer 2502 also removes at least some of the substrate 200. The fourth patterned mask layer 2602 is formed using an etching process akin to an etching process used in the formation of the first patterned mask layer 802 as set forth above with reference to FIG. 8. Other processes and/or techniques for forming the fourth patterned mask layer 2602 are within the scope of the present disclosure.

Figure 27:
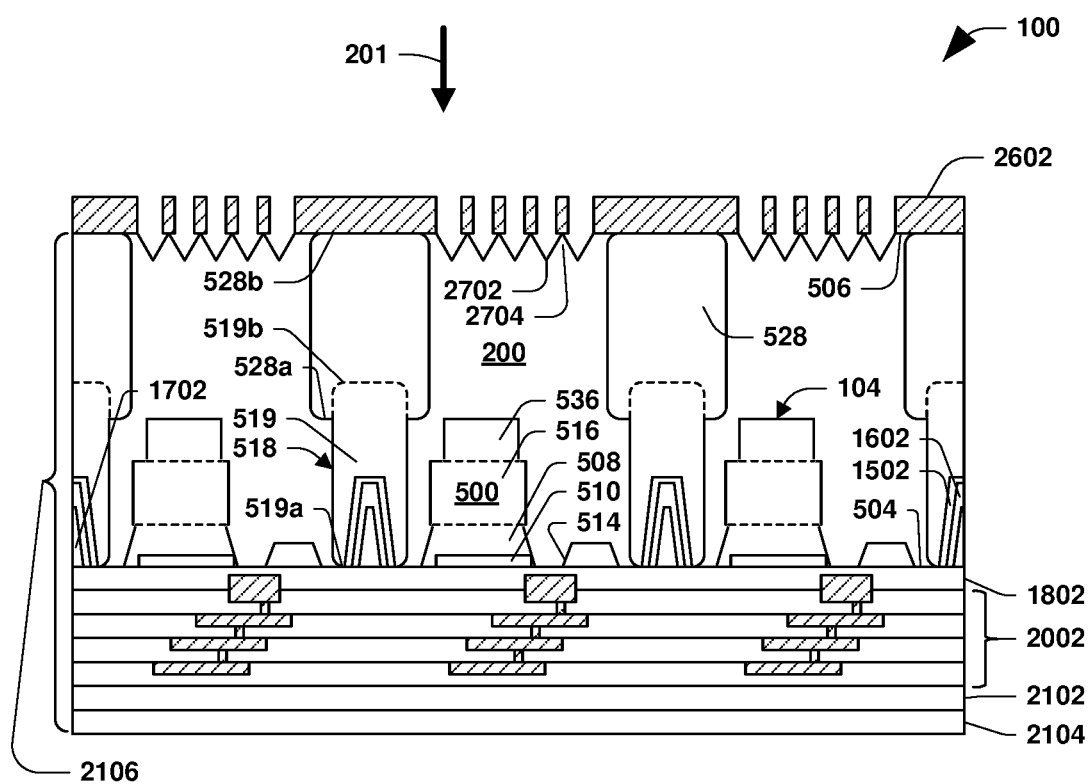

FIG. 27 illustrates the semiconductor arrangement 100 at a stage of fabrication with the fourth patterned mask layer 2602 used in the formation of recesses 2702 in the substrate 200, according to some embodiments. In some embodiments, the recesses are formed using an etching process akin to an etching process used to form the shallow trench 1302 with reference to FIG. 13. The recesses 2702 extend into the second side 506 of the substrate 200 and at least partially define an absorption enhancement structure. The recesses 2702 are at least one of vertically coincident with photodiode 500, vertically coincident with a portion of the photodiode 500, or vertically offset from the photodiode 500. The recesses 2702 are at least one of surrounded by the isolation structure 518, surrounded by a portion of the isolation structure 518, laterally surrounded by the isolation structure 518, or laterally surrounded by a portion of the isolation structure 518. The recesses 2702 are at least one of surrounded by the second well 528, surrounded by a portion of the second well 528, laterally surrounded by the second well 528, or laterally surrounded by a portion of the second well 528. The recesses 2702 extend into the substrate 200 from the second side 506 by at least less than the second side 528b of the second well 528, coincident with the second side 528b of the second well 528, or greater than the second side 528b of the second well 528. Other arrangements of the recesses 2702 with respect to the isolation structure 518 and/or the second well 528 are within the scope of the present disclosure. The recesses 2702 are formed in accordance with the fourth patterned mask layer 2602. The recesses 2702 are laterally adjacent and are at least one of laterally contiguous or laterally non-contiguous (e.g., separated by a distance in accordance with the fourth patterned mask layer 2602). Other arrangements or configurations of the recesses 2702 are within the scope of the present disclosure.

The recesses 2702 define protrusions 2704. The protrusions 2704 are configured to prevent incident radiation from reflecting away from the photodiode 500. For example, the protrusions 2704 may have angled sidewalls to prevent such reflectance. By preventing incident radiation from reflecting away from the photodiode 500, the protrusions 2704 increase an amount of radiation absorbed by the photodiode 500, which may increase the sensitivity of the photodiode 500. In some embodiments, the protrusions 2704 are in a periodic pattern or array. In some embodiments, the protrusions 2704 each have at least one of a cone shape, a pyramid shape, or some other shape. In some embodiments, the protrusions 2704 define a saw-toothed profile. In some embodiments, the protrusions 2704 have a pitch P of about 0.01 μm to 8.0 μm, of about 0.2 μm to 5.0 μm, of about 1.0 μm to 3.0 μm, or any combination of the foregoing. In some embodiments, the protrusions 2704 have a height H of about 0.2 μm to 20.0 μm, of about 1.0 μm to 15.0 μm, of about 5.0 μm to 10.0 μm, or any a combination of the foregoing. In some embodiments the second side 506 of the substrate 200 comprises a porous semiconductor material, and the protrusions 2704 are wholly or partially defined by the porous semiconductor material. In some embodiments, a porous semiconductor layer is formed on the second side 506 of the substrate 200 that comprises a porous semiconductor material, and the protrusions 2704 are wholly or partially defined by the porous semiconductor material. In some embodiments, the combination of the porous semiconductor material and the protrusions 2704 results in an absorption enhancement structure having a direct energy band gap that enhances the quantum efficiency of the photodiode 500. Other arrangements or configurations of the protrusions 2704 are within the scope of the present disclosure.

Figure 28:
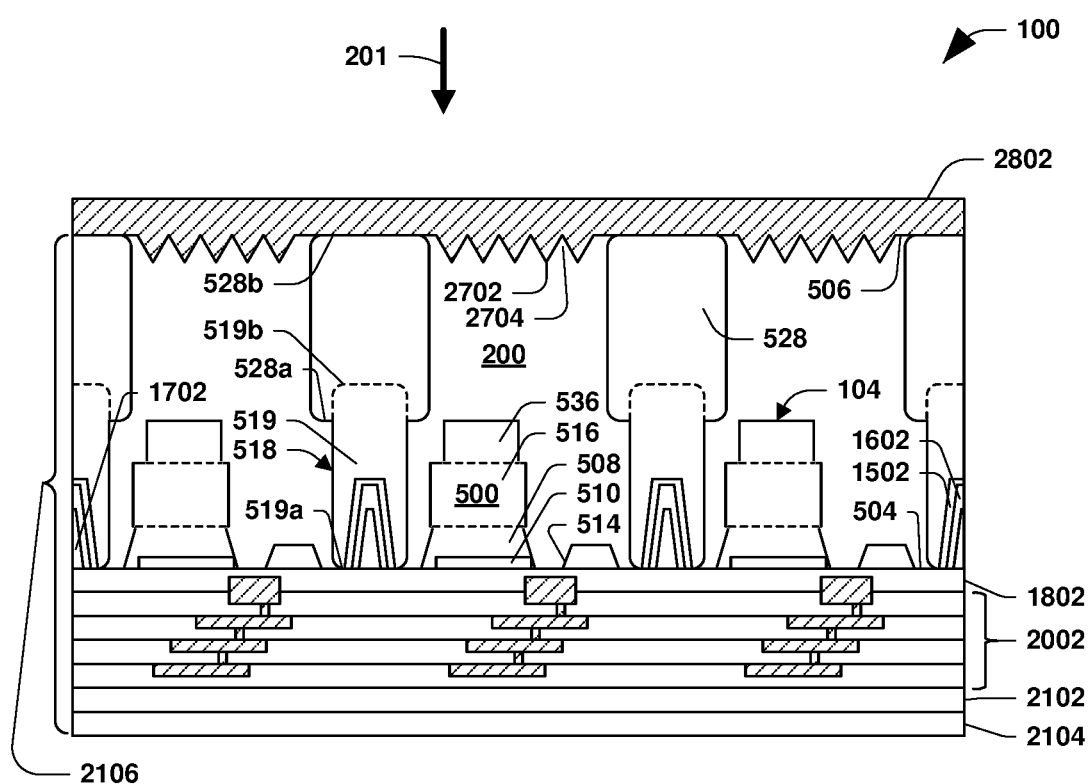

FIG. 28 illustrates the semiconductor arrangement 100 at a stage of fabrication with removal of the fourth patterned mask layer 2602 and formation of a third dielectric layer 2802, according to some embodiments. The fourth patterned mask layer 2602 is removed after the recesses 2702 are formed. The fourth patterned mask layer 2602 is removed using a process akin to a process used for removal of the first patterned mask layer 802 set forth above with reference to FIG. 11. The third dielectric layer 2802 comprises at least one of $Si_3N_4$, $SiO_2$, SiO, MgO, $Al_2O_3$, $Yb_2O_3$, ZnO, $Ta_2O_5$, $ZrO_2$, $HfO_2$, $TeO_2$, $TiO_2$, or other suitable material. In some embodiments, the third dielectric layer 2802 comprises a material that is substantially transparent to wavelengths of radiation to be detected by the photodiode array 104, such as NIR wavelengths and optical wavelengths. The third dielectric layer 2802 is formed by at least one of PVD, sputtering, CVD, LPCVD, ALCVD, UHVCVD, RPCVD, ALD, MBE, LPE, spin on, growth, or other suitable techniques. In some embodiments, the third dielectric layer 2802 is in direct contact with at least one of the second side 506 of the substrate 200, the recesses 2702 in the substrate 200, or the protrusions 2704 defined by the recesses 2702. In some embodiments, the third dielectric layer 2802 is in indirect contact with at least one of the second side 506 of the substrate 200, the recesses 2702 in the substrate 200, or the protrusions 2704 defined by the recesses 2702. Other structures and/or configurations of the third dielectric layer 2802 are within the scope of the present disclosure.

Figure 29:
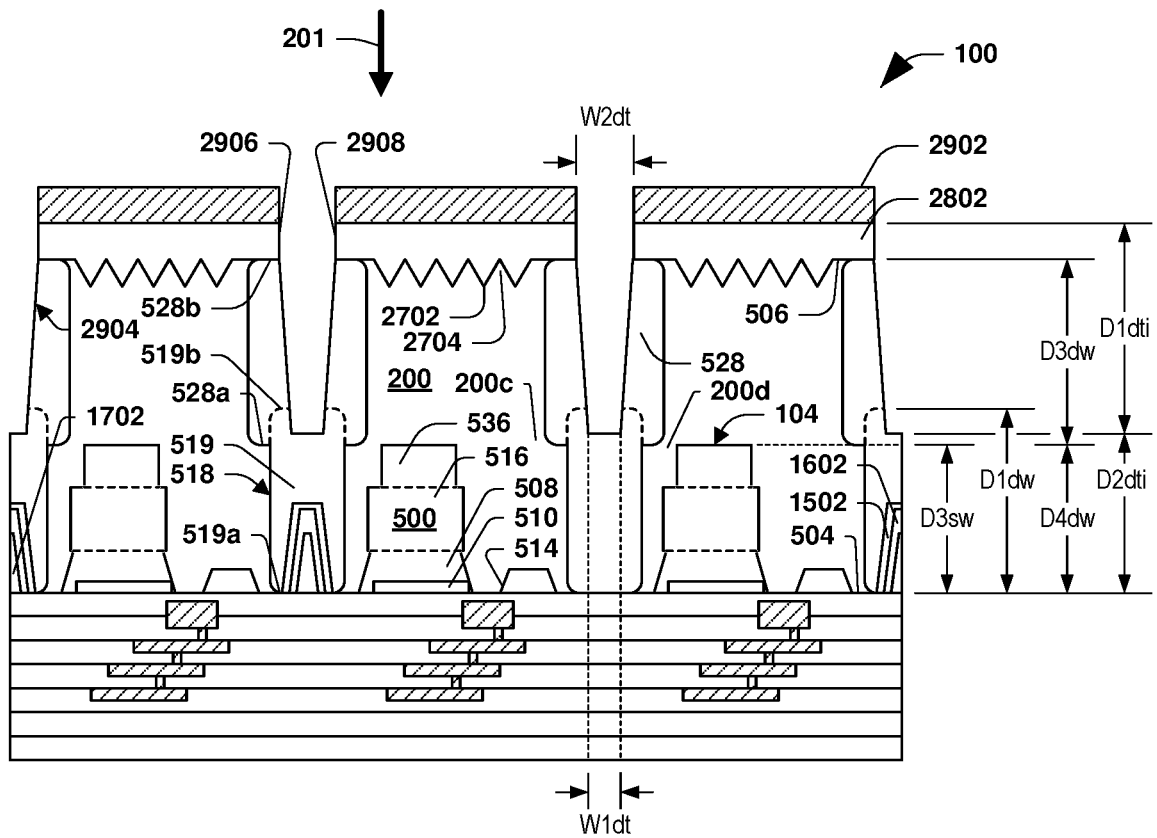

FIG. 29 illustrates the semiconductor arrangement 100 at a stage of fabrication with the formation of a fourth patterned mask layer 2902 and formation of a deep trench 2904, according to some embodiments. The formation of the fourth patterned mask layer 2902 is formed using a process akin to a process used for formation of the first patterned mask layer 802 set forth above with reference to FIG. 8. The formation of the deep trench 2904 is formed using an etching process akin to an etching process for the formation of the shallow trench 1302 set forth above with reference to FIG. 13. The etching process for the deep trench 2904 is at least one of a dry etching process, a wet etching process, an anisotropic etching process, an isotropic etching process, or another suitable etching process. The etching process uses at least one of an etching material of HF, diluted HF, $HCl_2$, $H_2S$, or other suitable material. When compared to the formation of the shallow trench 1302, the formation of the deep trench 2904 provides a deeper trench, and uses one or more of at least a longer duration of the etching process, a higher concentration of the etching material, a different type of etching material, a higher pressure of etching material, or a higher applied bias voltage. Other processes and/or techniques for forming the fourth patterned mask layer 2902 and the deep trench 2904 are within the scope of the present disclosure.

In some embodiments, the deep trench 2904 extends through the third dielectric layer 2802 and the substrate 200 and into the isolation structure 518. According to some embodiments, the deep trench 2904 extends into at least one of the second well 528 or the first well 519. In some embodiments, the deep trench 2904 extends past the second side 528b of the second well 528. In some embodiments, the deep trench 2904 extends past the second side 519b of the second well 528. In some embodiments, the deep trench 2904 extends into a portion of overlap between the first well 519 and the second well 528. Other structures and/or configurations of the deep trench 2904 are within the scope of the present disclosure.

In some embodiments, the deep trench 2904 is at least one of laterally offset from the photodiode 500 or between two photodiodes of the photodiode array 104. In some embodiments, the deep trench 2904 is between two adjacent photodiodes of the photodiode array 104, a third portion 200c of the substrate 200 separates the deep trench 2904 from a first photodiode of two adjacent photodiodes of the photodiode array 104, and a fourth portion 200d of the substrate 200 separates the deep trench 2904 from a second photodiode of the two adjacent photodiodes of the photodiode array 104. In some embodiments, an etching process is performed to form the deep trench 2904, where openings in the fourth patterned mask layer 2902 allow one or more etchants applied during the etching process to remove portions of the substrate 200 while the fourth patterned mask layer 2902 protects or shields portions of the substrate 200 that are covered by the fourth patterned mask layer 2902. The etching process is at least one of an etching process for formation of the shallow trench 1302 set forth above with reference to FIG. 13. Other structures and/or configurations for forming the deep trench 2904 are within the scope of the present disclosure.

A portion of the substrate 200 defining the deep trench 2904 has a ninth sidewall 2906 and a tenth sidewall 2908. In some embodiments, at least one of at least some of the ninth sidewall 2906 is tapered or at least some of the tenth sidewall 2908 is tapered. With reference to the second side 506 of the substrate 505, the ninth sidewall 2906 has a ninth slope, such as a negative slope, and the tenth sidewall 2908 has a tenth slope, such as a positive slope. In some embodiments, the tenth slope is opposite in polarity relative to the ninth slope. In some embodiments, a cross-sectional area of the deep trench 2904 decreases along the direction of projected radiation 201, such that a width of an upper portion of the deep trench 2904 is greater than a width of a lower portion of the deep trench 2904. In some embodiments, at least some of a sidewall defining the deep trench 2904, such as at least some of the ninth sidewall 2906 or at least some of the tenth sidewall 2908, extends vertically, such as in a direction parallel to the direction of projected radiation 201. The deep trench 2904 has a minimum width W1dt and a maximum width W2dt. In some embodiments, the deep trench 2904 is tapered from the maximum width W2dt to the minimum width W1dt in the direction of projected radiation 201. Other structures and/or configurations of the deep trench 2904 are within the scope of the present disclosure.

Figure 30:
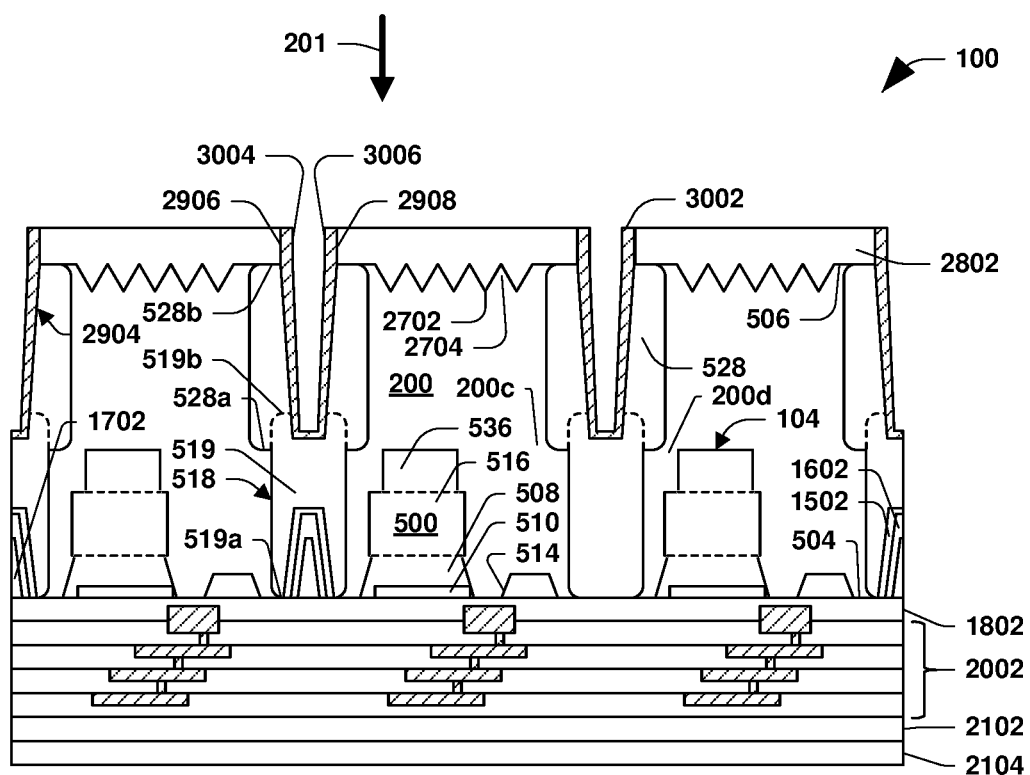

FIG. 30 illustrates the semiconductor arrangement 100 at a stage of fabrication with formation of a second barrier layer 3002 formed in the deep trench 2904 of the substrate 200 and with removal of the fourth patterned mask layer 2902, according to some embodiments. The second barrier layer 3002 is formed using a process akin to a process used for formation of the first barrier layer 1502 set forth above with reference to FIG. 15. The fourth patterned mask layer 2902 is removed using a process akin to a process used for removal of the first patterned mask layer 802 set forth above with reference to FIG. 11.

In some embodiments, the second barrier layer 3002 is in direct contact with at least one of the third dielectric layer 2802 or the second side 506 of the substrate 200, such as the ninth sidewall 2906 or the tenth sidewall 2908 defining the deep trench 2904. In some embodiments, the second barrier layer 3002 is in indirect contact with the surface along the second side 506 of the substrate 200. In some embodiments, formation of the second barrier layer 3002 is followed by planarizing a surface along the second side 506 of the substrate 200 of the deposited material. Other structures and/or configurations of the second barrier layer 3002 relative to other elements, features, etc. are within the scope of the present disclosure.

A first portion of the second barrier layer 3002 is in the deep trench 2904. The first portion of the second barrier layer 3002 has an eleventh sidewall 3004 with which the ninth sidewall 2906 of the deep trench 2904 aligns. The first portion of the second barrier layer 3002 in the deep trench 2904 has a twelfth sidewall 3006 with which the tenth sidewall 2908 of the deep trench 2904 aligns. Other structures and/or configurations of the second barrier layer 3002 relative to other elements, features, etc. are within the scope of the present disclosure.

According to some embodiments, a fourth dielectric layer (not shown) is formed over the second barrier layer 3002 using a process akin to a process used for formation of the first dielectric layer 1602 set forth above with reference to FIG. 16. In some embodiments, the fourth dielectric layer (not shown) is formed over the second barrier layer 3002 and in the deep trench 2904. In some embodiments, the fourth dielectric layer (not shown) is in direct contact with the second barrier layer 3002. In some embodiments, the fourth dielectric layer (not shown) is in indirect contact with the second barrier layer 3002. The second barrier layer 3002 is between the fourth dielectric layer (not shown) and the substrate 200. Other structures and/or configurations of the fourth dielectric layer (not shown) relative to other elements, features, etc. are within the scope of the present disclosure.

Figure 31:
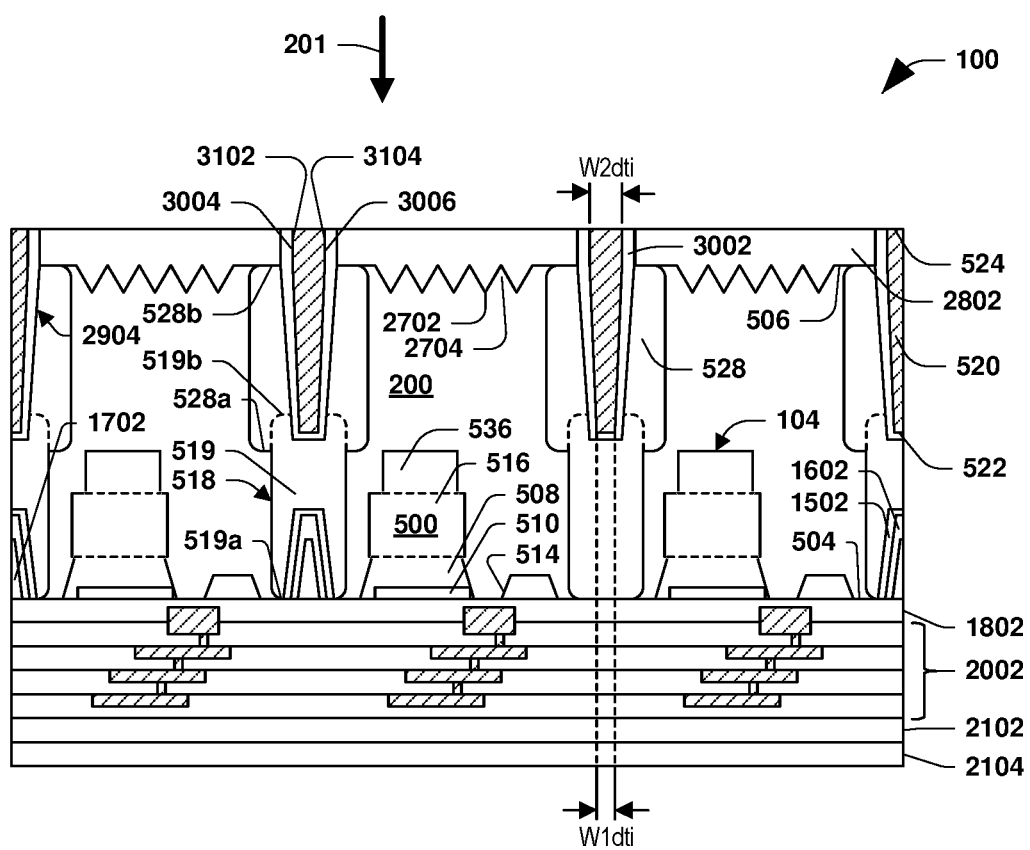

FIG. 31 illustrates the semiconductor arrangement 100 at a stage of fabrication with formation of the deep trench isolation 520, according to some embodiments. The deep trench isolation 520 is formed over the second barrier layer 3002 and in the deep trench 2904. In some embodiments, the deep trench isolation 520 is in direct contact with the second barrier layer 3002. In some embodiments, the deep trench isolation 520 is in indirect contact with the second barrier layer 3002, such as with contact with the fourth dielectric layer (not shown). The second barrier layer 3002 is between the deep trench isolation 520 and at least one of the deep trench isolation 520, the fourth dielectric layer (not shown), or the substrate 200. Other structures and/or configurations of the deep trench isolation 520 relative to other elements, features, etc. are within the scope of the present disclosure.

The deep trench isolation 520 comprises at least one of silicon dioxide, silicon nitride, silicon oxynitride, hafnium oxide, fluorinated silica glass (FSG), a metal such as aluminum or copper, a metal compound, a metal mixture, or other suitable material. The deep trench isolation 520 is formed by at least one of PVD, sputtering, CVD, LPCVD, ALCVD, UHVCVD, RPCVD, ALD, MBE, LPE, spin on, growth, or other suitable techniques. In some embodiments, formation of the deep trench isolation 520 is followed by planarizing a top surface of the deposited material. Other structures and/or configurations of the deep trench isolation 520 are within the scope of the present disclosure.

A first portion of the deep trench isolation 520 is in the deep trench 2904. The first portion of the deep trench isolation 520 has a thirteenth sidewall 3102 with which the eleventh sidewall 3004 aligns. The first portion of the deep trench isolation 520 has a fourteenth sidewall 3104 with which the twelfth sidewall 3006 aligns. In some embodiments, at least one of at least some of the thirteenth sidewall 3102 is tapered or at least some of the fourteenth sidewall 3104 is tapered. The thirteenth sidewall 3102 has a thirteenth slope, such as a negative slope, and the fourteenth sidewall 3104 has a fourteenth slope, such as a positive slope. In some embodiments, the fourteenth slope is opposite in polarity relative to the thirteenth slope. In some embodiments, a cross-sectional area of the deep trench isolation 520 decreases along the direction of projected radiation 201, such that a width of an upper portion of the deep trench isolation 520 is greater than a width of a lower portion of the deep trench isolation 520. In some embodiments, at least some of the sidewall defining the deep trench isolation 520, such as at least some of at least one of the thirteenth sidewall 3102 or the fourteenth sidewall 3104, extends vertically, such as in a direction parallel to the direction of projected radiation 201. In some embodiments, the deep trench isolation 520 has a maximum width W2dti and a minimum width W1dti. In some embodiments, the deep trench isolation 520 is tapered from the maximum width W2dti to the minimum width W1dti in the direction of projected radiation 201. In some embodiments, the deep trench isolation 520 provides one of a reduction or an elimination of optical cross-talk, where an optical signal is produced from incident radiation that passes between adjacent photodiodes. Other structures and/or configurations of the deep trench isolation 520 relative to other elements, features, etc. are within the scope of the present disclosure.

Figure 32:
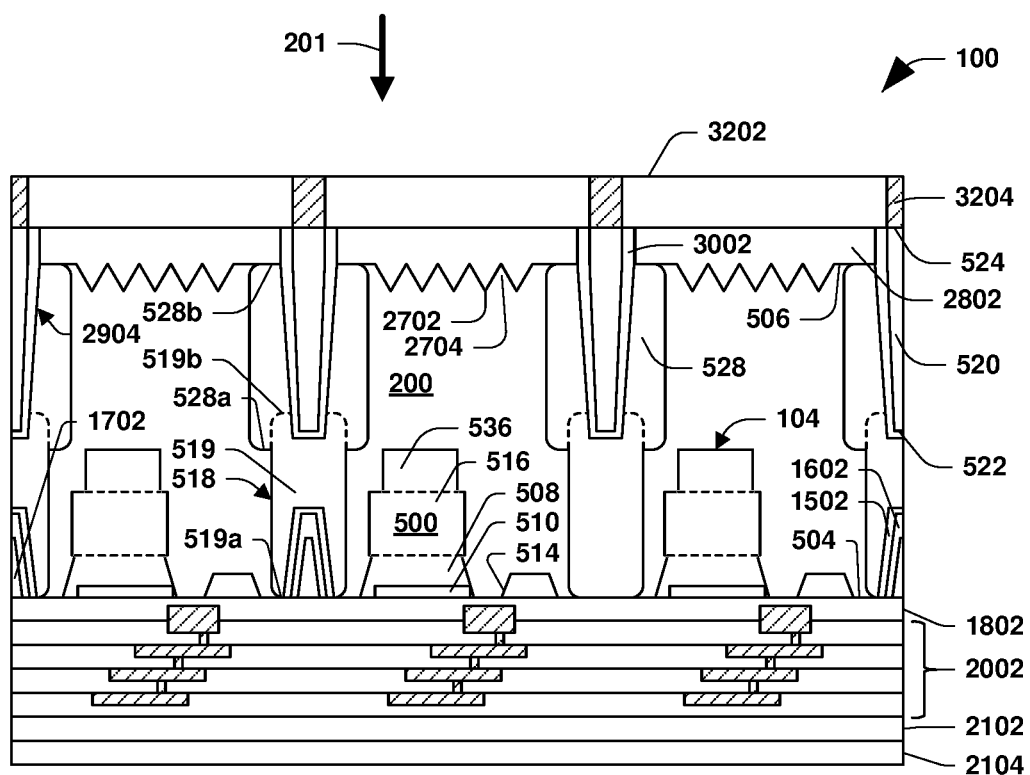

FIG. 32 illustrates the semiconductor arrangement 100 at a stage of fabrication with formation of a third barrier layer 3202 and formation of a metal grid 3204, according to some embodiments. The third barrier layer 3202 is formed using a process akin to a process used for formation of the first barrier layer 1502 set forth above with reference to FIG. 15. The third barrier layer 3202 defines openings for the formation of the metal grid 3204. The metal grid 3204 is formed over the deep trench isolation 520 and over the deep trench 2904. In some embodiments, the metal grid 3204 is in direct contact with at least one of the deep trench isolation 520, the second barrier layer 3002, the fourth dielectric layer (not shown), the substrate 200, or the third dielectric layer 2802. In some embodiments, the metal grid 3204 and the deep trench isolation 520 are contiguous or form the same structure. Other structures and/or configurations of the metal grid 3204 relative to other elements, features, etc. are within the scope of the present disclosure.

The metal grid 3204 is laterally arranged around and between photodiodes of the photodiode array 104 and defines openings for the transmission of incident radiation to the photodiode array 104. The metal grid 3204 blocks incident radiation from passing between neighboring photodiodes of the photodiode array 104 near an upper surface of the substrate 200, as well as above and below the upper surface, to help reduce cross talk. Therefore, the metal grid 3204 defines a substrate isolation grid or otherwise forms a part of a substrate isolation grid. In some embodiments, the metal grid 3204 is made of a reflective material such as a metal material. The metal grid 3204 may be, for example, aluminum, silver, copper, titanium, platinum, tungsten, tantalum, tantalum nitride, other suitable materials, or a combination thereof. In some embodiments, the metal grid 3204 is a reflective layer and is deposited using a suitable deposition process. The suitable deposition process includes, for example, a PVD process, an electroplating process, a CVD process, other applicable processes, or a combination thereof. Afterwards, the metal grid 3204 is patterned using, for example, a photolithography process and an etching process to form reflective elements. Other techniques for forming the metal grid 3204 are within the scope of the present disclosure.

Figure 33:
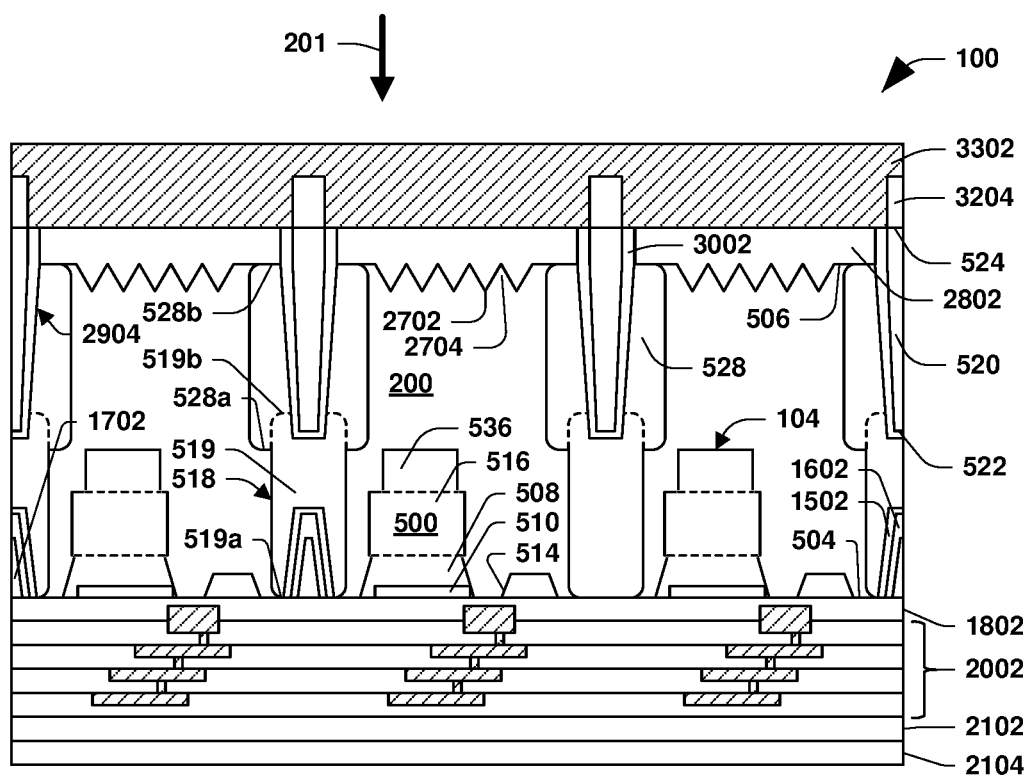

FIG. 33 illustrates the semiconductor arrangement 100 at a stage of fabrication with formation of a second oxide layer 3302, according to some embodiments. The second oxide layer 3302 is formed over at least one of the deep trench isolation 520, the metal grid 3204, the second barrier layer 3002, the fourth dielectric layer (not shown), the third dielectric layer 2802, or the substrate 200. In some embodiments, the second oxide layer 3302 is in direct contact with at least one of the deep trench isolation 520, the metal grid 3204, the second barrier layer 3002, the fourth dielectric layer (not shown), the third dielectric layer 2802, or the substrate 200. In some embodiments, the second oxide layer 3302 is at least one of contiguous with the third barrier layer 3202, formed on the third barrier layer 3202, or the same structure as the third barrier layer 3202. In some embodiments, the second oxide layer 3302 is formed using a process akin to a process used for formation of the first oxide layer 2104 set forth above with reference to FIG. 21. Other structures and/or configurations of the second oxide layer 3302 and the third barrier layer 3202 are within the scope of the present disclosure.

Figure 34:
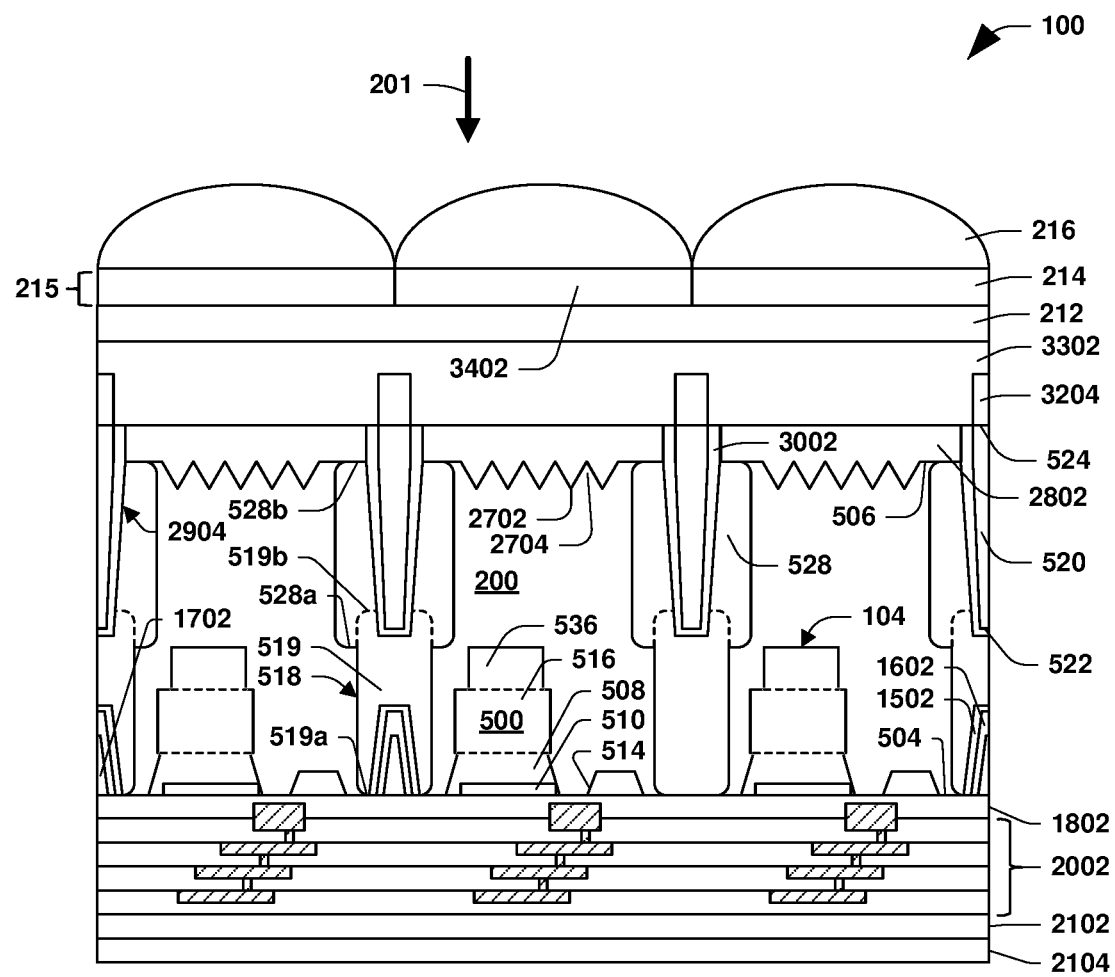

FIG. 34 illustrates the semiconductor arrangement 100 at a stage of fabrication with formation of the ARC layer 212, the radiation filter layer 214, and the micro-lens array 216, according to some embodiments. The ARC layer 212 is arranged over the photodiode array 104. The ARC layer 212 is formed over at least one of the second oxide layer 3302, the metal grid 3204, the deep trench isolation 520, the second barrier layer 3002, the fourth dielectric layer (not shown), the third dielectric layer 2802, or the substrate 200. In some embodiments, the ARC layer 212 is in direct contact with at least one of the second oxide layer 3302, the metal grid 3204, the deep trench isolation 520, the second barrier layer 3002, the fourth dielectric layer (not shown), the third dielectric layer 2802, or the substrate 200. In some embodiments, the ARC layer 212 is in indirect contact with at least one of the second oxide layer 3302, the metal grid 3204, the deep trench isolation 520, the second barrier layer 3002, the fourth dielectric layer (not shown), the third dielectric layer 2802, or the substrate 200. In some embodiments, the ARC layer 212 is at least one of contiguous with the second oxide layer 3302, formed on the second oxide layer 3302, or the same structure as the second oxide layer 3302. In some embodiments, the ARC layer 212 is formed by at least one of PVD, sputtering, CVD, LPCVD, ALCVD, UHVCVD, RPCVD, ALD, MBE, LPE, spin on, growth, or other suitable techniques.

According to some embodiments, the radiation filter layer 214 is arranged and formed over the ARC layer 212. The radiation filter layer 214 comprises a radiation filter 3402 of the plurality of radiation pass filters 215. The radiation filter 3402 corresponds to at least one of the NIR pass filter 218, the red pass filter 220, the green pass filter 222, the blue pass filter 224, or the white pass filter 226 set forth above with reference to FIG. 2. The radiation filter layer 214 at least one of overlies the ARC layer 212, is in direct contact with a top surface of the ARC layer 212, or is in indirect contact with the top surface of the ARC layer 212. The radiation filter 3402 comprises at least one of a pigment-dispersed color resist (PDCR) material, a photosensitive substance, a photoinitiator substance, a multifunctional monomer, one or more additives, a leveling agent, an adhesion promotor, a resin, a polymer soluble in alkaline solution, a color paste, a pigment, a dispersant, a solvent, or other suitable material. The radiation filter 3402 passes certain wavelengths of radiation. In some embodiments, different portions of the radiation filter 3402 have different material compositions to enable different wavelengths to be passed. The NIR pass filter 218 has an NIR pass material composition and passes NIR wavelengths, the red pass filter 220 has a red pass material composition and passes red wavelengths, the green pass filter 222 has a green pass material composition and passes green wavelengths, the blue pass filter 224 has a blue pass material composition and passes blue wavelengths, and the white pass filter 226 has a white pass material composition and passes white wavelengths. In some embodiments, the radiation filter 3402 comprises multiple radiation filter layers on top of each other. In some embodiments, a first radiation filter layer of the multiple radiation filter layers corresponds to the NIR pass filter 218. In some embodiments, a second radiation filter layer of the multiple radiation filter layers is an optical pass filter that corresponds to at least one of the red pass filter 220, the green pass filter 222, the blue pass filter 224, or the white pass filter 226. In some embodiments, the second radiation filter layer overlies the first radiation filter layer. In some embodiments, the first radiation filter layer overlies the second radiation filter layer. The radiation filter layer 214 is formed by at least one of PVD, sputtering, CVD, LPCVD, ALCVD, UHVCVD, RPCVD, ALD, MBE, LPE, spin on, growth, or other suitable techniques. At least one of the multiple radiation filter layers, such as at least one of the first radiation filter layer or the second radiation filter layer, has a thickness of less than or equal to about 10,000 angstroms (such as less than or equal to about 5,000 angstroms). Other structures and/or configurations of the radiation filter layer 214 or the radiation filter 3402 are within the scope of the present disclosure.

According to some embodiments, the micro-lens array 216 is arranged over the radiation filter layer 214 and the radiation filter 3402 to steer radiation towards photodiodes of the photodiode array 104. Lenses of the micro-lens array 216 are at least one of micro-lenses or other suitable lenses. In some embodiments, the micro-lens array 216 comprises at least one micro-lens of the plurality of micro-lenses 216a-216e. In some embodiments, at least one micro-lens of the micro-lens array 216 is at least one of the micro-lens 216a configured to transmit radiation through the NIR pass filter 218 to the photodiode 202a, the micro-lens 216b configured to transmit radiation through the red pass filter 220 to the photodiode 202b, the micro-lens 216c configured to transmit radiation through the green pass filter 222 to the photodiode 202c, the micro-lens 216d configured to transmit radiation through the blue pass filter 224 to the photodiode 202d, or the micro-lens 216d configured to transmit radiation through the white pass filter 226 to the photodiode 202e. Other arrangements and/or configurations of the micro-lens array 216 are within the scope of the present disclosure In some embodiments, one or more lenses of the micro-lens array 216 overlie at least one of the radiation filter 3402, the radiation filter layer 214, the ARC layer 212, the second oxide layer 3302, the metal grid 3204, the deep trench isolation 520, the second barrier layer 3002, the fourth dielectric layer (not shown), the third dielectric layer 2802, or the substrate 200. In some embodiments, one or more lenses of the micro-lens array 216 is in direct contact with at least one of the radiation filter 3402, the radiation filter layer 214, the ARC layer 212, the second oxide layer 3302, the metal grid 3204, the deep trench isolation 520, the second barrier layer 3002, the fourth dielectric layer (not shown), the third dielectric layer 2802, or the substrate 200. In some embodiments, one or more lenses of the micro-lens array 216 is in indirect contact with at least one of the radiation filter 3402, the radiation filter layer 214, the ARC layer 212, the second oxide layer 3302, the metal grid 3204, the deep trench isolation 520, the second barrier layer 3002, the fourth dielectric layer (not shown), the third dielectric layer 2802, or the substrate 200. Other arrangements and/or configurations of the micro-lens array 216 are within the scope of the present disclosure.

In some embodiments, the micro-lens array 216 comprises a lens substrate. The lens substrate comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. The lens substrate is formed by at least one of PVD, sputtering, CVD, LPCVD, ALCVD, UHVCVD, RPCVD, ALD, MBE, LPE, spin on, growth, or other suitable techniques. In some embodiments, the micro-lens array 216 is formed by at least one of thermal reflow, microplastic embossing, microdroplet jetting, photolithography, reactive ion etching, machining, or other suitable methods. Other structures and/or configurations of the micro-lens array 216 are within the scope of the present disclosure.

Figure 35A:
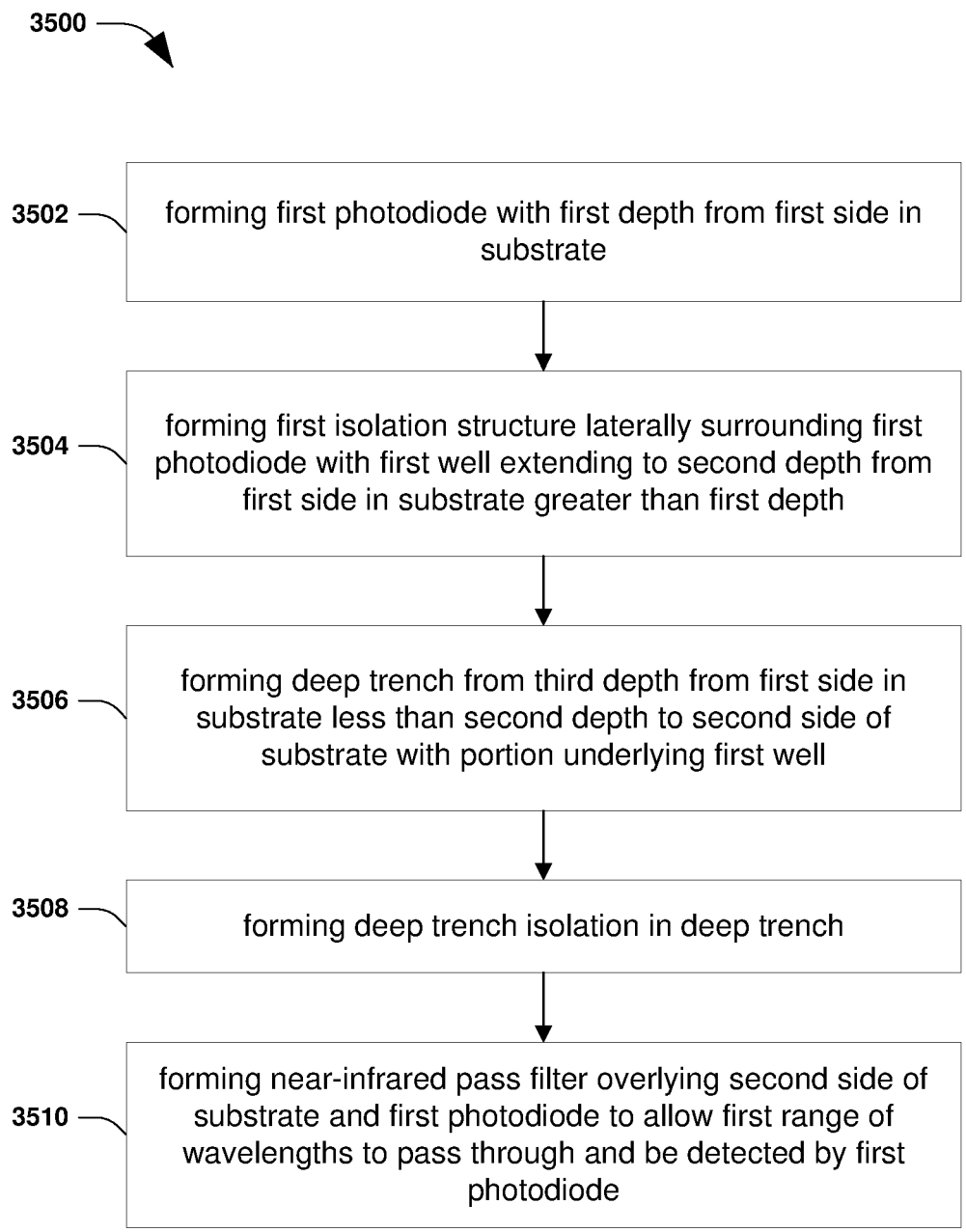
FIGS. 35A and 35B illustrate a method of making a semiconductor arrangement, according to some embodiments.
Figure 35B:
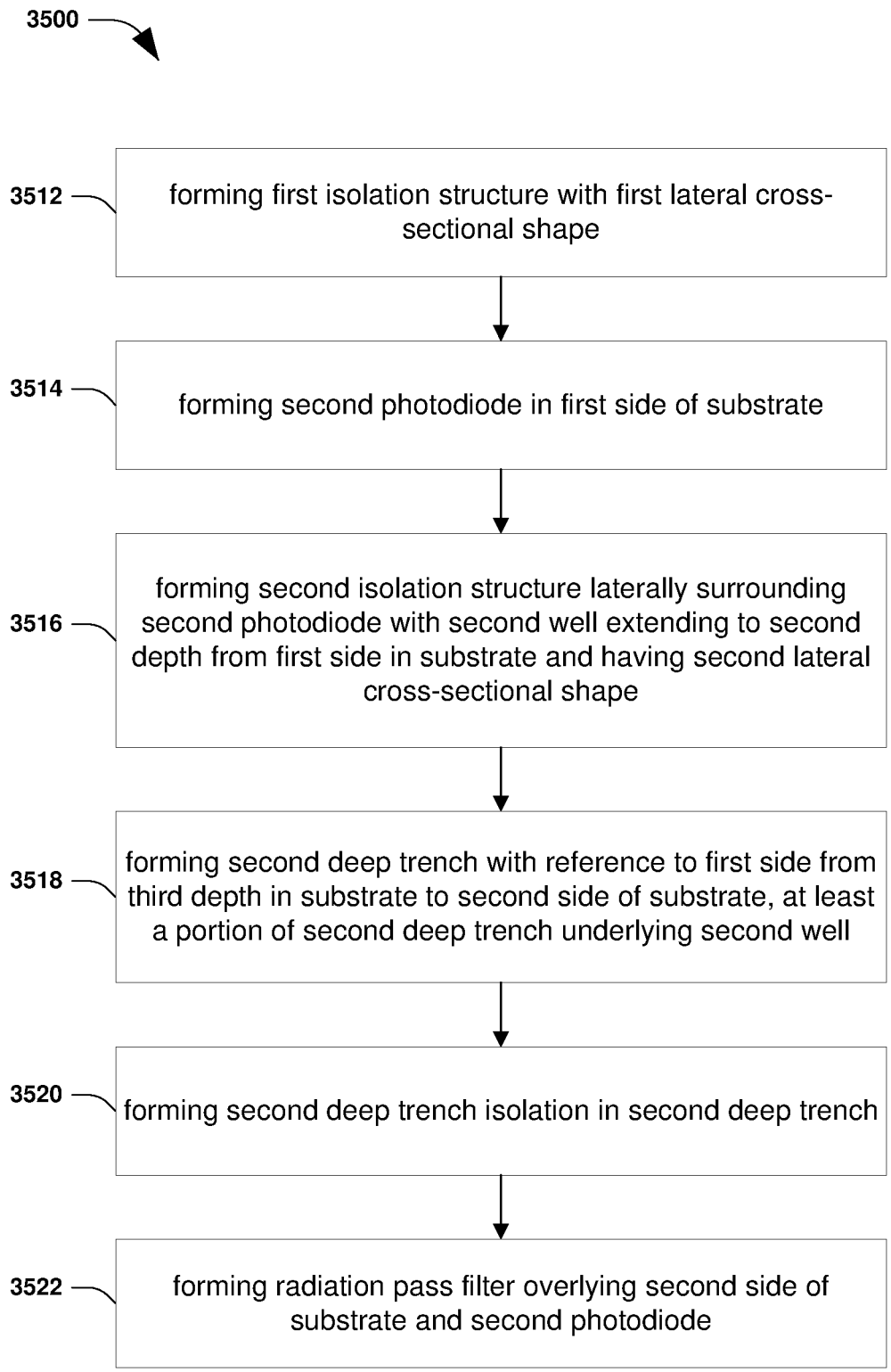

FIGS. 35A and 35B illustrate a method 3500 of making a semiconductor arrangement, according to some embodiments. While the process of FIGS. 35A and 35B is applicable to many different systems, devices, components, arrangements, structures, and/or configurations, it is described with reference to FIGS. 1-34 for ease of understanding. The illustrated method 3500 is merely an example method. Therefore, it should be understood that any of a variety of operations may be omitted, re-sequenced, and/or added while remaining within the scope of the present disclosure. As illustrated in FIG. 35A, the method 3500 comprises, at 3502, forming a first photodiode with a first depth from a first side in a substrate. For example, in FIG. 5A and FIG. 6, the photodiode 500 can be in the form of the first photodiode 108f of FIG. 1E. The photodiode 500 can be formed in various examples with at least one of the charge storage well 508, the first deep storage well section 516, or the second deep storage well section 536. With respect to the first side 504 of the substrate 200, the charge storage well 508 has the storage well depth $D1sw$, the first deep storage well section 516 has the deep storage well depth $D2sw$, and the second deep storage well section 536 has the deep storage well depth $D3sw$.

At 3504, the method 3500 comprises forming a first isolation structure laterally surrounding the first photodiode, wherein the first isolation structure comprises a first well extending to a second depth from the first side in the substrate greater than the first depth. For example, in FIG. 5A and FIG. 9, the isolation structure 518 (e.g., including the first well 519) can be in the form of the first isolation structure 116f of FIG. 1E and can laterally surround the photodiode 500. With respect to the first side 504 of the substrate 200 at least one of, the deep well depth $D1dw$ of the first well 519 can be greater than the storage well depth $D1sw$ of the charge storage well 508, the deep storage well depth $D2sw$ of the first deep storage well section 516, or the deep storage well depth $D3sw$ of the second deep storage well section 536.

At 3506, the method 3500 comprises forming a deep trench from a third depth from the first side in the substrate less than the second depth to the second side of the substrate, and wherein at least a portion of the deep trench underlies the first well. For example, in FIG. 29, the deep trench 2904 can be formed using an etching process to etch into the second side 506 of the substrate 200 opposite to the first side 504 of the substrate 200. In FIG. 5A and FIG. 29, with respect to the first side 504 of the substrate 200, the deep trench 2904 can extend into the substrate 200 from the deep trench isolation depth D1*dti*, which can be less than the deep well depth D1*dw* of the first well 519.

At 3508, the method 3500 comprises forming a deep trench isolation in the deep trench. For example, in FIG. 31, the deep trench isolation 520 can be formed over the second barrier layer 3002 and in the deep trench 2904. The deep trench isolation 520 can be in the form of the first isolation structure 116*f* of first subset of isolation structures 114.

At 3510, the method 3500 comprises forming a near-infrared pass filter overlying the second side of the substrate and the first photodiode, wherein the near-infrared pass filter is configured to allow a first range of wavelengths to pass through and be detected by the first photodiode. For example, in FIG. 34, the radiation filter layer 214 can be arranged and formed over the ARC layer 212. The radiation filter layer 214 can include the radiation filter 3402 of the plurality of radiation pass filters 215. The radiation filter 3402 corresponds, for example, to the NIR pass filter 218 illustrated in FIG. 2. With reference to FIG. 3, an NIR range of wavelengths may be from about 750 nm to about 1400 nm or may be from about 780 nm to about 2500 nm. The NIR range of wavelengths may pass through and be detected by the photodiode 500 in the form of the photodiode 202*a* of FIG. 2.

Referring to FIG. 35B, at 3512, the method 3500 comprising forming the first isolation structure with a first lateral cross-sectional shape. For example, in FIG. 1E and FIG. 9, the isolation structure 518 (e.g., including the first well 519) can be in the form of the first isolation structure 116*f* having the octagon shape.

At 3514, the method 3500 comprises forming a second photodiode in the first side of the substrate. For example, in FIG. 5A and FIG. 6, the photodiode 500 can be in the form of the second photodiode 112*d* of FIG. 1J and formed in the first side 504 of the substrate 200.

At 3516, the method 3500 comprises forming a second isolation structure laterally surrounding the second photodiode, wherein the second isolation structure comprises a second well extending to the second depth from the first side in the substrate and has a second lateral cross-sectional shape. For example, in FIG. 5A and FIG. 9, the isolation structure 518 (e.g., including the first well 519) can be in the form of the second isolation structure 124*d* of FIG. 1J and can laterally surround the photodiode 500. With respect to the first side 504 of the substrate 200, the first well 519 can have the deep well depth D1*dw*. In FIG. 1J and FIG. 9, the isolation structure 518 (e.g., including the first well 519) can be in the form of the second isolation structure 124*d* having the diamond shape.

At 3518, the method 3500 comprises performing the etch into the second side of the substrate to form a second deep trench, wherein the second deep trench extends, with reference to the first side, from the third depth in the substrate to the second side of the substrate, and wherein at least a portion of the second deep trench underlies second well. For example, in FIG. 29, the deep trench 2904 can be formed using an etching process into the second side 506 of the substrate 200 opposite to the first side 504 of the substrate 200. In FIG. 5A and FIG. 29, with respect to the first side 504 of the substrate 200, the deep trench 2904 can extend into the substrate 200 from the deep trench isolation depth D2*dti* to the second side 506 of the substrate 200.

At 3520, the method 3500 comprises forming a second deep trench isolation in the second deep trench. For example, in FIG. 31, the deep trench isolation 520 can be formed over the second barrier layer 3002 and in the deep trench 2904. The deep trench isolation 520 can be in the form of the second isolation structure 124*d* of the second subset of isolation structures 122.

At 3522, the method 3500 comprises forming a radiation pass filter overlying the second side of the substrate and the second photodiode, the radiation pass filter comprising one of a first radiation pass filter, a second radiation pass filter, or a third radiation pass filter. For example, the radiation pass filter can include at least one of an NIR pass filter (e.g., the NIR pass filter 218) or an optical pass filter (e.g., the red pass filter 220, the green pass filter 222, the blue pass filter 224, or the white pass filter 226).

Figure 36:
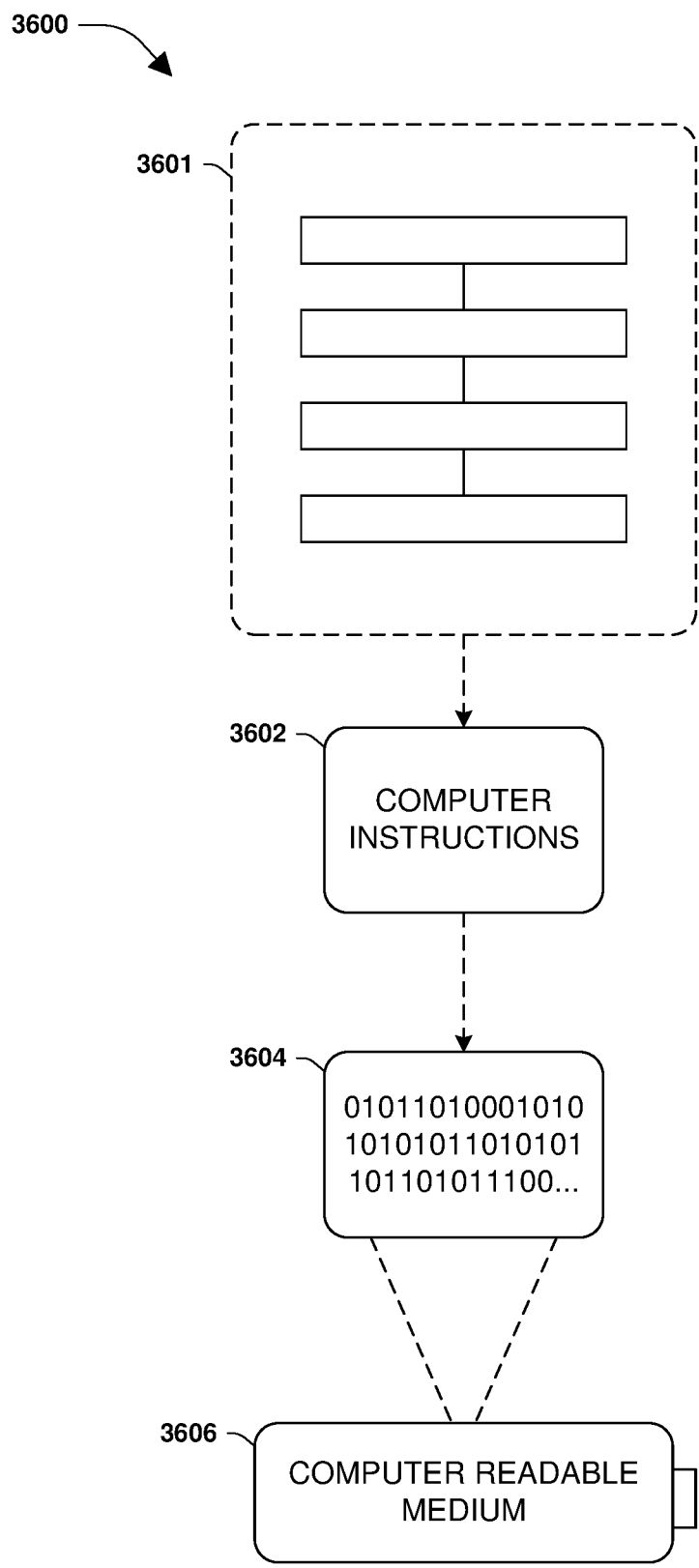
FIG. 36 illustrates an exemplary computer-readable medium, according to some embodiments.

FIG. 36 illustrates an implementation 3600 of an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 36 wherein the implementation 3600 comprises a computer-readable medium 3606 (e.g., a CD-R, DVD-R, flash drive, a platter of a hard disk drive, etc.), on which is encoded computer-readable data 3604. This computer-readable data 3604 in turn comprises a set of processor-executable computer instructions 3602 that when executed are configured to facilitate operations according to one or more of the principles set forth herein. In some embodiments, the processor-executable computer instructions 3602 are configured to facilitate performance of a method 3601, such as at least some of the aforementioned method(s). In some embodiments, the processor-executable computer instructions 3602 are configured to facilitate implementation of a system, such as at least some of the one or more aforementioned system(s). Many such computer-readable media may be devised by those of ordinary skill in the art that are configured to operate in accordance with the techniques presented herein.

By implementing the semiconductor arrangement 100 set forth above, in some embodiments, the first subset of photodiodes 106 may be resized with respect to the second subset of photodiodes 110. In an example, when the first subset of photodiodes 106 are optical image sensors and the second subset of photodiodes 110 are NIR image sensors, the optical image sensors may be resized to provide enhanced quality and/or resolution for each pixel of the optical image. In this case, the NIR image sensors may detect an NIR image corresponding to the optical image, and the NIR image may be used to enhance the optical image. In another example, the NIR image may convey more important information than the optical image. The NIR image may detect, for example, that a subject, such as produce, contains a defect, such as bruising or spoilage, that relates to quality of the subject. In this case, the NIR image may provide greater value, and the NIR image sensors may be resized to provide enhanced quality and/or resolution for each pixel of the NIR image. In another example, when the first subset of photodiodes 106 are NIR image sensors and the second subset of photodiodes 110 are optical image sensors, the first subset of photodiodes 106 may be larger than the second subset of photodiodes 110 to provide an enhanced NIR image.

By implementing the semiconductor arrangement 100 set forth above, in some embodiments, the first subset of photodiodes 106 are laterally surrounded by the first subset of isolation structures 114, such that the dimensions of the first subset of isolation structures 114 define the size of the first subset of photodiodes 106. Likewise, the second subset of photodiodes 110 are laterally surrounded by the second subset of isolation structures 122 such that the dimensions of the first subset of isolation structures 114 define the size of the first subset of photodiodes 106. The first subset of isolation structures 114 may be resized with respect to the second subset of isolation structures 122 such that the each photodiode of the first subset of photodiodes 106 has a greater dimension than each photodiodes of the second subset of photodiodes 110 to provide enhanced quality and/or resolution for each pixel of the first subset of photodiodes 106.

By implementing the semiconductor arrangement 100 set forth above, in some embodiments, the first subset of isolation structures 114 may be resized with a predetermined shape, such as an octagon shape, and the second subset of isolation structures 122 may be resized with a predetermined shape, such as a diamond shape. The octagon shape and the diamond shape permit greater precision in resizing of the first subset of isolation structures 114 and the second subset of isolation structures 122 when compared to a rectangular grid array of isolation structures. The first subset of isolation structures 114 may be resized with respect to the second subset of isolation structures 122 such that the each photodiode of the first subset of photodiodes 106 has a greater dimension than each photodiodes of the second subset of photodiodes 110 to provide enhanced quality and/or resolution for each pixel of the first subset of photodiodes 106.

In some embodiments, a semiconductor arrangement is provided. The semiconductor arrangement includes a photodiode extending to a first depth from a first side in a substrate. An isolation structure laterally surrounds the photodiode, wherein the isolation structure includes a first well extending to a second depth from the first side in the substrate greater than the first depth. A deep trench isolation extends from a third depth from the first side in the substrate to a fourth depth from the first side in the substrate, wherein at least a portion of the deep trench isolation underlies the first well.

In some embodiments, a semiconductor arrangement is provided. A photodiode array is provided over a substrate, wherein the photodiode array includes a first photodiode, a second photodiode, and a third photodiode. An isolation structure is disposed between the first photodiode and the second photodiode, wherein the isolation structure surrounds the third photodiode, and the isolation structure includes a first well and a shallow trench isolation at least partially surrounded by the first well. A near-infrared pass filter overlies the second photodiode and is configured to allow a first range of wavelengths to pass through and be detected by the second photodiode.

In some embodiments, a method of making a semiconductor arrangement is provided. The method includes forming a first photodiode with a first depth from a first side in a substrate and forming a first isolation structure laterally surrounding the first photodiode, wherein the first isolation structure comprises a first well extending to a second depth from the first side in the substrate greater than the first depth. The method also includes performing an etch into a second side in the substrate opposite the first side to form a deep trench, wherein the deep trench extends from a third depth from the first side in the substrate less than the second depth to the second side of the substrate, and wherein at least a portion of the deep trench underlies the first well. The method also includes forming a deep trench isolation in the deep trench and forming a near-infrared pass filter overlying the second side of the substrate and the first photodiode, wherein the near-infrared pass filter is configured to allow a first range of wavelengths to pass through and be detected by the first photodiode.

In some embodiments, the method of making the semiconductor arrangement further includes forming the first isolation structure with a first lateral cross-sectional shape, and forming a second photodiode from the first side of the substrate. The method further includes forming a second isolation structure laterally surrounding the second photodiode, wherein the second isolation structure comprises a second well extending to the second depth from the first side in the substrate and has a second lateral cross-sectional shape. The method further includes forming a radiation pass filter overlying the second side of the substrate and the second photodiode. The radiation pass filter includes one of a first radiation pass filter configured to allow a first radiation pass range of wavelengths to pass through and be detected by the second photodiode, a second radiation pass filter configured to allow a second radiation pass range of wavelengths to pass through and be detected by the second photodiode, or a third radiation pass filter configured to allow a third radiation pass range of wavelengths to pass through and be detected by the second photodiode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
 a first photodiode;
 a second photodiode;
 an isolation structure; and
 a near-infrared pass filter overlying the second photodiode, wherein:
  the isolation structure laterally surrounds the first photodiode to separate the first photodiode from the second photodiode,
  the isolation structure comprises a first well and a shallow trench isolation at least partially surrounded by the first well,
  the near-infrared pass filter allows merely wavelengths in a range of 750 nm and 2500 nm to pass through and be detected by the second photodiode,
  the first photodiode has a first lateral cross-sectional diameter,
  the second photodiode has a second lateral cross-sectional diameter different than the first lateral cross-sectional diameter,
  the second photodiode extends to a first depth from a first side in a substrate, and
  the first well extends to a second depth from the first side in the substrate greater than the first depth.

2. The semiconductor arrangement of claim 1, comprising:
 a third photodiode, wherein the isolation structure is disposed between the second photodiode and the third photodiode.

3. The semiconductor arrangement of claim 1, wherein:
 the first photodiode has a first lateral cross-sectional area, and
 the second photodiode has a second lateral cross-sectional area less than the first lateral cross-sectional area.

4. The semiconductor arrangement of claim 1, wherein:
 the first photodiode has a first lateral cross-sectional area, and
 the second photodiode has a second lateral cross-sectional area greater than the first lateral cross-sectional area.

5. The semiconductor arrangement of claim 1, comprising:
 a radiation pass filter overlying the first photodiode and configured to allow a first radiation pass range of wavelengths to pass through and be detected by the first photodiode, the first radiation pass range of wavelengths corresponding to wavelengths within at least a portion of a visible light spectrum.

6. The semiconductor arrangement of claim 1, wherein the semiconductor arrangement comprises a deep trench isolation extending from a second side in the substrate, wherein at least a portion of the deep trench isolation overlaps with the first well.

7. The semiconductor arrangement of claim 6, wherein at least a second portion of the deep trench isolation underlies the first well.

8. The semiconductor arrangement of claim 1, comprising:
 a deep trench isolation, wherein at least a portion of the deep trench isolation underlies the first well.

9. The semiconductor arrangement of claim 1, comprising:
 a deep trench isolation extending from a third depth from the first side in the substrate to a fourth depth from the first side in the substrate, wherein at least a portion of the deep trench isolation underlies the first well.

10. The semiconductor arrangement of claim 9, wherein the third depth is less than the second depth and the first well laterally surrounds the deep trench isolation.

11. A semiconductor arrangement, comprising:
 a first photodiode;
 a near-infrared pass filter overlying the first photodiode, wherein the near-infrared pass filter allows merely wavelengths in a range of 750 nm and 2500 nm to pass through and be detected by the first photodiode;
 an isolation structure laterally surrounding the first photodiode and comprising a first well, a shallow trench isolation, and a second well; and
 a deep trench isolation, wherein:
  a width of the second well is greater than a width of the first well,
  at least a first portion of the deep trench isolation underlies the first well and is surrounded by the second well,
  the deep trench isolation is separated from the shallow trench isolation by the first well,
  the first well laterally surrounds at least a second portion of the deep trench isolation,
  the first photodiode extends to a first depth from a first side in a substrate, and
  the first well extends to a second depth from the first side in the substrate greater than the first depth.

12. The semiconductor arrangement according to claim 11, comprising:
 a second photodiode, wherein the isolation structure and the deep trench isolation are between the first photodiode and the second photodiode.

13. The semiconductor arrangement according to claim 11, wherein the deep trench isolation extends from a third depth from the first side in the substrate to a fourth depth from the first side in the substrate.

14. The semiconductor arrangement of claim 13, wherein the third depth is less than the second depth.

15. A semiconductor arrangement, comprising:
- a first photodiode;
- a near-infrared pass filter overlying the first photodiode, wherein the near-infrared pass filter allows merely wavelengths in a range of 750 nm and 2500 nm to pass through and be detected by the first photodiode;
- an isolation structure laterally surrounding the first photodiode and comprising a shallow trench isolation, a first well, and a second well, wherein:
  - a first portion of the second well overlaps a first portion of the first well,
  - a plane parallel to a top surface of the first photodiode intersects the shallow trench isolation and the first photodiode,
  - the first photodiode extends to a first depth from a first side in a substrate, and
  - the first well extends to a second depth from the first side in the substrate greater than the first depth; and
- a deep trench isolation, wherein a first portion of the deep trench isolation overlaps the first portion of the first well such that a sidewall and a top surface of the deep trench isolation contact the first well and overlap the first portion of the second well such that the first portion of the first well, the first portion of the second well, and the first portion of the deep trench isolation are laterally coincident.

16. The semiconductor arrangement of claim 15, wherein the first photodiode comprises:
- a charge storage well; and
- a deep storage well section below the charge storage well, wherein a width of the deep storage well section is greater than a width of the charge storage well where the charge storage well interfaces with the deep storage well section.

17. The semiconductor arrangement of claim 15, comprising:
- a transfer gate between the first photodiode and the isolation structure.

18. The semiconductor arrangement of claim 15, wherein the isolation structure comprises a dielectric layer between the shallow trench isolation and the first well.

19. The semiconductor arrangement of claim 15, wherein the sidewall of the deep trench isolation contacts second well.

20. The semiconductor arrangement of claim 15, wherein a width of the second well is greater than a width of the first well such that a first sidewall and a second sidewall of the first portion of the first well contact the first portion of the second well.

* * * * *